(12) United States Patent
Kuriyama et al.

(10) Patent No.: US 12,457,725 B2
(45) Date of Patent: Oct. 28, 2025

(54) SHEET-SHAPED MAGNETIC MEMBER

(71) Applicant: PROTERIAL, LTD., Tokyo (JP)

(72) Inventors: Yasuo Kuriyama, Tokyo (JP); Kouhei Miyano, Tokyo (JP); Yuichi Ogawa, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 0 days.

(21) Appl. No.: 18/700,655

(22) PCT Filed: Aug. 23, 2023

(86) PCT No.: PCT/JP2023/030372
§ 371 (c)(1),
(2) Date: Apr. 11, 2024

(87) PCT Pub. No.: WO2024/043283
PCT Pub. Date: Feb. 29, 2024

(65) Prior Publication Data
US 2025/0227905 A1 Jul. 10, 2025

(30) Foreign Application Priority Data
Aug. 23, 2022 (JP) .................................. 2022-132823

(51) Int. Cl.
*H05K 9/00* (2006.01)
*B32B 3/18* (2006.01)
(Continued)

(52) U.S. Cl.
CPC ............. *H05K 9/0075* (2013.01); *B32B 3/18* (2013.01); *B32B 15/043* (2013.01); *B32B 15/18* (2013.01);
(Continued)

(58) Field of Classification Search
CPC .................................................. H05K 9/0075
See application file for complete search history.

(56) References Cited

U.S. PATENT DOCUMENTS 5,821,453 A * 10/1998 Epstein ............... H05K 9/0075
174/388
2006/0228589 A1* 10/2006 Choi ..................... B82Y 25/00
428/836.3
(Continued)

FOREIGN PATENT DOCUMENTS

| CN | 105632678 A | 6/2016 |
|---|---|---|
| CN | 109412279 A | 3/2019 |

(Continued)

OTHER PUBLICATIONS

International Search Report mailed Nov. 14, 2023, from International Application No. PCT/JP2023/030372, 5 pages.
(Continued)

*Primary Examiner* — Hung V Ngo
(74) *Attorney, Agent, or Firm* — Meunier Carlin & Curfman LLC

(57) ABSTRACT

Provided is a sheet-shaped magnetic member. The sheet-shaped magnetic member comprises magnetic ribbons with anisotropy, and includes a first group, a second group, and a third group. The third group is arranged so that a direction of anisotropy of the magnetic ribbons is along a direction different from both a direction of anisotropy of the first group and a direction of anisotropy of the second group. The first group, the second group, and the third group are arranged next to each other.

12 Claims, 38 Drawing Sheets

(51) Int. Cl.
    *B32B 15/04*     (2006.01)
    *B32B 15/18*     (2006.01)
    *H01F 1/055*     (2006.01)
    *H02J 50/70*     (2016.01)
    *H02J 50/10*     (2016.01)

(52) U.S. Cl.
    CPC .............. *H01F 1/055* (2013.01); *H02J 50/70* (2016.02); *B32B 2307/208* (2013.01); *B32B 2307/706* (2013.01); *B32B 2457/00* (2013.01); *H02J 50/10* (2016.02)

(56) References Cited

U.S. PATENT DOCUMENTS

| | | | |
|---|---|---|---|
| 2016/0057900 A1* | 2/2016 | Polak | H01F 27/36 156/60 |
| 2016/0064814 A1 | 3/2016 | Jang et al. | |
| 2018/0286575 A1 | 10/2018 | Kyeong et al. | |
| 2019/0296432 A1 | 9/2019 | Lim et al. | |
| 2019/0387651 A1* | 12/2019 | Rauscher | B32B 37/12 |
| 2021/0005371 A1* | 1/2021 | Kim | H01F 10/08 |
| 2023/0054631 A1* | 2/2023 | Masaki | H01F 1/344 |

FOREIGN PATENT DOCUMENTS

| | | |
|---|---|---|
| CN | 209516750 U | 10/2019 |
| DE | 202011051649 U1 | 1/2013 |
| DE | 102013103268 B4 | 6/2016 |
| EP | 4564379 A1 | 4/2025 |
| JP | 2008112830 A | 5/2008 |
| JP | 2009049129 A | 3/2009 |
| JP | 2019522355 A | 8/2019 |
| JP | 2013197233 A | 9/2019 |
| JP | 2022058246 A | 4/2022 |
| WO | 2008018413 A1 | 2/2008 |
| WO | 2012147341 A1 | 11/2012 |

OTHER PUBLICATIONS

International Preliminary Report on Patentability & Written Opinion of the International Searching Authority, International Application No. PCT/JP2023/030372 mailed Aug. 23, 2023.

Notification of Transmittal of Copies of Translation of the International Preliminary Report on Patentability, International Application No. PCT/JP2023/030372 mailed Aug. 23, 2023.

Extended European Search Report, Application No. 23857391.9, dated Jul. 7, 2025.

* cited by examiner

SHEET-SHAPED MAGNETIC MEMBER

CROSS-REFERENCE TO RELATED APPLICATION

This application is a United States National Phase Patent Application of International Patent Application Number PCT/JP2023/030372, filed on Aug. 23, 2023, which claims the benefit of priority to Japanese Patent Application No. 2022-132823 filed on Aug. 23, 2022 with the Japan Patent Office, and the entire disclosure of Japanese Patent Application No. 2022-13282, which are incorporated herein by reference in their entireties.

TECHNICAL FIELD

The present disclosure relates to a sheet-shaped magnetic member used in a magnetic core, an inductor, a magnetic shield, and the like.

BACKGROUND ART

Contactless charging is widely used as one of the charging methods. The contactless charging has been used in electronic devices such as tablet-type information terminals, music players, smartphones, and mobile phones. The contactless charging is also applicable to electronic devices other than those described above, electric vehicles, and drones. The contactless charging is also applicable to transport vehicles such as forklifts and automated guided vehicles (AGVs), railways, trams, and the like.

For example, as shown in Patent Document 1 described below, a manufacturing method of a sheet-shaped magnetic member to be used in contactless charging has been known. This type of sheet-shaped magnetic member is used, for example, in inductors, magnetic shielding, and the like. The manufacturing method disclosed in Patent Document 1 comprises a step of adhering a thin sheet magnetic body on a sheet base material through an adhesive layer to form a sheet-shaped magnetic member and a step of dividing the thin sheet magnetic body into pieces by an external force while maintaining a state that the thin sheet magnetic body is adhered to the sheet base material.

Also known is, for example, a sheet-shaped magnetic member formed by combining an amorphous alloy ribbon and a nanocrystalline alloy ribbon as shown in Patent Document 2. Patent Document 2 discloses a structure in which nanocrystalline ribbons are laminated. Specifically, Patent Document 2 discloses a structure in which the nanocrystalline ribbons are arranged one by one and laminated. The nanocrystalline ribbons are arranged in a horizontal direction to achieve a wider width, and laminated in a vertical direction. In addition, Patent Document 2 discloses that when laminating the nanocrystalline ribbons, the longitudinal direction may be oriented differently. It is disclosed that laminating the nanocrystalline ribbons in this way has the effect of improving structural rigidity.

PRIOR ART DOCUMENTS

Patent Documents

Patent Document 1: Japanese Unexamined Patent Application Publication No. 2008-112830
Patent Document 2: Japanese Translation of PCT International Application Publication No. 2019-522355

SUMMARY OF THE INVENTION

Problems to be Solved by the Invention

The sheet-shaped magnetic member used for the contactless charging is required to have higher performance.

For example, in a contactless charging circuit for automobiles, a large current may be applied in a primary coil and a secondary coil. In the contactless charging circuit for automobiles, a sheet-shaped magnetic member that exhibits a high shielding effect is required to allow the large current to flow. For the contactless charging circuit for automobiles, a sheet-shaped magnetic member having a wide width is demanded.

It is preferable that a nanocrystalline alloy ribbon is used in such a sheet-shaped magnetic member. Compared to other materials used in the sheet-shaped magnetic member, the nanocrystalline alloy ribbon has excellent magnetic properties and can achieve a thinner thickness.

On the other hand, there has been difficulty in forming the nanocrystalline alloy ribbon into a wide shape. In order to solve this problem, the nanocrystalline alloy ribbons can be arranged side by side to form a wide sheet-shaped magnetic member. For example, elongated nanocrystalline alloy ribbons can be arranged next to each other in a width direction to form a wide sheet-shaped magnetic member.

The nanocrystalline alloy ribbon formed into a ribbon shape may have different magnetic properties in its longitudinal direction and its width direction perpendicular to the longitudinal direction depending on the manufacturing method thereof. For example, the magnetic properties in the longitudinal direction may be superior to those in the width direction, or conversely, the magnetic properties in the width direction may be superior to those in the longitudinal direction. In other words, the nanocrystalline alloy ribbon may have anisotropy depending on its manufacturing method.

In the primary coil and the secondary coil of the contactless charging circuit, the characteristics of the coils show less loss and better performance with an increase in a Q1 value shown in the following formula (1). With the increase in the Q1 value, the charging efficiency in the contactless charging can be enhanced.

$$Q1 = 2\pi f Ls/Rs \qquad (1)$$

Here, "f" is the frequency, "Ls" is the inductance of a coil, and "Rs" is the resistance of the coil.

The sheet-shaped magnetic member is required to have a high Q2 value in order to improve the characteristics of the coil. The Q2 value is a ratio ($\mu'/\mu''$) of a real part ($\mu'$) to an imaginary part ($\mu''$) of a complex magnetic permeability.

FIG. 36 shows a correlation between the real part ($\mu'$) of the complex magnetic permeability and the Q2 value. FIG. 36 shows the measurement results of sheet-shaped magnetic members each obtained by punching a ring-shaped core having an inner diameter of 8.6 mm and an outer diameter of 19.9 mm from a sheet-shaped magnetic member. The results were measured with a BH analyzer SY-8218 manufactured by Iwatsu Electric Co., Ltd under the conditions of a frequency f of 85 kHz and a voltage V of 30 mV. As shown in FIG. 36, there is a tendency that when the real part ($\mu'$) of the complex magnetic permeability is lower, the Q2 value is higher.

In a state of the sheet-shaped magnetic member, it is impossible to measure the Q2 values in the longitudinal direction and the width direction. That is, it is impossible to measure the anisotropy of the sheet-shaped magnetic member. Thus, the arrangement of the sheet-shaped magnetic member cannot be determined based on the anisotropy.

A direct current (DC) relative magnetic permeability (μr) can be well correlated with the real part (μ') of the complex magnetic permeability. That is, there is a tendency that when the real part (μ') of the complex magnetic permeability increases (or decreases), the DC relative magnetic permeability (μr) also increases (or decreases) in a generally linear manner. Thus, by measuring the DC relative magnetic permeability (μr), a direction with a low DC relative magnetic permeability (μr) can be determined as a direction with a high Q2 value. The direction with a high Q2 value thus determined can be used to determine the anisotropy and the arrangement of the sheet-shaped magnetic member.

When such an anisotropic nanocrystalline alloy ribbon is used to produce a sheet-shaped magnetic member and the sheet-shaped magnetic member is used in a contactless charging circuit, the characteristics of the sheet-shaped magnetic member may be unstable due to the anisotropy of the nanocrystalline alloy ribbon.

FIG. 37 is a schematic view illustrating the relationship of the arrangement of a sheet-shaped magnetic member 250, a primary coil 201, and a secondary coil 202.

The sheet-shaped magnetic member 250 is arranged adjacent to at least one of the primary coil 201 and the secondary coil 202 included in the contactless charging circuit. In FIG. 37, the sheet-shaped magnetic member 250 is arranged adjacent to the secondary coil 202. The primary coil 201 is a coil arranged on a primary-side of the contactless charging circuit, and the secondary coil 202 is a coil arranged on a secondary-side of the contactless charging circuit. Hereinafter, when it is unnecessary to specify the primary and secondary sides, these coils are simply referred to as "coil(s)". The coil is formed into a plate shape having a through-hole in the center thereof. The coil is formed by spirally winding a conductive wire, through which a current flows, so that the wire surrounds the through-hole.

When a current is applied to the primary coil 201, the applied current causes to generate a magnetic flux M. The magnetic flux M generated by the primary coil 201 flows, for example, through the center of the primary coil 201 toward the secondary coil 202 along a normal direction of the plate shape. The magnetic flux flowing toward the secondary coil 202 flows from an inner circumference of the coil toward an outer circumference thereof. The magnetic flux M flowing toward the outer circumference flows in a direction back to the primary coil 201 on an outer circumference side of the coil. The magnetic flux M flowing back to a primary coil 201 side flows from the outer circumference side toward an inner peripheral side of the coil.

The magnetic flux flowing toward the secondary coil 202 passes through the secondary coil 202. When the magnetic flux passing through the secondary coil 202 changes, a voltage is induced in the secondary coil 202 according to the change of the magnetic flux. The induced voltage causes a current to flow in the secondary coil 202.

When the sheet-shaped magnetic member has a configuration in which anisotropic nanocrystalline alloy ribbons are arranged next to each other in the width direction as described above, the nanocrystalline alloy ribbons are arranged so that each anisotropy is aligned to one direction. As described above, the magnetic flux flows radially from the center to the outside in the sheet-shaped magnetic member. During that time, in some parts of the sheet-shaped magnetic member, the magnetic flux flows in a direction that is consistent with the anisotropy, i.e., in a direction with a high Q2 value. In some other parts of the sheet-shaped magnetic member, the magnetic flux flows in a direction that is inconsistent with the anisotropy, i.e., in a direction with a low Q2 value.

When the magnetic flux flows in the direction that is consistent with the anisotropy, the sheet-shaped magnetic member easily exhibits the magnetic shielding properties, and greatly improves the Q1 value of the coil. When the magnetic flux flows in the direction that is inconsistent with the anisotropy, the sheet-shaped magnetic member exhibits less magnetic shielding properties, making a small improvement in the Q1 value of the coil.

That is, when the sheet-shaped magnetic member comprising the anisotropic nanocrystalline alloy ribbons arranged in the width direction is used with the coil formed into a spiral shape, it has been difficult to stabilize the magnetic shielding properties, resulting in a small improvement in the coil characteristics (Q1 value).

In one aspect of the present disclosure, provided is a sheet-shaped magnetic member that easily suppresses the reduction of the magnetic shielding properties relative to a spiral coil and that easily improves the characteristics (Q1 value) of the coil.

Means for Solving the Problems

A sheet-shaped magnetic member according to a first aspect of the present disclosure comprises magnetic ribbons with anisotropy. In the magnetic ribbons, a value of a DC relative magnetic permeability (μr) is different in a first direction in a plane direction of the magnetic ribbons and in a second direction perpendicular to the first direction. One of the first direction and the second direction with a lower value of the DC relative magnetic permeability (μr) is defined as a direction of anisotropy. The sheet-shaped magnetic member comprises a first group, a second group, and a third group. In the first group, at least one magnetic ribbon of the magnetic ribbons is arranged so that the direction of anisotropy is along a first axial direction. In the second group, at least one magnetic ribbon of the magnetic ribbons is arranged so that the direction of anisotropy is along a second axial direction intersecting the first axial direction. In the third group, at least one magnetic ribbon of the magnetic ribbons is arranged so that the direction of anisotropy is along a direction different from both the first axial direction and the second axial direction. The first group, the second group, and the third group are arranged next to each other.

A sheet-shaped magnetic member according to a second aspect of the present disclosure comprises magnetic sheet pieces comprising at least one of magnetic ribbons with anisotropy, the magnetic ribbons being laminated in layers so that a direction of anisotropy thereof is oriented in a same direction. In the magnetic ribbons, a value of a relative magnetic permeability (μr) is different in a first direction in a plane direction of the magnetic ribbons and a second direction perpendicular to the first direction. One of the first direction and the second direction with a lower value of the relative magnetic permeability (μr) is defined as the direction of anisotropy. The sheet-shaped magnetic member comprises a first group, a second group, and a third group. In the first group, at least one magnetic sheet piece of the magnetic sheet pieces is arranged so that the direction of anisotropy is along a first axial direction. In the second group, at least one magnetic sheet piece of the magnetic sheet pieces is arranged so that the direction of anisotropy is along a second axial direction intersecting the first axial direction. In the third group, at least one magnetic sheet piece of the magnetic sheet pieces is arranged so that the direction of anisotropy is along a direction different from both the first axial direction and the second axial direction. The first group, the second group, and the third group are arranged next to each other.

In the sheet-shaped magnetic members according to the first and second aspects of the present disclosure, the direction of anisotropy is oriented in three or more different directions. Therefore, it is easy to make the direction of the magnetic flux generated in the sheet-shaped magnetic member consistent with the direction of anisotropy of the sheet-shaped magnetic member in relation to the current flowing in the coil used in combination with the sheet-shaped magnetic member. Specifically, it is easy to set the direction of the current flowing in the coil to a direction perpendicular to or a direction at an angle substantially perpendicular to the direction of anisotropy. Note that the direction of anisotropy is, in other words, a direction with good magnetic characteristics such as a low permeability and a high Q2 value.

For example, it is easier to make the first axial direction and the second axial direction consistent with portions linearly extending in different directions in the rectangular coil, respectively, and to make the third axial direction aligned with portions extending in an arc shape and connecting the linearly extending portions. Therefore, even when the sheet-shaped magnetic member is used with the rectangular coil, it is easy to suppress the reduction of magnetic shielding properties of the sheet-shaped magnetic member. Note that the third axial direction is a direction of anisotropy in the third group and is different from both the first axial direction and the second axial direction.

Effects of the Invention

According to the sheet-shaped magnetic member in the first and second aspects of the present disclosure, the sheet-shaped magnetic member comprises the first group, the second group, and the third group each having a direction of anisotropy different from each other. With this configuration, it is easy to suppress the reduction of the magnetic shielding properties relative to a spiral coil. Furthermore, the sheet-shaped magnetic member of the present disclosure achieve the effect of improving the characteristics (Q1 value) of the coil to be used in combination.

EXPLANATION OF REFERENCE NUMERALS

20 . . . magnetic ribbon, 110 . . . magnetic sheet, GA . . . first group, GB . . . second group, GC . . . third group

MODE FOR CARRYING OUT THE INVENTION

Some magnetic sheets 110 according to some embodiments of the present disclosure (corresponding to examples of a sheet-shaped magnetic member of the present disclosure) will be described with reference to FIG. 1 to FIG. 35. The magnetic sheets 110 according to some embodiments are used in contactless charging apparatuses. The magnetic sheets 110 may be used in power feeding devices and/or power receiving devices of the charging apparatuses.

In the embodiments, an example will be described in which the magnetic sheets 110 are used for contactless charging of devices that consume more power than information processing devices and electronic devices, such as smartphones. For example, an example will be described in which the magnetic sheets 110 are used for contactless charging of movable bodies, such as automobiles. The magnetic sheet 110 may also be used for contactless charging of information processing devices, electronic devices, and the like. The magnetic sheets 110 are also applicable to powered trucks, such as forklifts and Automated Guided Vehicles (AGVs), trains, streetcars/trams, and the like.

Figure 1:
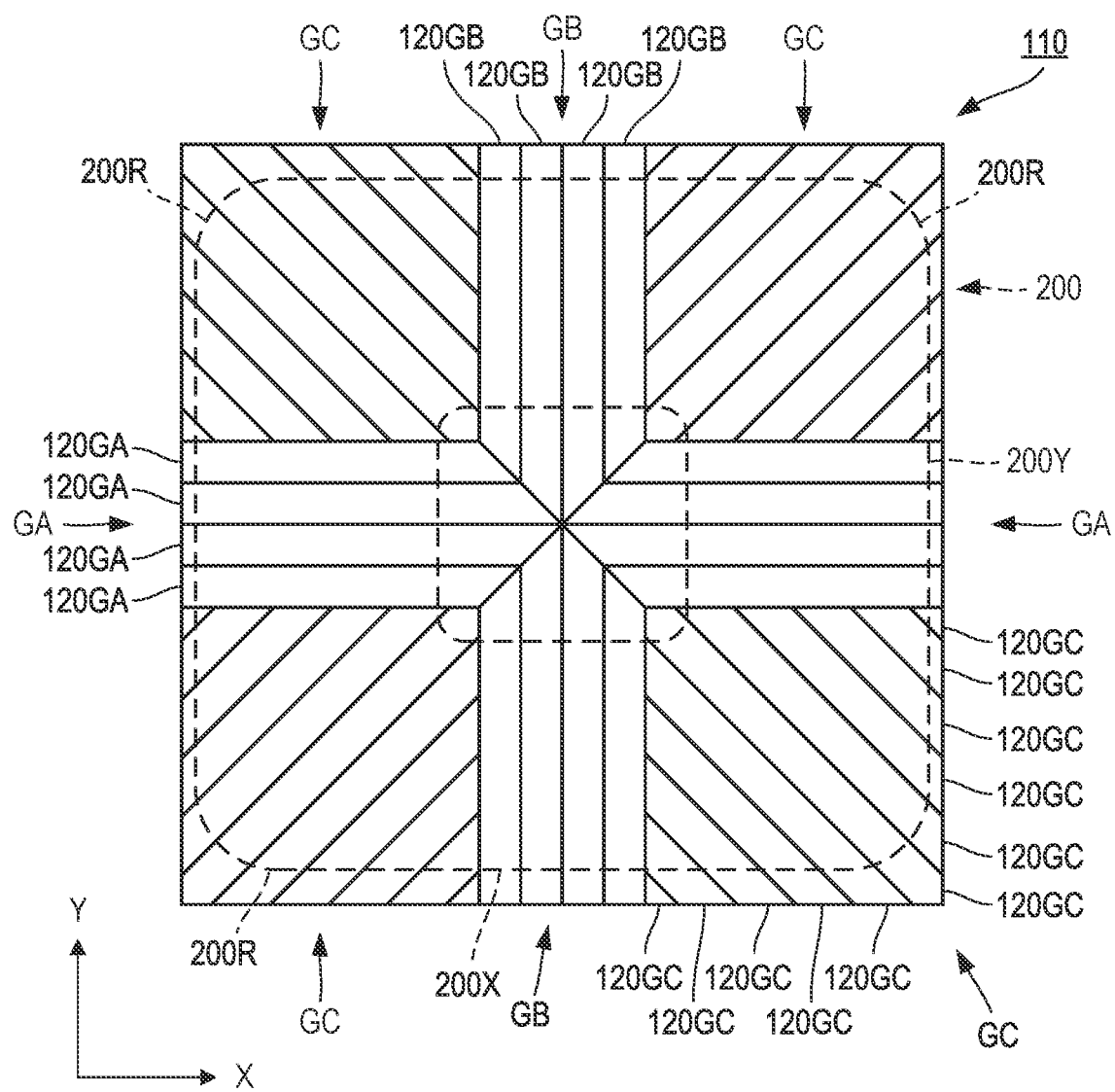
FIG. 1 is a plan view illustrating a configuration of a magnetic sheet of the present disclosure.

FIG. 1 is a plan view illustrating a configuration of a magnetic sheet 110.

As shown in FIG. 1, the magnetic sheet 110 is a plate-shaped member arranged adjacent to a coil 200 that is used for contactless charging. Specifically, the magnetic sheet 110 is a plate-shaped member arranged adjacent to the coil 200 in a direction perpendicular to the page of FIG. 1. The coil 200 is simply depicted by an inner frame and an outer frame in a dashed line in FIG. 1, but the actual coil 200 is made of a conductive wire spirally wound. It is preferable that the magnetic sheet 110 of this embodiment is used in combination with a rectangular coil 200. Note that the magnetic sheet 110 of this embodiment may be used with a coil having a shape other than the rectangular shape, such as a circular coil.

The rectangular coil 200 shown in FIG. 1 includes two X portions 200X linearly extending along an X axis direction, two Y portions 200Y linearly extending along a Y-axis direction, and four arc portions 200R each connecting the X portion 200X and the Y portion 200Y in the form of an arc shape.

The rectangular coil 200 is arranged so as to share its center in common with the magnetic sheet 110. Specifically, the center of the magnetic sheet 110 and the center of the rectangular coil 200 are shared in common. The extent to which the two centers are shared in common includes not only a case where the two centers coincide, but also a case where the two centers fall within a predetermined range.

For example, the above-described predetermined range should be a range where the center of the magnetic sheet 110 is positioned inside an inner diameter of the coil 200.

The above-described predetermined range should be whichever shorter: a range of a length of 5% of half of a difference between a length of equal to or less than 20% of an outer diameter of the coil 200 and the outer diameter of the coil 200; or a range of a length of 5% of half of a difference between the outer diameter of the magnetic sheet 110 and the outer diameter of the coil 200.

The coil 200 may be a primary-side coil or a secondary-side coil in the contactless charging. In the present embodiment, an example will be described in which the coil 200 is the secondary-side coil.

The magnetic sheet 110 is a sheet formed into a rectangular shape. FIG. 1 shows a sheet formed into a square shape. The magnetic sheet 110 may be formed into a square shape or a rectangular shape. In the magnetic sheet 110, two first groups GA, two second groups GB, and four third groups GC are formed.

The first group GA has an elongated shape in which multiple magnetic sheet pieces 120GA formed into an elongated shape are arranged next to each other. FIG. 1 illustrates a configuration in which four magnetic sheet pieces 120GA are arranged next to each other. The number of magnetic sheet pieces 120GA constituting one first group GA may be four, and more or less than four.

The magnetic sheet piece 120GA comprises an elongated magnetic ribbon 20, and this magnetic ribbon 20 is anisotropic in a longitudinal direction. That is, the longitudinal direction and the direction of anisotropy of the magnetic ribbon 20 are in the same direction. This magnetic sheet piece 120GA easily exhibits its characteristics as a magnetic sheet (i.e., improving a Q1 value of the coil) relative to the magnetic flux flowing in the same direction as the direction of anisotropy. Note that a direction along a relatively long side of a material, e.g. the magnetic ribbon 20, is referred to as a longitudinal direction, and a direction perpendicular to the longitudinal direction is referred to as a width direction.

The four magnetic sheet pieces 120GA may be integrally formed with the magnetic ribbons 20 arranged laterally.

Each of the two first groups GA is arranged so that the longitudinal direction is along the X axis direction, and the two first groups GA are arranged next to each other in the X axis direction. The two first groups GA, which are arranged next to each other in the X axis direction, are placed in the middle position of the magnetic sheet 110 in the Y axis direction.

In other words, the two first groups GA and the magnetic sheet pieces 120GA included in the first groups GA are arranged so that the longitudinal direction intersects the Y portions 200Y linearly extending in the Y axis direction in the coil 200, and more preferably, so that the longitudinal direction intersects at right angles. Because the magnetic flux is generated radially from the central portion toward the outside in the sheet-shaped magnetic member, the longitudinal direction (direction of anisotropy) is arranged to be consistent with the direction of the magnetic flux.

The first group GA has a pointed shape at the end thereof adjacent to the other first group GA, and the pointed shape comprises one side inclined at +45° and the other side inclined at −45° to the X-axis. In other words, the two first groups GA are arranged so that the vertices of the pointed shapes face each other.

The second group GB has an elongated shape in which multiple magnetic sheet pieces 120GB formed into an elongated shape are arranged next to each other. FIG. 1 illustrates a configuration in which four magnetic sheet pieces 120GB are arranged next to each other. The number of magnetic sheet pieces 120GB constituting one second group GB may be four, and more or less than four.

The magnetic sheet piece 120GB comprises an elongated magnetic ribbon 20, and this magnetic ribbon 20 is anisotropic in the longitudinal direction. That is, the longitudinal direction and the direction of anisotropy of the magnetic ribbon 20 are in the same direction. This magnetic sheet piece 120GB easily exhibits its characteristics as the magnetic sheet (i.e., improving the Q1 value of the coil) relative to the magnetic flux flowing in the same direction as the direction of anisotropy.

The four magnetic sheet pieces 120GB may be integrally formed with the magnetic ribbons 20 arranged laterally.

Each of the two second groups GB is arranged so that the longitudinal direction is along the Y direction, and the two second groups GB are arranged next to each other in the Y axis direction. The two second groups GB, which are arranged next to each other in the Y axis direction, are placed in the middle position of the magnetic sheet 110 in the X axis direction.

In other words, the two second groups GB and the magnetic sheet pieces 120GB included in the second groups GB are arranged so that the longitudinal direction intersects the X portions 200X linearly extending in the X axis direction in the coil 200, and more preferably, so that the longitudinal direction intersects the X portions 200X at right angles. Because the magnetic flux is generated radially from the central portion toward the outside in the sheet-shaped magnetic member, the longitudinal direction (direction of anisotropy) is arranged to be consistent with the direction of the magnetic flux.

The second group GB has a pointed shape at the end thereof adjacent to the other second group GB, and the pointed shape comprises a side inclined at +45° and the other side inclined at −45° to the Y-axis. In other words, the two second groups GB are arranged so that the vertices of the pointed shapes face each other. In still other words, the two first groups GA and the two second groups GB are arranged in a cross shape extending from the center toward the X axis direction and the Y direction.

The third group GC has a rectangular shape in which multiple magnetic sheet pieces 120GC, including an elongated magnetic sheet piece 120GC, are arranged next to each other. The elongated magnetic sheet pieces 120GC are arranged so that the longitudinal direction is along the diagonal direction of the rectangular shape. FIG. 1 illustrates a configuration in which 11 magnetic sheet pieces 120GC are arranged next to each other. The number of magnetic sheet pieces 120GC constituting one third group GC may be 11, and more or less than 11.

The magnetic sheet piece 120GC comprises an elongated magnetic ribbon 20, and this magnetic ribbon 20 is anisotropic in the longitudinal direction. That is, the longitudinal direction and the direction of anisotropy of the magnetic ribbon 20 are in the same direction. This magnetic sheet piece 120GC easily exhibits its characteristics as the magnetic sheet (i.e., improving the Q1 value of the coil) relative to the magnetic flux flowing in the same direction as the direction of anisotropy.

The magnetic sheet pieces 120GC may be integrally formed with the magnetic ribbons 20 arranged laterally.

The four third groups GC are arranged in the four corners of the magnetic sheet 110. In other words, they are arranged in four positions each adjacent to the first group GA and the second group GB, which are arranged in the cross shape. The elongated magnetic sheet pieces 120GC in the four third groups GC are arranged so that the longitudinal direction is oriented toward the center of the cross shape. In other words, the elongated magnetic sheet pieces 120GC in the four third groups GC are arranged so that the longitudinal directions form an X shape.

In other words, the four third groups GC and the magnetic sheet pieces 120GC included in the third groups GC are arranged so that the respective longitudinal directions intersect the arc portions 200R extending in an arc shape in the coil 200, more preferably, so that the respective longitudinal directions intersects some parts of the arc portions 200R at right angles. Because the magnetic flux is generated radially from the central portion toward the outside in the sheet-shaped magnetic member, the longitudinal direction (direction of anisotropy) is arranged to be consistent with the direction of the magnetic flux.

The four third groups GC and the magnetic sheet pieces 120GC included in the third groups GC are arranged so that the longitudinal directions intersect the X portions 200X extending in the X axis direction and the Y portions 200Y linearly extending in the Y axis direction in the coil 200.

In FIG. 1, in the four third groups GC, the magnetic sheet pieces 120G constituting each third group GC are oriented in the same direction. For example, the third group GC arranged in the lower-right of FIG. 1 comprises the magnetic sheet pieces 120G inclined at an angle of 45° to the X-axis.

Note that the direction of anisotropy of the each of the magnetic sheet pieces 120GC constituting the third group GC may be a combination of different directions. For example, the third group GC arranged in the lower-right of FIG. 1 may comprise a combination of the magnetic sheet pieces 120GC inclined at angles of 30°, 45°, and 60° to the X-axis.

When the magnetic sheet 110 of FIG. 1 is used in combination with the coil 200, the magnetic flux is generated radially from the central portion of the magnetic sheet 110 (a portion corresponding to the central portion of the coil 200) to the outside of the magnetic sheet 110 in relation to the current flowing in the coil. The magnetic sheet 110 of FIG. 1 is arranged so that the direction of anisotropy is consistent with the direction of this magnetic flux. Therefore, when the magnetic sheet 110 of FIG. 1 is used in combination with the coil 200, the magnetic sheet 110 of FIG. 1 has a structure that easily exhibits magnetic shielding properties and easily improves the characteristic (Q1 value) of the coil.

For example, when a magnetic sheet piece having a configuration of the magnetic sheet piece 120GB is placed on an area of the magnetic sheet piece 120GA, there is a difference of 90° between the direction of the magnetic flux and the direction of anisotropy in such a configuration. As in the above case, when there is a difference of 90° between the direction of anisotropy and the direction of the magnetic flux, the magnetic shielding properties in the area of the magnetic sheet piece decreases and the characteristics (Q1 value) of the coil decrease compared to the case where the direction of the magnetic flux and the direction of anisotropy are consistent with each other. As the difference between the direction of the magnetic flux and the direction of anisotropy increases, the magnetic shielding properties decreases and the characteristics (Q1 value) of the coil decrease compared to the case where the direction of the magnetic flux and the direction of anisotropy are consistent with each other.

It is preferable that the magnetic sheet of the present disclosure is configured such that an angle between the direction of the magnetic flux and the direction of anisotropy is 60° or less. More preferably, the angle is 45° or less, and still more preferably, 22.5° or less.

Thus, the magnetic sheet of the present disclosure can be configured so that the direction of the magnetic flux generated in relation to the coil and the direction of anisotropy are consistent with each other. Thus, it is possible to improve the characteristics of the magnetic sheet and the characteristics of the coil (Q1 value). For example, in comparison with a configuration in which the elongated magnetic sheet pieces are arranged next to each other, the magnetic sheet of the present disclosure has a preferred configuration because the direction of the magnetic flux and the direction of anisotropy can be consistent with each other.

In FIG. 1, the center portion of the magnetic sheet 110 tends to have a configuration in which the multiple magnetic sheet pieces 120GA and 120GB are overlapped in layers. This may cause the center portion to be thicker and result in poor workability. To solve these issues, the magnetic sheet 110 may comprise a configuration in which a hole H (see FIG. 38) is formed in the center portion. In this case, the size of the hole H should be smaller than the inner diameter of the coil 200.

The hole H may be formed after the magnetic sheet 110 is configured, or portions for forming the hole H may be provided in advance to the magnetic sheet pieces 120GA, 120GB, and 120GC.

Figure 38:
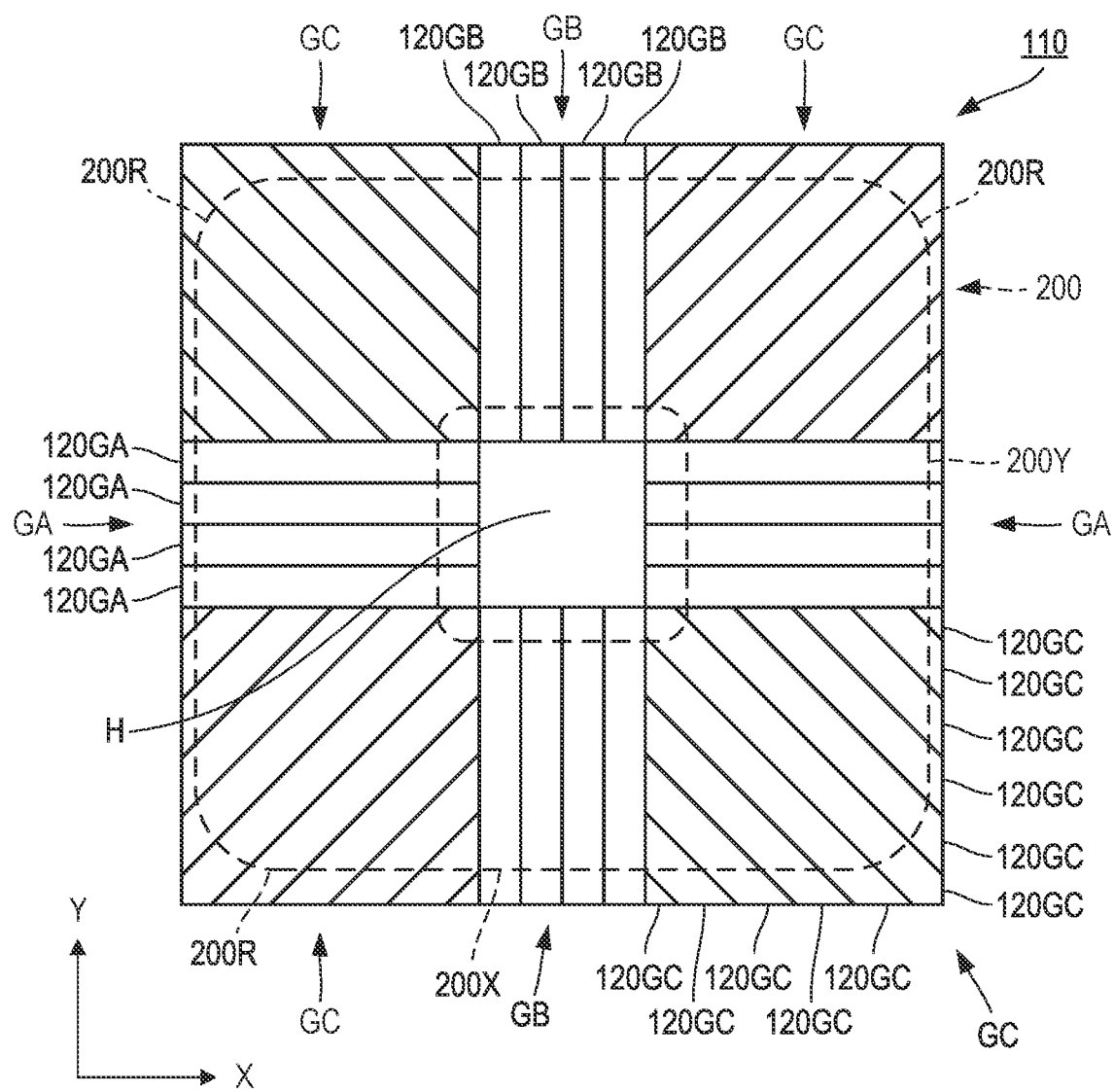
FIG. 38 is a plan view illustrating a configuration in which a hole is formed in a center portion of the magnetic sheet of FIG. 1.

FIG. 38 illustrates an example in which the center portion of the magnetic sheet 110 of FIG. 1 comprises the hole H. In the magnetic sheet 110, the hole H (a hole H penetrating through the magnetic sheet 110) smaller than the inner diameter of the coil 200 is formed in the center portion of the magnetic sheet 110.

The magnetic sheets 110 of other embodiments can also comprise the hole H formed in the center portion thereof.

Figure 2A:
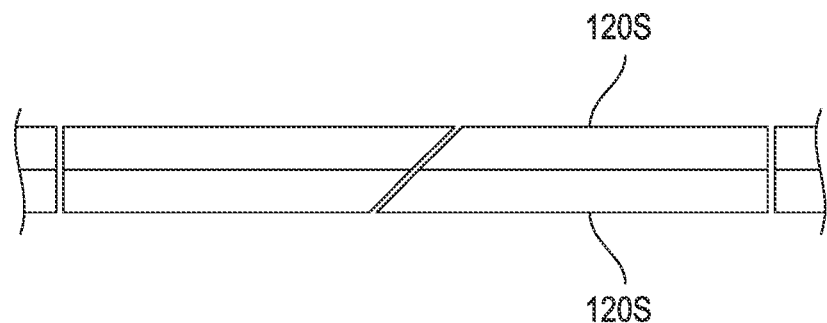
FIG. 2A illustrates a state of rectangular magnetic sheet pieces before cutting.
Figure 2B:
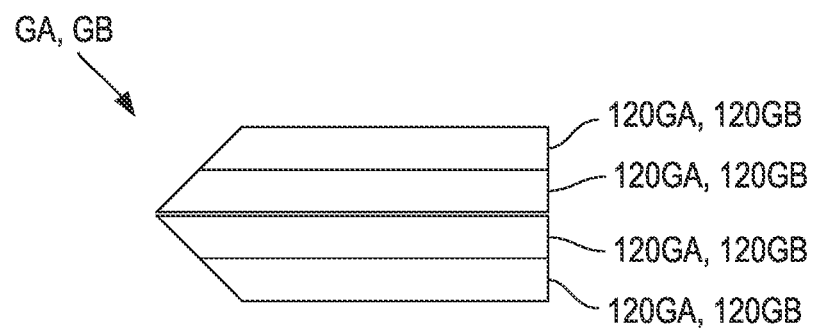
FIG. 2B illustrates a method of forming a first group and a second group using the cut magnetic sheet pieces.

FIGS. 2A and 2B illustrate a method of forming the first group GA and the second group GB.

The first group GA and the second group GB are formed of multiple magnetic sheet pieces 120S having an elongated rectangular strip shape as shown in FIG. 2A. In the present embodiment, a description will be given of an example in which the first group GA and the second group GB are formed of two strips of the magnetic sheet piece 120S arranged next to each other in a width direction.

Specifically, the two strips of the magnetic sheet piece 120S arranged next to each other are cut into a predetermined length, and further cut at a predetermined angle to the longitudinal direction. In this way, the multiple magnetic sheet pieces 120GA and the multiple magnetic sheet pieces 120GB are formed. Here, the predetermined length is preferably determined based on the lengths of the first group GA and the second group GB in the longitudinal direction. The predetermined angle is preferably an angle of 45°.

Here, the two strips of the magnetic sheet piece 120S arranged next to each other may be integrally formed.

Next, the multiple magnetic sheet pieces 120GA and the multiple magnetic sheet pieces 120GB are arranged as shown in FIG. 2B, to thereby form the first group GA and the second group GB, respectively. FIG. 2B illustrates an example in which four magnetic sheet pieces 120GA and four magnetic sheet pieces 120GB constitute the first group GA and the second group GB, respectively.

Figure 3A:
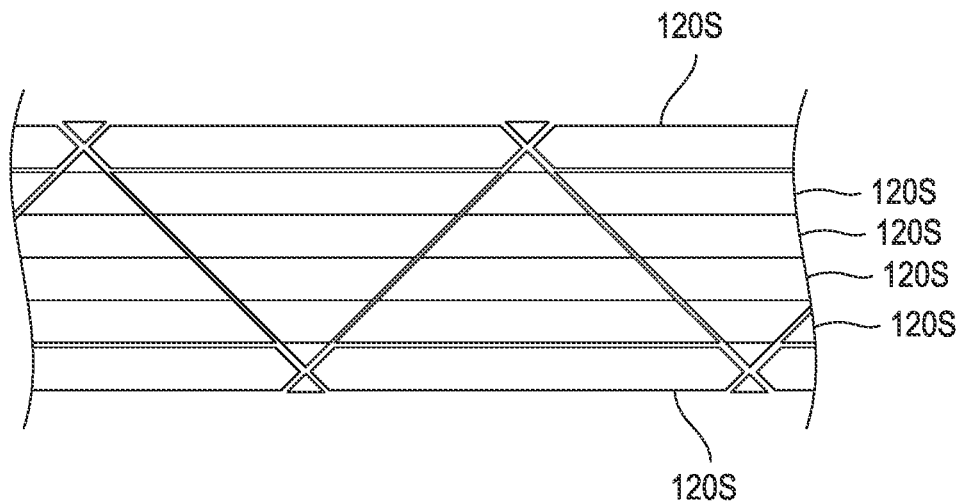
FIG. 3A illustrates a state of the rectangular magnetic sheet pieces before cutting.
Figure 3B:
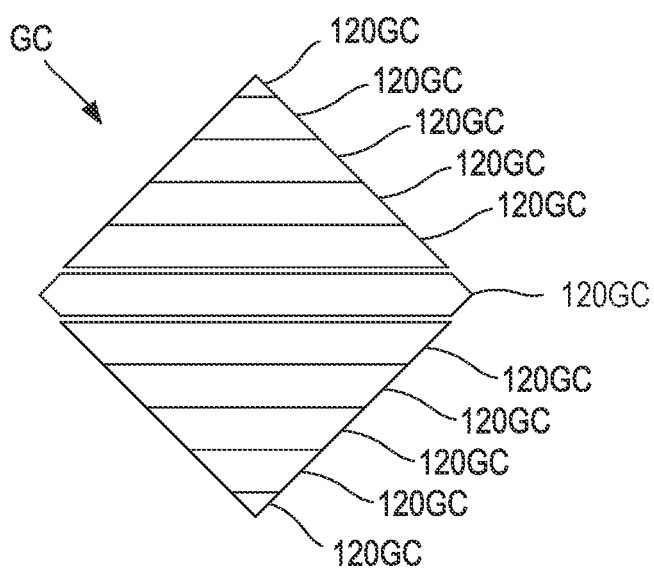
FIG. 3B illustrates a method of forming a third group using the cut magnetic sheet pieces.

FIGS. 3A and 3B illustrate a method of forming the third group GC.

The third group GC is formed of the magnetic sheet pieces 120S having an elongated rectangular strip shape as shown in FIG. 3A. In the present embodiment, a description will be given of an example in which the third group GC is formed of six strips of the magnetic sheet piece 120S arranged next to each other in the width direction.

Specifically, the six strips of the magnetic sheet piece 120S arranged next to each other are cut at equal intervals at a predetermined angle to the longitudinal direction, and further cut at equal intervals at a different predetermined angle to the longitudinal direction, to thereby form multiple magnetic sheet pieces 120GC.

Here, the six strips of the magnetic sheet piece 120S arranged next to each other may be integrally formed.

Here, the predetermined angle is preferably +45° to the longitudinal direction, and the different angle is preferably −45° to the longitudinal direction, i.e., 90° to the predetermined angle. It is preferable that a width of the equal interval is determined in accordance with a length of a rectangular side of the third group GC.

Next, the multiple magnetic sheet pieces 120GC are arranged as shown in FIG. 3B to thereby form each of the third groups GC. FIG. 3B illustrates an example in which 11 magnetic sheet pieces 120GC constitute the third group GC.

Note that the first group GA, the second group GB and the third group GC may be formed by the above-described method or any other method.

For example, four strips of the magnetic sheet piece 120S may be arranged next to each other and integrally formed, and then processed into a shape shown in FIG. 2B. Similarly, 11 strips of the magnetic sheet piece 120S may be arranged next to each other and integrally formed, and then processed into a shape shown in FIG. 3B.

Figure 4:
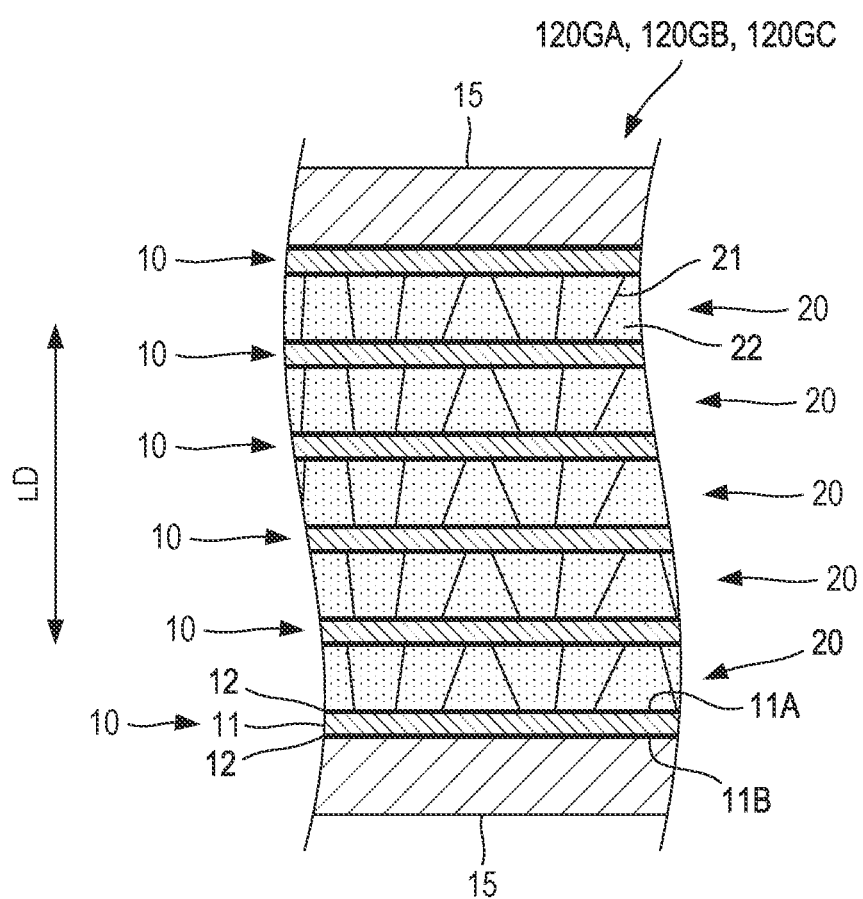
FIG. 4 is a partial side view illustrating a laminated structure of the magnetic sheet piece.

FIG. 4 is a partial side view illustrating a laminated structure of the magnetic sheet piece 120GA, the magnetic sheet piece 120GB and the magnetic sheet piece 120GC.

The magnetic sheet piece 120GA, the magnetic sheet piece 120GB, and the magnetic sheet piece 120GC have a multilayer structure in which multiple adhesive layers 10 and multiple magnetic ribbons 20 are alternately laminated. In the present embodiment, as shown in FIG. 4, a description will be given of an example in which six adhesive layers 10 and five magnetic ribbons 20 are alternately laminated to form the multilayer structure. In FIG. 4 and below, a direction in which the adhesive layer 10 and the magnetic ribbon 20 are laminated on top of each other is referred to as a lamination direction LD.

The example shown in FIG. 4 has a multilayer structure in which the adhesive layer 10, the magnetic ribbon 20, the adhesive layer 10, the magnetic ribbon 20, the adhesive layer 10, the magnetic ribbon 20, the adhesive layer 10, the magnetic ribbon 20, the adhesive layer 10, the magnetic ribbon 20, and the adhesive layer 10 are laminated in this order in the lamination direction LD.

Figure 5:
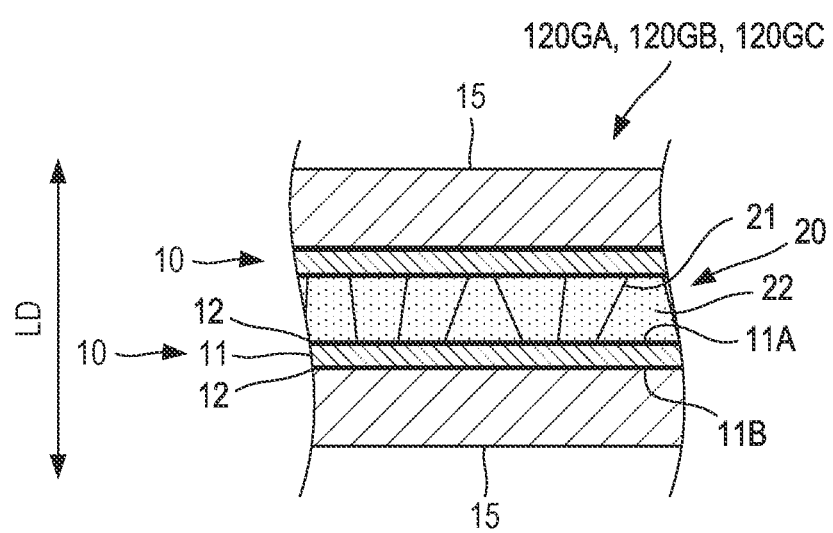
FIG. 5 is a partial side view illustrating another laminated structure of the magnetic sheet piece.

FIG. 5 is a partial side view illustrating another laminated structure of the magnetic sheet piece 120GA, the magnetic sheet piece 120GB and the magnetic sheet piece 120GC.

Note that the number of magnetic ribbons 20 included in the magnetic sheet piece 120GA, the magnetic sheet piece 120GB, and the magnetic sheet piece 120GC may be five as described above or one as shown in FIG. 5.

The number of layers may be any number of two or more other than five. The number of layers of the magnetic ribbons 20 is preferably three or more, and preferably four or more. The number of layers of the magnetic ribbons 20 may be 20 or more, but preferably 20 or less. The number of layers of the magnetic ribbons 20 is more preferably 15 or less, and more preferably, ten or less.

As shown in FIGS. 4 and 5, the magnetic sheet piece 120GA, the magnetic sheet piece 120GB, and the magnetic sheet piece 120GC may comprise two layers of the resin sheet 15. The two layers of the resin sheet 15 are respectively attached to two outermost adhesive layers 10 of the magnetic sheet piece 120GA, the magnetic sheet piece 120GB, and the magnetic sheet piece 120GC. When the magnetic sheet piece 120GA, the magnetic sheet piece 120GB, and the magnetic sheet piece 120GC are further laminated, the resin sheets 15 of the magnetic sheet piece 120GA, the magnetic sheet piece 120GB, and the magnetic sheet piece 120GC are peeled off to expose the adhesive layers 10, and another magnetic sheet piece 120GA, magnetic sheet piece 120GB, and magnetic sheet piece 120GC are laminated thereon.

When the magnetic sheet 110 is formed, the uppermost or the lowermost magnetic sheet piece 120GA, magnetic sheet piece 120GB, and magnetic sheet piece 120GC may or may not comprise the resin sheets 15. The magnetic ribbon 20 may be exposed. Instead of the resin sheet 15, for example, at least one of an amorphous alloy ribbon, a nanocrystal alloy ribbon, other magnetic materials, metal foil such as aluminum, and the like may be adhered thereto.

The magnetic sheet piece of the present disclosure may comprise at least one adhesive layer 10 and at least one magnetic ribbon 20. Because the magnetic sheet piece comprises at least one magnetic ribbon 20 and at least one adhesive layer 10, when the magnetic ribbon 20 are laminated on top of each other, the magnetic ribbons 20 can be laminated and adhered through the adhesive layer 10.

With the at least one magnetic ribbon 20 and the at least one adhesive layer 10, when the magnetic ribbon 20 is divided into small pieces 22, the small pieces 22 can be adhered to the adhesive layer 10, and falling off of the small pieces can be prevented.

As shown in FIGS. 4 and 5, the adhesive layer 10 is a member to which the magnetic ribbon 20 is adhered. The adhesive layer 10 is a member formed into a film shape. The adhesive layer 10 mainly comprises a support 11 and an adhesive 12.

The support 11 is a member formed into a film shape. The support 11 is formed using a flexible resin material. As the resin material, polyethylene terephthalate (PET) can be used.

The adhesive 12 is provided in a film shape or a layer shape on each of a first surface 11A and a second surface 11B of the support 11.

As the adhesive 12, for example, a pressure sensitive adhesive can be used. For example, a known adhesive such as an acrylic adhesive, a silicone-based adhesive, a urethane-based adhesive, a synthetic rubber, or a natural rubber can be used as the adhesive 12. The acrylic-based adhesive is preferable as the adhesive 12 because the acrylic-based adhesive is excellent in heat resistance and moisture resistance, and can be used to adhere a wide range of materials. In the present embodiment, a description will be given of an example in which the adhesive 12 is provided on each of the entire area of the first surface 11A and the second surface 11B of the support 11.

The magnetic ribbon 20 is a thin ribbon formed using a magnetic material. As shown in FIG. 5, cracks 21 are formed in the magnetic ribbon 20. The magnetic ribbon 20 is divided into multiple small pieces 22 by the cracks 21. In other words, the magnetic ribbon 20 comprises multiple small pieces 22. The crack 21 refers to a magnetic gap formed in the magnetic ribbon 20, and includes, for example, a break and/or a fissure of the magnetic ribbon 20.

By forming the cracks 21 in the magnetic ribbon 20, the Q2 value can be easily improved when the magnetic sheet 110 is used as a magnetic material for an inductor. When the magnetic sheet 110 is used as a magnetic material for magnetic shielding, an eddy current loss can be easily reduced by dividing a current path of the magnetic ribbon 20.

As a material for forming the magnetic ribbon 20, an alloy with an alloy composition of an Fe-based or Co-based alloy can be used, and a nanocrystalline alloy or an amorphous alloy can be used. The magnetic ribbon 20 is preferably a thin ribbon formed using a nanocrystalline alloy as a material (hereinafter, also referred to as "nanocrystalline alloy ribbon").

As the nanocrystalline alloy ribbon, it is possible to use a nanocrystalline alloy ribbon obtained by subjecting a non-crystalline alloy ribbon capable of nanocrystallization to heat treatment for nanocrystallization. At the time of the heat treatment for nanocrystallization, it is preferable to perform the heat treatment for nanocrystallization in a state where tension is applied to the non-crystalline alloy ribbon capable of nanocrystallization. Note that a ribbon formed using an amorphous alloy as a material is also referred to as an "amorphous alloy ribbon" or a "non-crystalline alloy ribbon".

The nanocrystalline alloy ribbon preferably has a composition represented by a following general formula.

General Formula: $(Fe_{1-a}M_a)_{100-x-y-z-\alpha-\beta-\gamma}Cu_xSi_yB_zM'_\alpha M''_\beta X_\gamma$ (atomic percent)

In the above general formula, M is Co and/or Ni. M' is at least one element selected from the group consisting of Nb, Mo, Ta, Ti, Zr, Hf, V, Cr, Mn, and W. M" is at least one element selected from the group consisting of Al, a platinum group element, Sc, a rare earth element, Zn, Sn, and Re. X is at least one element selected from the group consisting of C, Ge, P, Ga, Sb, In, Be, and As. a, x, y, z, $\alpha$, $\beta$, and $\gamma$ satisfy $0 \leq a \leq 0.5$, $0.1 < x \leq 3$, $0 \leq y \leq 30$, $0 \leq z \leq 25$, $5 \leq y+z \leq 30$, $0 \leq \alpha \leq 20$, $0 << 20$, and $0 \leq \gamma \leq 20$, respectively.

Preferably, in the above general formula, a, x, y, z, $\alpha$, $\beta$, and $\gamma$ satisfy $0 \leq a \leq 0.1$, $0.7 \leq x \leq 1.3$, $12 \leq y \leq 17$, $5 \leq z \leq 10$, $1.5 \leq \alpha \leq 5$, $0 \leq \beta \leq 1$, and $0 \leq \gamma \leq 1$, respectively.

In the present embodiment, a description will be given of an example in which the magnetic ribbon 20 is a magnetic ribbon (FT-3 manufactured by Proterial, Ltd. (formerly Hitachi Metals, Ltd.)) of a Fe—Cu—Nb—Si—B based nanocrystal alloy. Note that the magnetic ribbon 20 may be a nanocrystalline alloy ribbon having another composition represented by the above general formula or may be an amorphous alloy ribbon.

When the magnetic ribbon 20 is a nanocrystalline alloy ribbon, the magnetic ribbon 20 is mechanically more brittle than when the magnetic ribbon is an amorphous alloy ribbon. When the magnetic ribbon 20 is a nanocrystalline alloy ribbon and when an external force is directly applied to the magnetic ribbon 20 to form the cracks 21, the cracks 21 can be formed with a small external force.

When the magnetic ribbon 20 is a nanocrystalline alloy ribbon, the cracks 21 can be formed without substantially forming unevenness on the surface of the magnetic ribbon 20. This allows the magnetic ribbon 20 to be in a favorable planar state. The shape of the magnetic ribbon 20 can be less changed over time after the magnetic ribbon 20 and the adhesive layer 10 is adhered to each other to form the magnetic sheet piece 120GA, the magnetic sheet piece 120GB, the magnetic sheet piece 120GC, the first group GA, the second group GB, the third group GC and the magnetic sheet 110. It is possible to reduce an over-time change in the magnetic characteristics of the magnetic sheet piece 120GA, the magnetic sheet piece 120GB, the magnetic sheet piece 120GC, the first group GA, the second group GB, the third group GC, and the magnetic sheet 110.

As the magnetic ribbon 20, for example, it is possible to use an alloy ribbon that is manufactured by roll rapid cooling and that has a thickness of 100 μm or less. The thickness of the magnetic ribbon 20 is preferably 50 μm or less, more preferably 30 μm or less, further preferably 25 μm or less, and particularly preferably 20 μm or less. It is slightly difficult to handle the magnetic ribbon 20 when the thickness thereof is thin, and therefore, the thickness of the magnetic ribbon 20 is preferably 5 µm or more, and more preferably 10 µm or more.

The magnetic ribbon 20, which is a nanocrystalline alloy ribbon, is obtained by manufacturing an amorphous alloy ribbon and then heat-treating the same to form nanocrystals. This magnetic ribbon 20 may have anisotropic magnetic characteristics caused by the manufacturing method.

One of the methods to reduce a DC relative magnetic permeability (µr) of the magnetic ribbon 20 is to reduce the size of the cracks 21. Another method is to heat treat the amorphous alloy ribbon in a magnetic field. Still another method is to apply tension to the amorphous alloy ribbon during the heat treatment to impart the anisotropy to the amorphous alloy ribbon, and reduce only the DC relative magnetic permeability (µr) in a specified direction.

For example, in a manufacturing method of a nanocrystalline alloy ribbon by heat treating an amorphous alloy ribbon by contacting a heating body while the amorphous alloy ribbon is conveyed, the nanocrystalline alloy ribbon may have different magnetic characteristics in the longitudinal direction and the width direction. In the magnetic sheet piece 120S having a rectangular strip shape shown in FIG. 2A, a direction in which a long side extends is the same as the longitudinal direction.

Note that the direction of anisotropy of the magnetic ribbon 20 is determined by measuring values of DC relative magnetic permeability (µr) in a first direction and in a second direction perpendicular to the first direction in a planer orientation of the thin ribbon, and a direction with a lower value of the DC relative magnetic permeability (µr) is defined as the direction of anisotropy. Here, the planer orientation of the thin ribbon is any direction along the surface of the magnetic ribbon 20. The first direction should preferably be a casting direction CD of the magnetic ribbon 20 (see FIG. 6 and below).

Here, a difference between the value of the DC relative magnetic permeability µr in the first direction and the value of the DC relative magnetic permeability µr in the second direction is preferably 3% or more in the following formula. More preferably, the difference is 10% or more.

(Higher µr value−Lower µr value)/Higher µr value× 100(%)

In this embodiment, a description will be given of an example in which the magnetic ribbon 20 has a superior magnetic characteristic in the longitudinal direction to a magnetic characteristic in the width direction. The longitudinal direction in the magnetic ribbon 20 is the same direction as the casting direction CD. The casting direction CD is a direction in which the magnetic ribbon 20 is manufactured at the time of casting. Specifically, the casting direction CD is a direction along a rotation direction of a cooling roll when molten metal to form the magnetic ribbon 20 is discharged onto the cooling roll for casting. Note that the magnetic ribbon 20 may have a superior magnetic characteristic in the width direction to a magnetic characteristic in the longitudinal direction. In this case, the width direction of the magnetic ribbon 20 is the direction of anisotropy. In the present disclosure, a description will be given of an example in which the casting direction CD of the magnetic ribbon 20 and the direction of anisotropy are the same direction.

Figure 6:
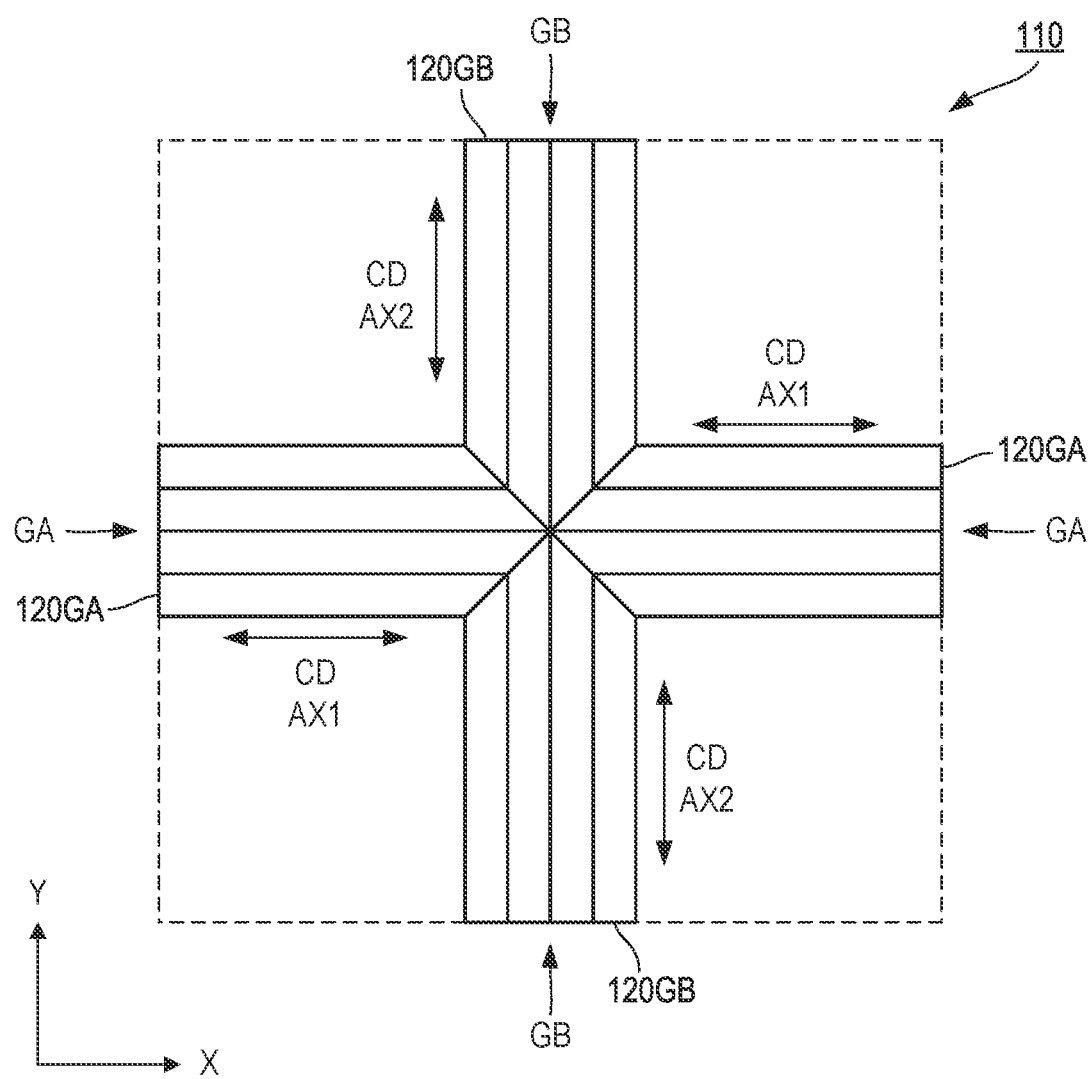
FIG. 6 illustrates a casting direction and a first axial direction of the first group and a casting direction and a second axial direction of the second group.

FIG. 6 illustrates the casting direction CD and a first axial direction AX1 of the first group GA and the casting direction CD and a second axial direction AX2 of the second group GB. Here, the casting direction CD is the same direction as the direction of anisotropy (a direction with higher Q2 value), and the casting direction CD is also the same direction as the longitudinal direction of the magnetic ribbon.

As shown in FIG. 6, in the first groups GA, the X axis direction is the same as the longitudinal direction and the casting direction CD of the magnetic sheet pieces 120GA, and the X axis direction is the first axial direction AX1. The Y axis direction is the same direction as the width direction. In the second groups GB, the Y axis direction is the same direction as the longitudinal direction and the casting direction CD of the magnetic sheet pieces 120GB, and the Y axis direction is the second axial direction AX2. The X axis direction is the same direction as the width direction.

Figure 7:
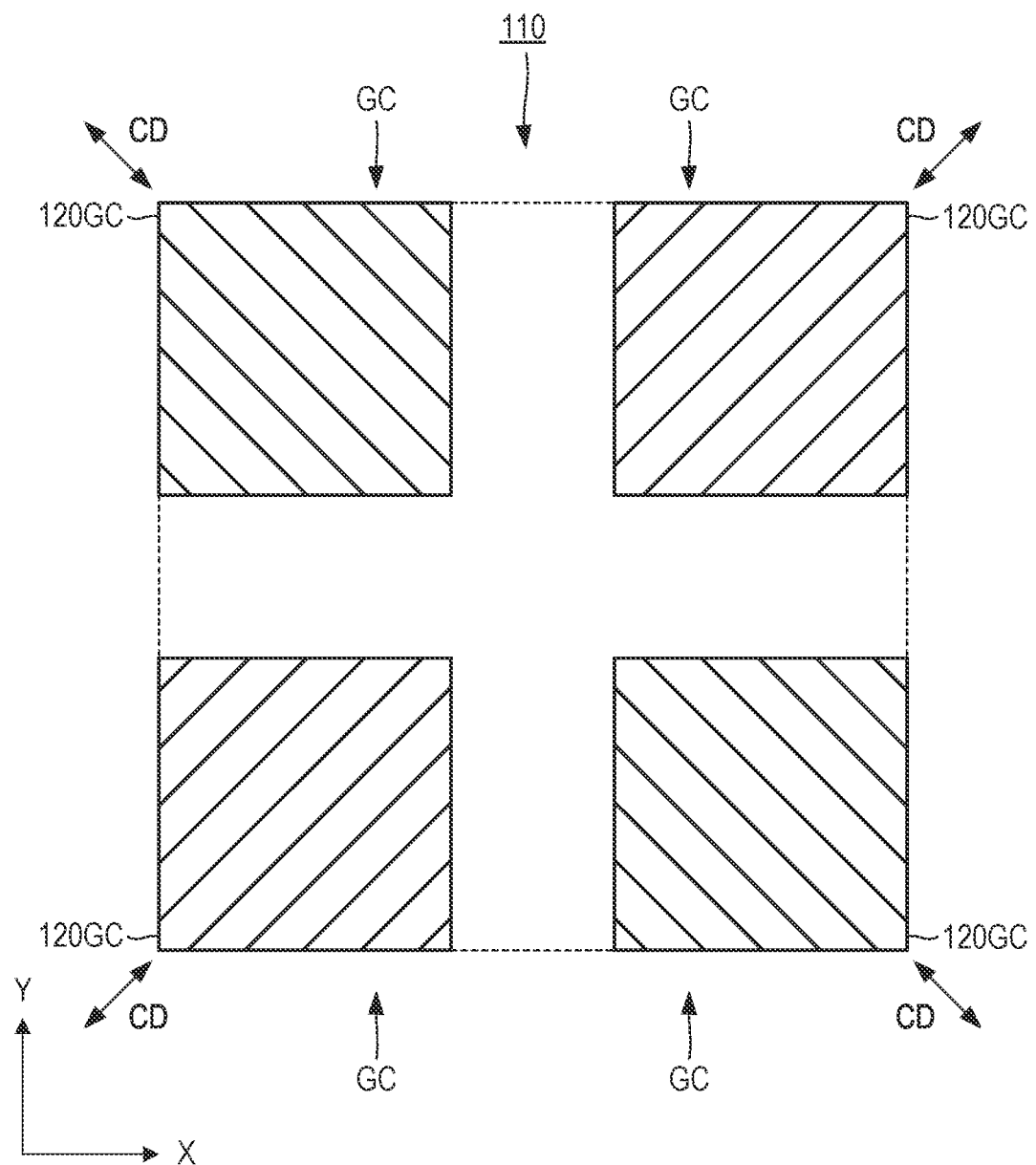
FIG. 7 illustrates a casting direction of the third group.

FIG. 7 illustrates the casting direction CD of the third groups GC.

In each of the third groups GC, as shown in FIG. 7, a diagonal direction in the rectangular third group GC extending toward the center of the magnetic sheet 110 is the same direction as the longitudinal direction and the casting direction CD of the magnetic sheet pieces 120GC. The other diagonal direction that is not oriented to the center of the magnetic sheet 110 is the same direction as the width direction. The longitudinal direction and the casting direction CD of the magnetic sheet pieces 120GC are the same direction as a third axial direction AX3 (see FIG. 18). The third axial direction AX3 is the direction of anisotropy in the third groups GC and is different from the first axial direction AX1 and the second axial direction AX2.

As shown in FIG. 5, the magnetic ribbon 20 is adhered to the adhesive agent 12 of the adhesive layer 10. In this embodiment, the magnetic ribbon 20 is adhered to the adhesive agent 12 arranged on the first surface 11A of the adhesive layer 10.

The resin sheet 15 is a film-like member formed using a resin and is also referred to as a "protective film", a "release film", or a "liner". The resin sheet 15 is a member used for protecting the magnetic ribbon 20, the magnetic sheet piece 120GA, the magnetic sheet piece 120GB, the magnetic sheet piece 120GC, the first group GA, the second group GB, the third group GC and the magnetic sheet 110.

The resin sheet 15 has a function of preventing an unnecessary increase in formation of the below-described cracks 21 (or cracks 21 connecting multiple cracks 21 in a mesh shape) due to application of an unintended external force to the magnetic ribbon 20. Furthermore, the resin sheet 15 has a function of preventing the small pieces 22 of the magnetic ribbon 20 from falling off and a function of preventing the magnetic ribbon 20 from rusting.

Moreover, the resin sheet 15 has a function of preventing unnecessary deformation when the magnetic sheet piece 120GA, the magnetic sheet piece 120GB, the magnetic sheet piece 120GC, the first group GA, the second group GB, the third group GC and the magnetic sheet 110 are processed into a predetermined shape. Examples of the unnecessary deformation may include surface unevenness.

The resin sheet 15 is preferably a film-like member formed using a resin, and more preferably a member formed using a resin with elasticity. When the resin sheet 15 is a member formed using a resin, generation of unevenness on the surface of the magnetic ribbon 20 can be easily reduced by an elastic force of the resin sheet 15.

Even when unevenness is generated on the surface of the magnetic ribbon 20, the unevenness of the magnetic ribbon 20 tends to be flat due to the elastic force of the resin sheet 15. The resin sheet 15 can make the surface of the magnetic ribbon 20 a favorable state with less unevenness. Moreover, with the resin sheet 15, it is easy to reduce an over-time change in the magnetic characteristics of the magnetic sheet piece 120GA, the magnetic sheet piece 120GB, the magnetic sheet piece 120GC, the first group GA, the second group GB, the third group GC and the magnetic sheet 110.

As the resin sheet 15, a resin having a lower limit of a tensile elastic modulus of 0.1 GPa can be used. When the tensile elastic modulus of the resin is 0.1 GPa or more, the above effect can be easily obtained sufficiently. The lower limit of the tensile elastic modulus is preferably 0.5 GPa, and more preferably 1.0 GPa.

An upper limit of the tensile elastic modulus of the resin sheet 15 is preferably 10 GPa. When the upper limit of the tensile elastic modulus of the resin sheet 15 exceeds 10 GPa, the deformation of the alloy ribbon may be suppressed when the below-described cracks 21 are formed. The upper limit of the tensile elastic modulus is preferably 9 GPa, and more preferably 8 GPa.

In the resin sheet 15, the thickness of the resin sheet 15 is preferably 1 μm or more and 100 μm or less. When the thickness of the resin sheet 15 increases, the magnetic sheet piece 120GA, the magnetic sheet piece 120GB, the magnetic sheet piece 120GC, the first group GA, the second group GB, the third group GC and the magnetic sheet 110 are less likely to be deformed. In this case, it may be difficult to dispose the magnetic sheet piece 120GA, the magnetic sheet piece 120GB, the magnetic sheet piece 120GC, the first group GA, the second group GB, the third group GC and the magnetic sheet 110 along a curved surface or a bent surface.

When the thickness of the resin sheet 15 is less than 1 μm, the resin sheet 15 is more likely to be deformed. In this case, handling of resin sheet 15 becomes difficult, and a function of the resin sheet 15 for supporting the magnetic ribbon 20 may not be obtained sufficiently. In this case, when the resin sheet 15 is used as a protective film, the strength of the resin sheet 15 becomes weak, and the function of protecting the magnetic ribbon 20 and the like may not be sufficient.

As the resin of the resin sheet 15, it is possible to use, for example, polyethylene terephthalate (PET), polyimide, polyetherimide, polyethylene naphthalate, polypropylene, polyethylene, polystyrene, polycarbonate, polysulfone, polyether ketone, polyvinyl chloride, polyvinyl alcohol, fluorine resin, acrylic resin, cellulose, and the like. Polyamide and polyimide are particularly preferable as the resin for forming the resin sheet 15 from the viewpoint of heat resistance and dielectric loss.

Figure 8:
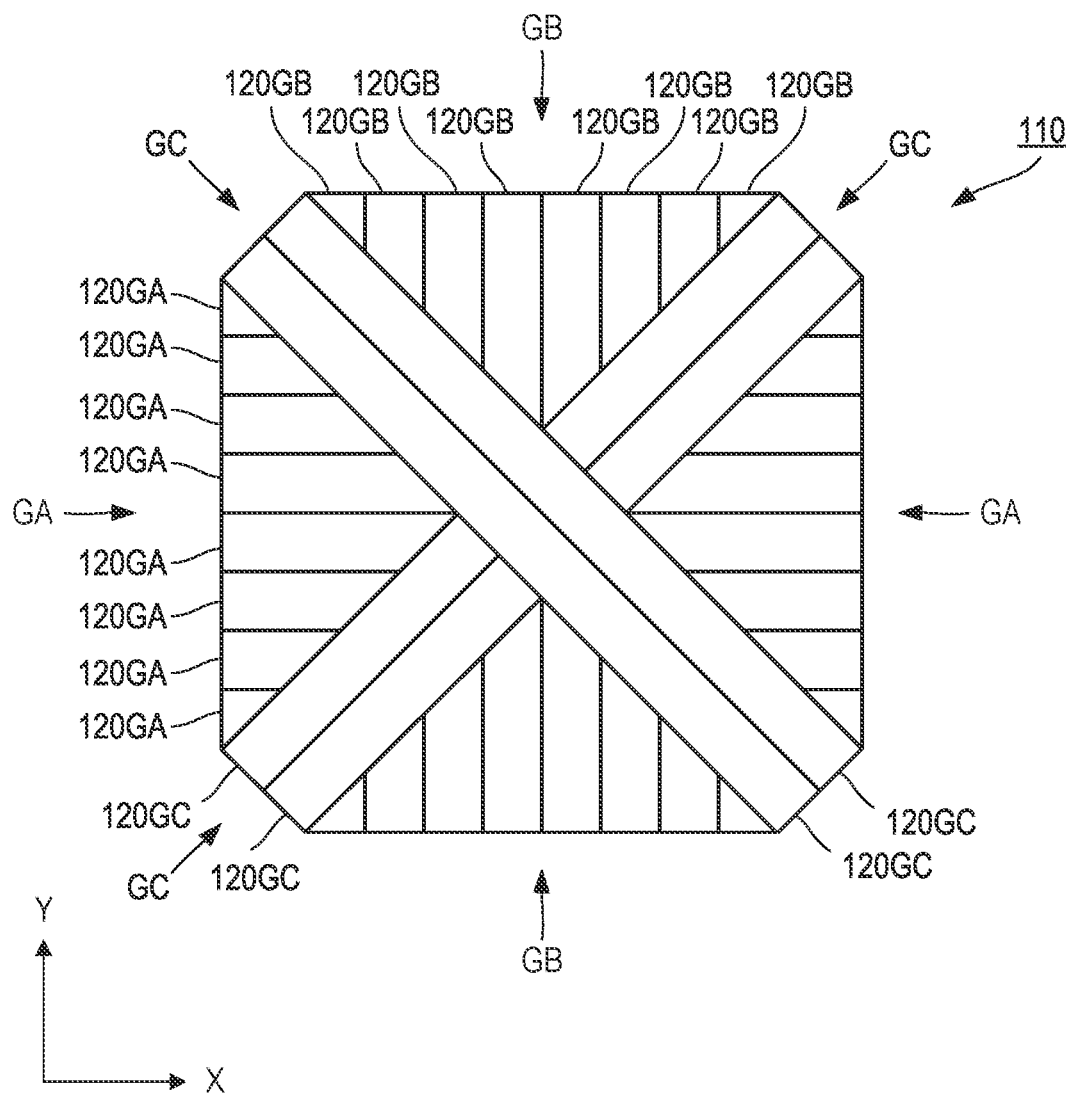
FIG. 8 illustrates another configuration of the magnetic sheet.

FIG. 8 illustrates another configuration of the magnetic sheet 110.

As shown in FIG. 8, the magnetic sheet 110 may comprise two first groups GA, two second groups GB, and three third groups GC.

The first group GA shown in FIG. 8 has a triangular shape with multiple magnetic sheet pieces 120GA arranged next to each other. FIG. 8 illustrates a configuration in which eight magnetic sheet pieces 120GA are arranged next to each other. The number of magnetic sheet pieces 120GA constituting one first group GA may be eight, and more or less than eight.

The two first groups GA are arranged so that the longitudinal direction of the magnetic sheet pieces 120GA is along the X axis direction, and the two first groups GA are arranged next to each other in the X axis direction so that the vertices face each other. The two first groups GA, which are arranged next to each other in the X axis direction, are placed in the middle position of the magnetic sheet 110 in the Y axis direction. In the first group GA, there are some cases where the longitudinal direction of a magnetic sheet piece 120GA is not clear in a triangular corner and the like. In this case, the casting direction CD of the magnetic ribbon 20 can be deemed as the longitudinal direction of the magnetic sheet piece. The same can be applied to other magnetic sheet pieces.

The second group GB shown in FIG. 8 has a triangular shape with multiple magnetic sheet pieces 120GB arranged next to each other. FIG. 8 illustrates a configuration in which eight magnetic sheet pieces 120GB are arranged next to each other. The number of magnetic sheet pieces 120GB constituting one second group GB may be eight, and more or less than eight.

The two second groups GB are arranged so that the longitudinal direction of the magnetic sheet pieces 120GB is along the Y axis direction, and the two second groups GB are arranged next to each other in the Y axis direction so that the vertices face each other. The two second groups GB, which are arranged next to each other in the Y axis direction, are placed in the middle position of the magnetic sheet 110 in the X axis direction.

The third group GC shown in FIG. 8 has a rectangular shape with multiple magnetic sheet pieces 120GC including an elongated magnetic sheet piece 120GC. The elongated magnetic sheet pieces 120GC are arranged so that the longitudinal direction is along the diagonal direction of the rectangular shape. FIG. 8 illustrates a configuration in which two magnetic sheet pieces 120GC are arranged next to each other. The number of magnetic sheet pieces 120GC constituting one third group GC may be two, and more or less than two.

One of the three third groups GC is arranged over the entire length of the diagonal line in the magnetic sheet 110. The remaining two third groups GC are arranged in series on the other diagonal line.

In FIG. 8, a center portion of the magnetic sheet 110 may be configured as a hole. In this case, the size of the hole should be smaller than the inner diameter of the coil.

Figure 9A:
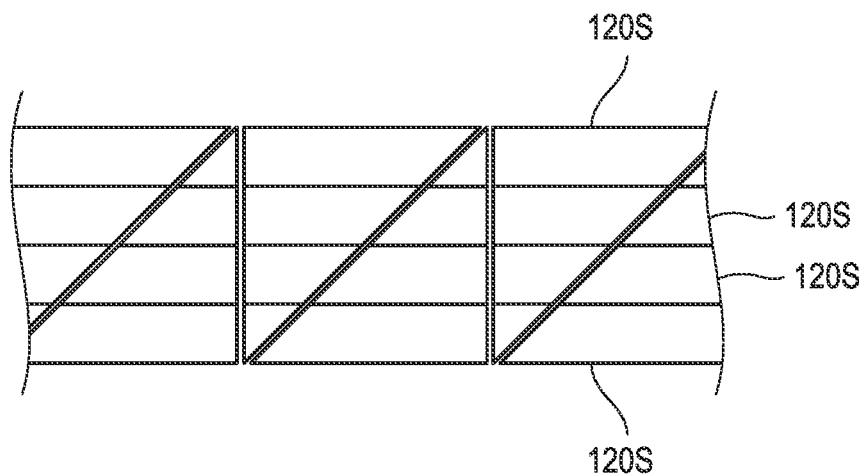
FIG. 9A illustrates a state of rectangular magnetic sheet pieces before cutting.
Figure 9B:
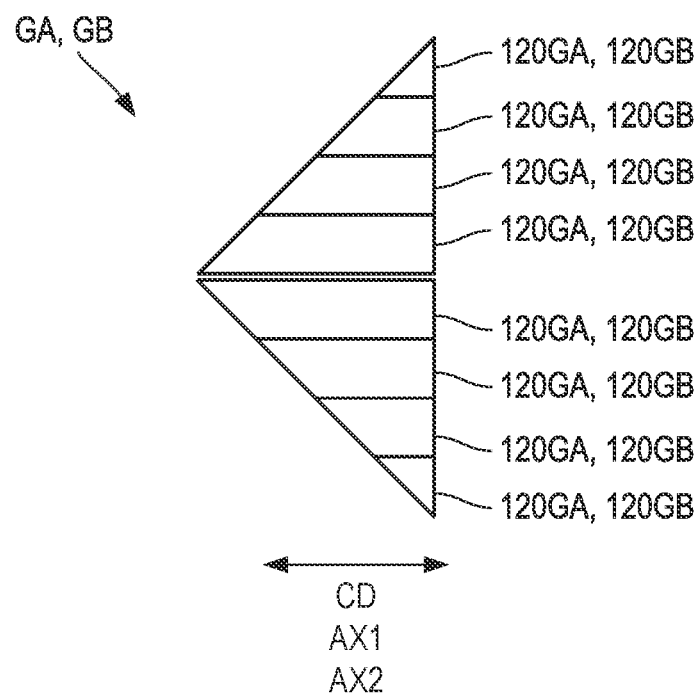
FIG. 9B illustrates a method of forming a first group and a second group shown in FIG. 8 using the cut magnetic sheet pieces.

FIGS. 9A and 9B illustrate a method of forming the first group GA and the second group GB shown in FIG. 8.

The first group GA and the second group GB are formed of the magnetic sheet pieces 120S having an elongated rectangular strip shape as shown in FIG. 9A. In this embodiment, a description will be given of an example in which the first group GA and the second group GB are formed of four strips of the magnetic sheet piece 120S arranged next to each other in the width direction.

Specifically, the four strips of the magnetic sheet piece 120S arranged next to each other are cut into a predetermined length, and further cut at a predetermined angle to the longitudinal direction, to thereby form multiple magnetic sheet pieces 120GA and multiple magnetic sheet piece 120GB. Here, the predetermined length is preferably determined based on the length of the first group GA and the second group GB in the longitudinal direction. The predetermined angle is preferably an angle of 45°.

Here, the four strips of the magnetic sheet piece 120S arranged next to each other may be integrally formed.

Next, the magnetic sheet pieces 120GA and the magnetic sheet pieces 120GB are arranged as shown in FIG. 9B, to thereby form the first group GA and the second group GB, respectively. FIG. 9B illustrates an example in which eight magnetic sheet pieces 120GA and eight magnetic sheet pieces 120GB constitute the first group GA and the second group GB, respectively.

The eight strips of the magnetic sheet piece 120S may be arranged next to each other and integrally formed, and then processed into the shape shown in FIG. 9B.

Figure 10:
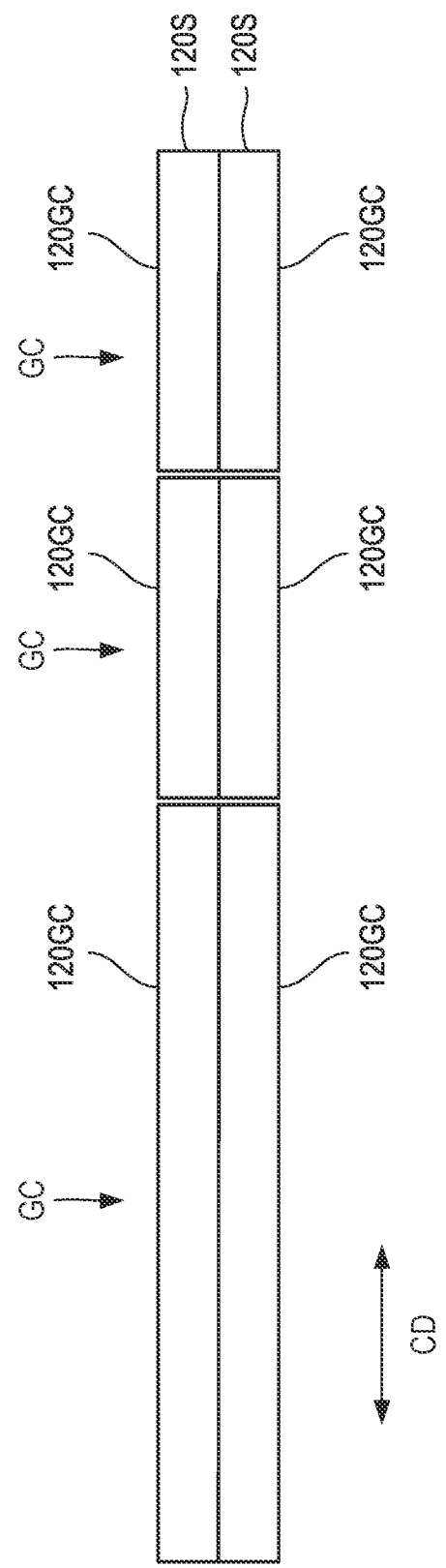
FIG. 10 illustrates a method of forming the third group shown in FIG. 8.

FIG. 10 illustrates a method of forming the third group GC shown in FIG. 8.

The third group GC is formed of the magnetic sheet pieces 120S each having an elongated rectangular strip shape as shown in FIG. 10. In this embodiment, a description will be given of an example in which the third group GC is formed of two strips of the magnetic sheet piece 120S arranged next to each other in the width direction.

Specifically, the two strips of the magnetic sheet piece 120S arranged next to each other are cut into predetermined lengths in the longitudinal direction, and the multiple third groups GC are formed. Specifically, one of the third groups GC to be arranged over the entire length of one diagonal line and two third groups GC to be arranged in series on the other diagonal line are formed.

Here, the two strips of the magnetic sheet piece 120S arranged next to each other may be integrally formed.

Figure 11:
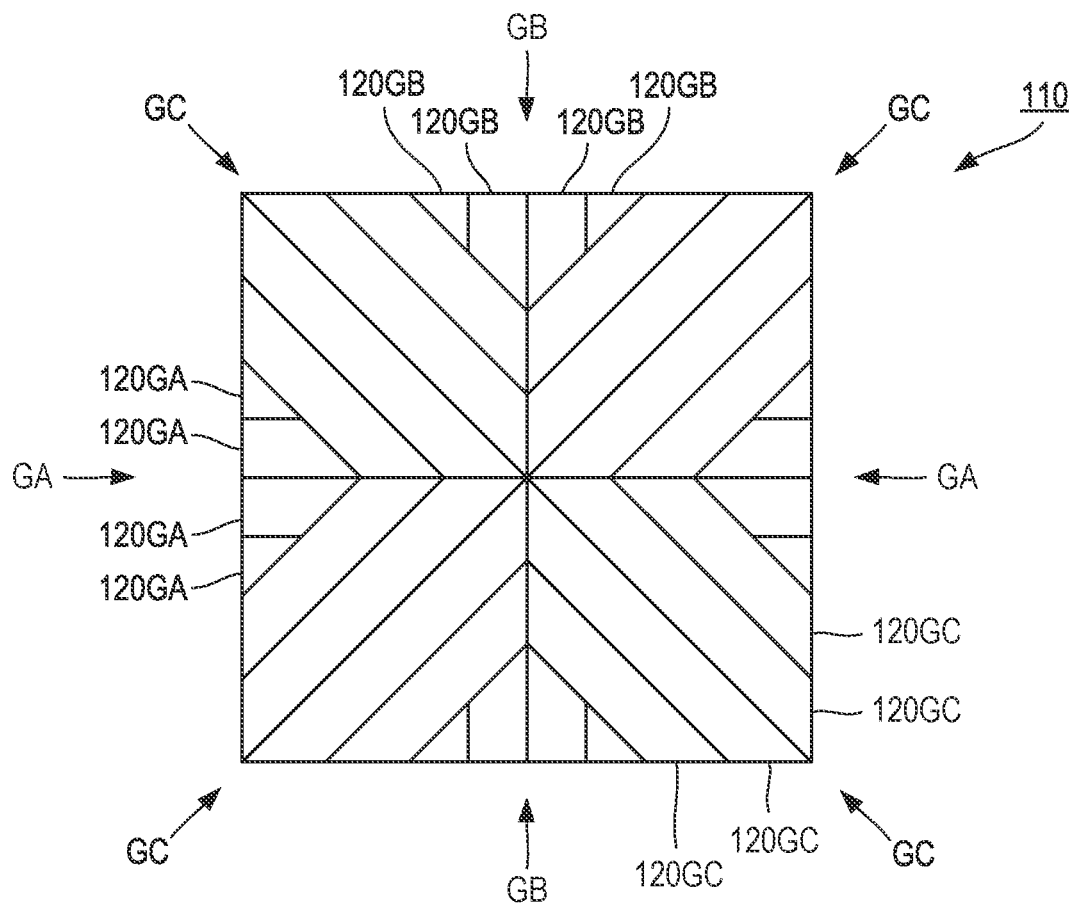
FIG. 11 illustrates another configuration of the magnetic sheet.

FIG. 11 illustrates another configuration of the magnetic sheet 110.

As shown in FIG. 11, the magnetic sheet 110 may comprise two first groups GA, two second groups GB, and four third groups GC.

The first group GA shown in FIG. 11 has a triangular shape with multiple magnetic sheet pieces 120GA arranged next to each other. FIG. 11 illustrates a configuration in which four magnetic sheet pieces 120GA are arranged next to each other. The number of magnetic sheet pieces 120GA constituting one first group GA may be four, and more or less than four.

The two first groups GA are arranged so that the longitudinal direction of the magnetic sheet pieces 120GA is along the X axis direction, and the two first groups GA are arranged next to each other in the X axis direction so that the vertices face each other. The two first groups GA, which are arranged next to each other in the X axis direction, are placed in the middle position of the magnetic sheet 110 in the Y axis direction.

The second group GB shown in FIG. 11 has a triangular shape with multiple magnetic sheet pieces 120GB arranged next to each other. FIG. 11 illustrates a configuration in which four magnetic sheet pieces 120GB are arranged next to each other. The number of magnetic sheet pieces 120GB constituting one second group GB may be four, and more or less than four.

The two second groups GB are arranged so that the longitudinal direction of the magnetic sheet pieces 120GB is along the Y axis direction, and the two second groups GB are arranged next to each other in the Y axis direction so that the vertices face each other. The two second groups GB, which are arranged next to each other in the Y axis direction, are placed in the middle position of the magnetic sheet 110 in the X axis direction.

The third group GC shown in FIG. 11 has a hexagonal shape with multiple magnetic sheet pieces 120GC including an elongated magnetic sheet piece 120GC. FIG. 11 illustrates a configuration in which four magnetic sheet pieces 120GC are arranged next to each other. The number of magnetic sheet pieces 120GC constituting one third group GC may be four, and more or less than two.

The four third groups GC are arranged in the four corners of the magnetic sheet 110. In other words, the four third groups GC are arranged at four positions each adjacent to the first group GA and the second group GB. The elongated magnetic sheet pieces 120GC in the four third groups GC are arranged so that the longitudinal direction are oriented toward the center of the cross shape. In other words, the elongated magnetic sheet pieces 120GC in the four third groups GC are arranged so that the longitudinal directions form an X shape.

In FIG. 11, a center portion of the magnetic sheet 110 may be configured as a hole. In this case, the size of the hole should be smaller than the inner diameter of the coil.

Figure 12:
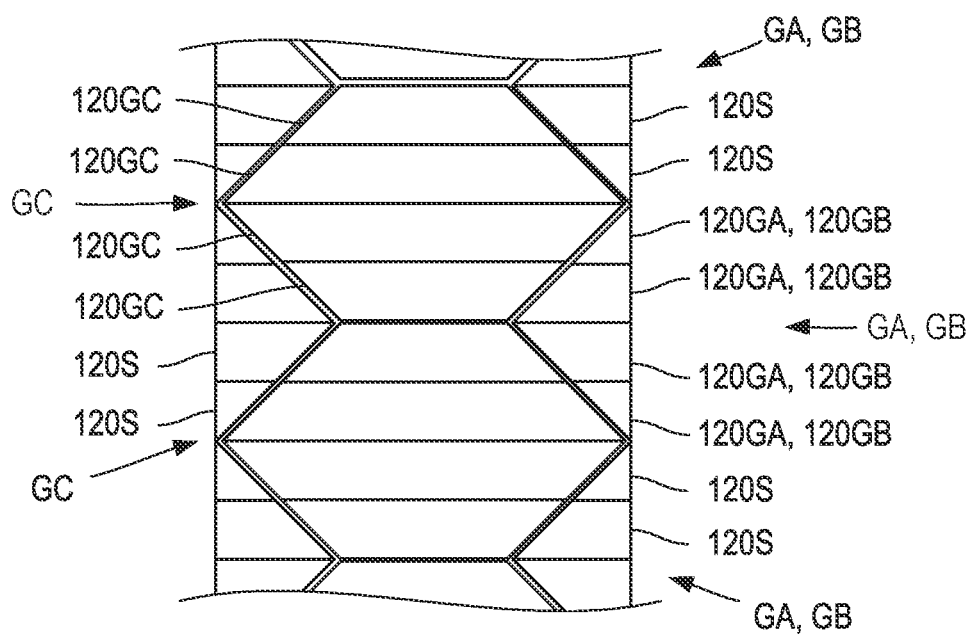
FIG. 12 illustrates a method of forming a first group, a second group, and a third group shown in FIG. 11.

FIG. 12 illustrates a method of forming the first group GA, the second group GB, and the third group GC shown in FIG. 11.

The first group GA, the second group GB, and the third group GC are formed of the magnetic sheet pieces 120S having an elongated rectangular strip shape as shown in FIG. 12. In this embodiment, a description will be given of an example in which the first group GA, the second group GB, and the third group GC are formed of multiple strips of the magnetic sheet piece 120S arranged next to each other in the width direction.

Specifically, the multiple strips of the multiple magnetic sheet piece 120S that are cut into a predetermined length and that are arranged next to each other are cut to form multiple magnetic sheet pieces 120GA, multiple magnetic sheet pieces 120GB, and multiple magnetic sheet pieces 120GC. In other words, the first group GA, the second group GB, and the third group GC are formed.

Specifically, both ends in the longitudinal direction of the strips of the magnetic sheet piece 120S are cut in the width direction at predetermined angles to the longitudinal direction. The predetermined angles are alternated each time two magnetic sheet pieces 120S are cut. The predetermined angles are preferably +45° and −45°.

Figure 13:
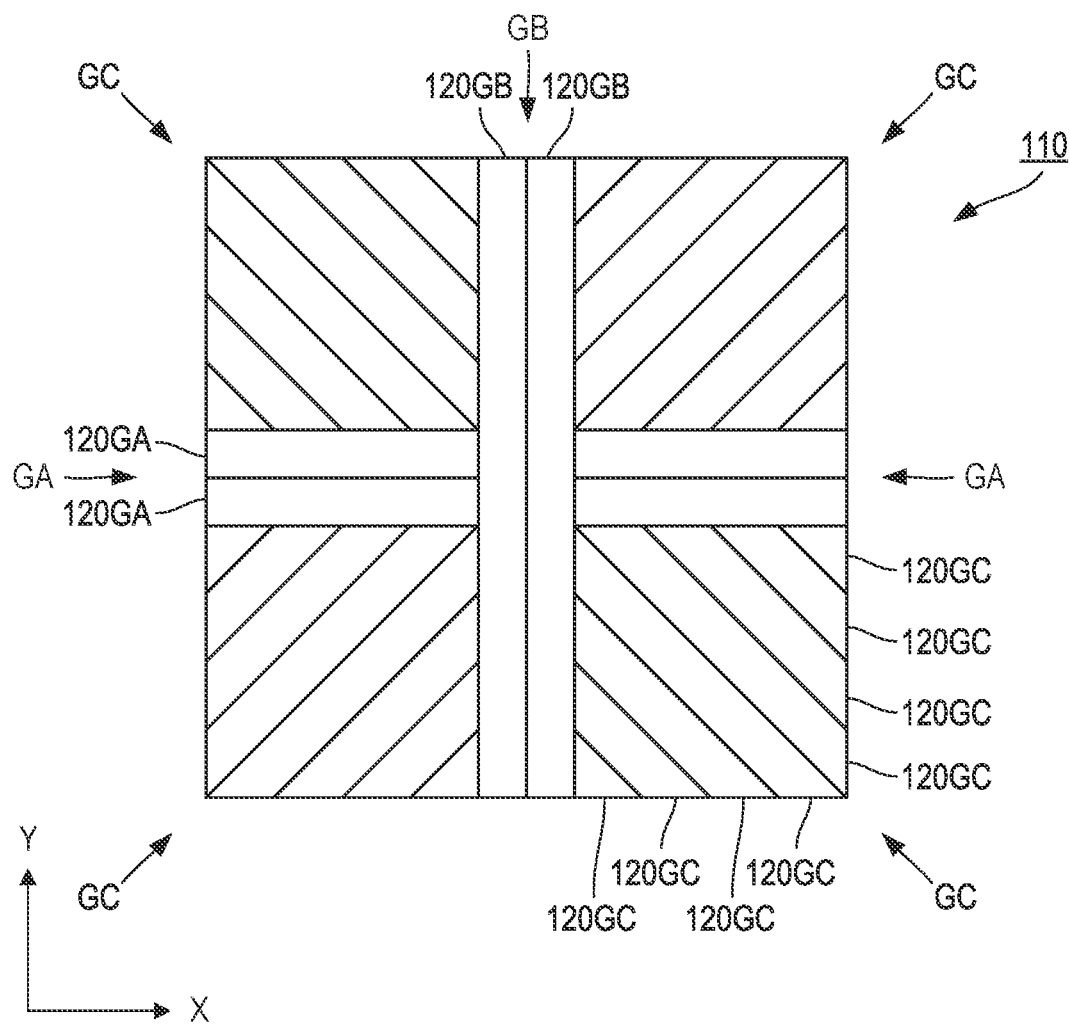
FIG. 13 illustrates another configuration of the magnetic sheet.

FIG. 13 illustrates another configuration of the magnetic sheet 110.

As shown in FIG. 13, the magnetic sheet 110 may comprise two first groups GA, one second group GB, and four third groups GC.

The first group GA shown in FIG. 13 has a rectangular shape with multiple magnetic sheet pieces 120GA arranged next to each other. FIG. 13 illustrates a configuration in which two magnetic sheet pieces 120GA are arranged next to each other. The number of magnetic sheet pieces 120GA constituting one first group GA may be two, and more or less than two.

The two first groups GA are arranged so that the longitudinal direction of the magnetic sheet pieces 120GA is along the X axis direction, and the two first groups GA are arranged next to each other in the longitudinal direction. The two first groups GA, which are arranged next to each other in the X axis direction, are placed in the middle position of the magnetic sheet 110 in the Y axis direction.

The second group GB shown in FIG. 13 has a rectangular shape with multiple magnetic sheet pieces 120GB arranged next to each other. FIG. 13 illustrates a configuration in which two magnetic sheet pieces 120GB are arranged next to each other. The number of magnetic sheet pieces 120GB constituting one second group GB may be two, and more or less than two.

The second group GB is arranged so that the longitudinal direction of the magnetic sheet pieces 120GB is along the Y-direction. The second group GB is arranged in the middle position of the magnetic sheet 110 in the X axis direction.

The third group GC shown in FIG. 13 has a rectangular shape with multiple magnetic sheet pieces 120GC including an elongated magnetic sheet piece 120GC. The elongated magnetic sheet pieces 120GC are arranged so that the longitudinal direction is along the diagonal direction of the rectangular shape. FIG. 13 illustrates a configuration in which eight magnetic sheet pieces 120GC are arranged next to each other. The number of magnetic sheet pieces 120GC constituting one third group GC may be eight, and more or less than eight.

The four third groups GC are arranged in the four corners of the magnetic sheet 110. In other words, the four third groups GC are arranged at four positions each adjacent to the first group GA and the second group GB. The elongated magnetic sheet pieces 120GC in the four third groups GC are arranged so that the longitudinal direction is oriented toward the center of the magnetic sheet pieces 120GC. In other words, the elongated magnetic sheet pieces 120GC in the four third groups GC are arranged so that the longitudinal directions form an X shape.

In FIG. 13, a center portion of the magnetic sheet 110 may be configured as a hole. In this case, the size of the hole should be smaller than the inner diameter of the coil.

Figure 14:
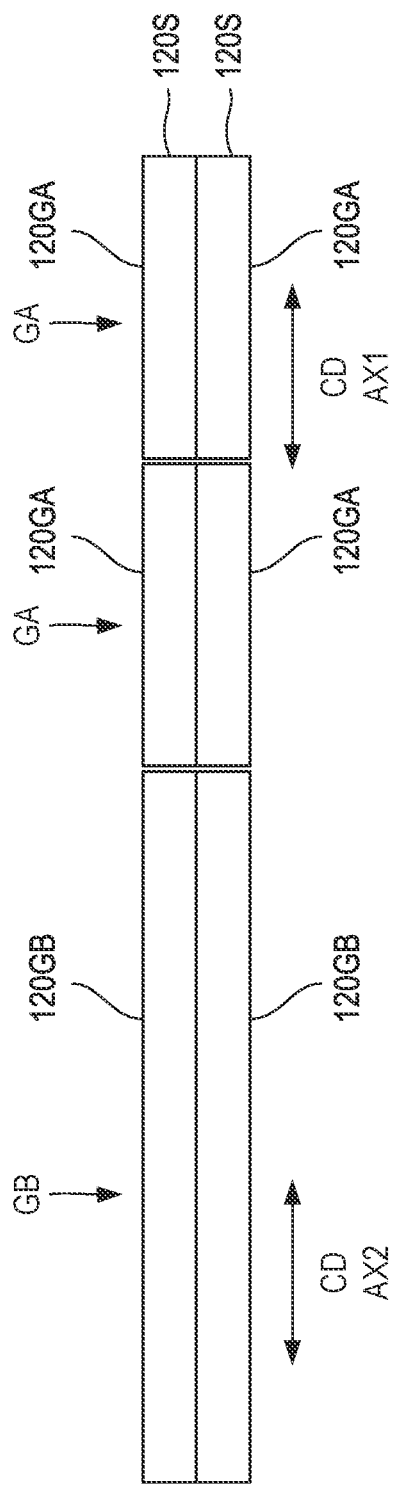
FIG. 14 illustrates a method of forming a first group and a second group shown in FIG. 13.

FIG. 14 illustrates a method of forming the first group GA and the second group GB shown in FIG. 13.

The first group GA and the second group GB are formed of the magnetic sheet pieces 120S having an elongated rectangular strip shape as shown in FIG. 14. In this embodiment, a description will be given of an example in which the first group GA and the second group GB are formed of two strips of the magnetic sheet piece 120S arranged next to each other in the width direction.

Specifically, the two strips of the magnetic sheet piece 120S arranged next to each other are cut into predetermined lengths in the longitudinal direction, and the first group GA and the second group GB are formed. Specifically, two first groups GA with a relatively short dimension in the longitudinal direction and one second group GB with a relatively long dimension in the longitudinal direction are formed.

Figure 15A:
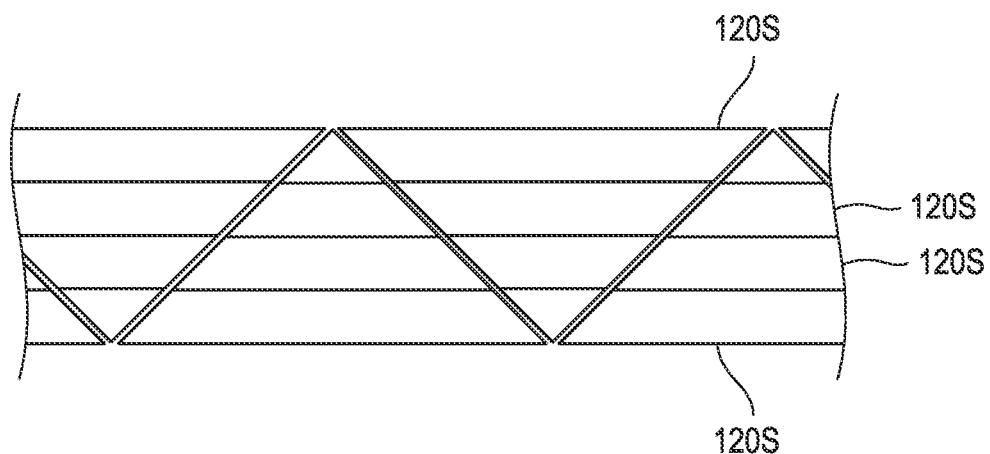
FIG. 15A illustrates a state of rectangular magnetic sheet pieces before cutting.
Figure 15B:
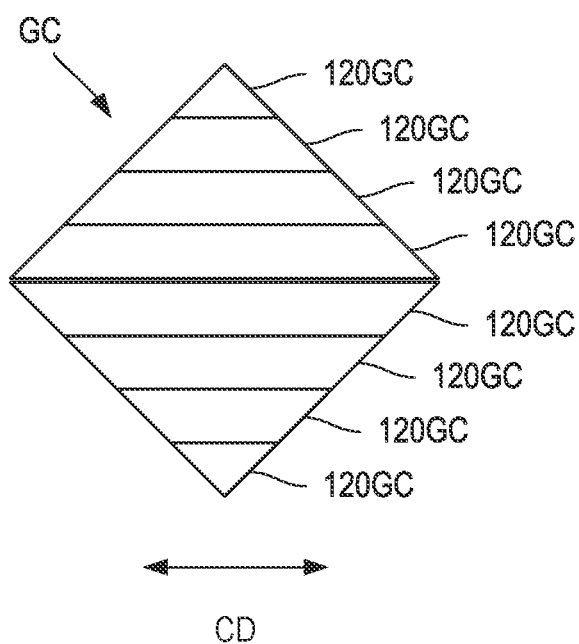
FIG. 15B illustrates a method of forming a third group using the cut magnetic sheet pieces.

FIGS. 15A and 15B illustrate a method of constituting the third group GC shown in FIG. 13.

The third group GC is formed of the magnetic sheet pieces 120S having an elongated rectangular strip shape as shown in FIG. 15A. In this embodiment, a description will be given of an example in which the third group GC is formed of four strips of the magnetic sheet piece 120S arranged next to each other in the width direction.

Specifically, the four strips of the magnetic sheet piece 120S arranged next to each other are cut at predetermined angles to the longitudinal direction, and multiple magnetic sheet pieces 120GC are formed.

Then, the multiple magnetic sheet pieces 120GC are arranged as shown in FIG. 15B to thereby form the third groups GC. In FIG. 15B illustrates an example in which eight magnetic sheet pieces 120GC constitute the third group GC having a rectangular shape.

Figure 16:
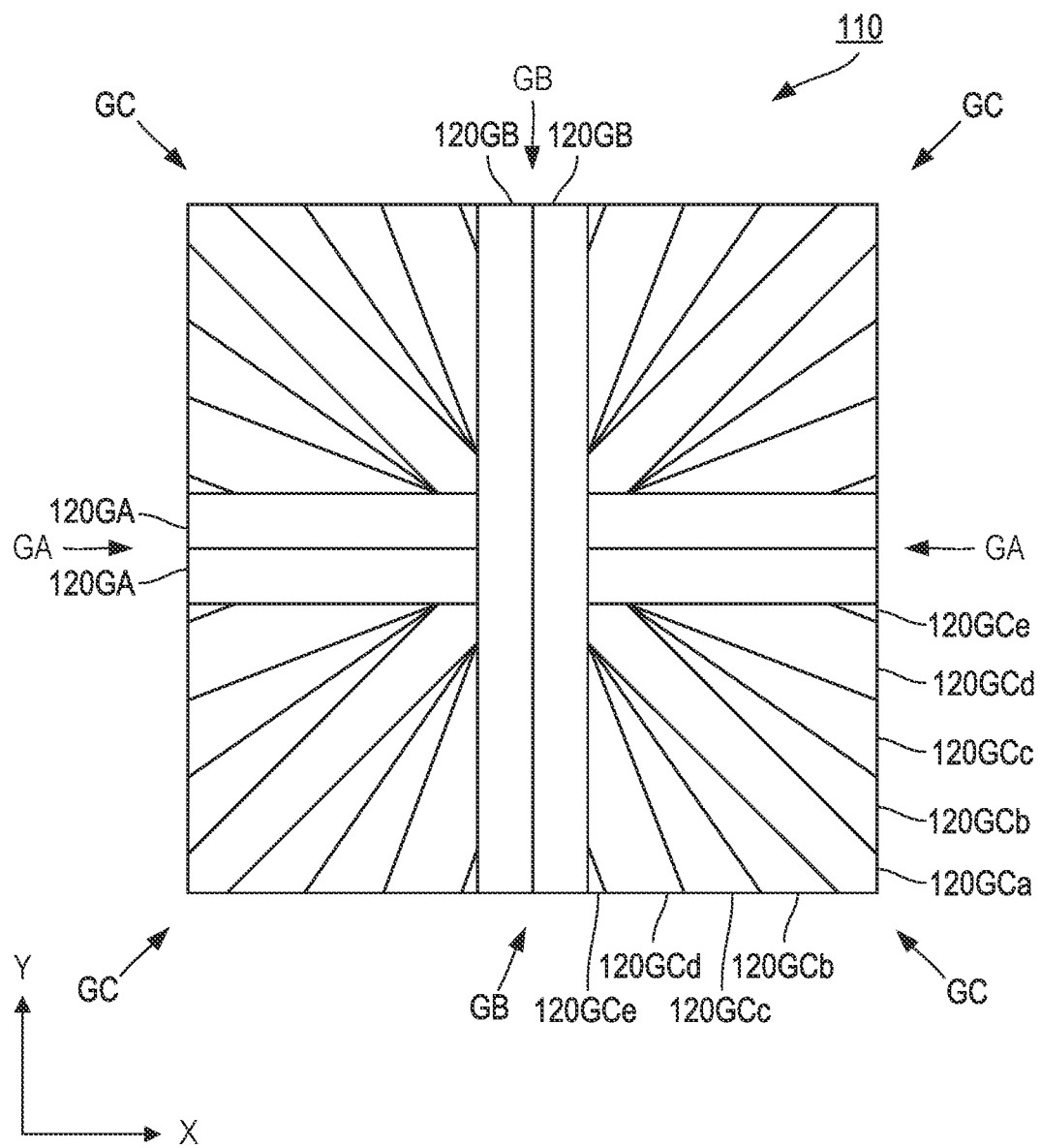
FIG. 16 illustrates another configuration of the magnetic sheet.

FIG. 16 illustrates another configuration of the magnetic sheet 110.

As shown in FIG. 16, the magnetic sheet 110 may comprise two first groups GA, one second groups GB, and four third groups GC.

The first group GA shown in FIG. 16 has a rectangular shape with multiple magnetic sheet pieces 120GA arranged next to each other. FIG. 16 illustrates a configuration in which two magnetic sheet pieces 120GA are arranged next to each other. The number of magnetic sheet pieces 120GA constituting one first group GA may be two, and more or less than two.

The two first groups GA are arranged so that the longitudinal direction of the magnetic sheet pieces 120GA is along the X axis direction, and the two first groups GA are arranged next to each other in the longitudinal direction. The two first groups GA, which are arranged next to each other in the X axis direction, are placed in the middle position of the magnetic sheet 110 in the Y axis direction.

The second group GB shown in FIG. 16 has a rectangular shape with multiple magnetic sheet pieces 120GB arranged next to each other. FIG. 16 illustrates a configuration in which two magnetic sheet pieces 120GB are arranged next to each other. The number of magnetic sheet pieces 120GB constituting one second group GB may be two, and more or less than two.

The second group GB is arranged so that the longitudinal direction of the magnetic sheet pieces 120GB is along the Y axis direction. The second group GB is arranged in the middle position of the magnetic sheet 110 in the X axis direction.

The third group GC shown in FIG. 16 has a rectangular shape with multiple magnetic sheet pieces 120GC including an elongated magnetic sheet piece 120GCa. FIG. 16 illustrates a configuration in which nine magnetic sheet pieces are arranged next to each other. The number of magnetic sheet pieces 120GC constituting one third group GC may be nine, and more or less than nine.

The four third groups GC are arranged in the four corners of the magnetic sheet 110. In other words, the four third groups GC are arranged at four positions each adjacent to the first group GA and the second group GB. The elongated magnetic sheet pieces 120GC in the four third groups GCa are arranged so that the longitudinal direction is oriented toward the center of the cross shape. In other words, the elongated magnetic sheet pieces 120GCa in the four third groups GC are arranged so that the longitudinal directions form an X shape.

In FIG. 16, a center portion of the magnetic sheet 110 may be configured as a hole. In this case, the size of the hole should be smaller than the inner diameter of the coil.

Figure 17:
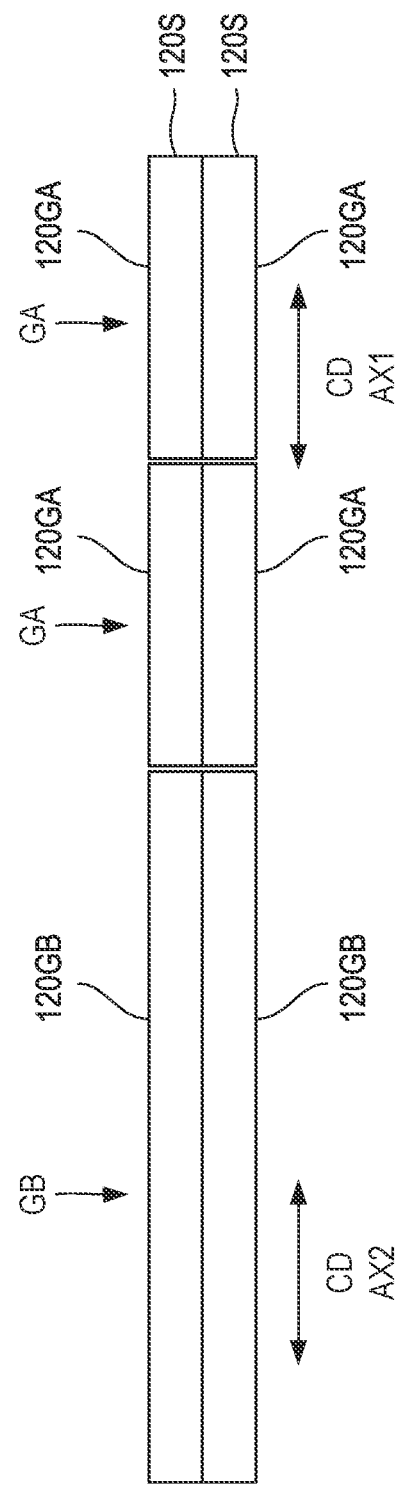
FIG. 17 illustrates a method of forming a first group and a second group shown in FIG. 16.

FIG. 17 illustrates a method of forming the first group GA and the second group GB shown in FIG. 16.

The first group GA and the second group GB are formed of the magnetic sheet pieces 120S having an elongated rectangular strip shape as shown in FIG. 17. In this embodiment, a description will be given of an example in which the first group GA and the second group GB are formed of two strips of the magnetic sheet piece 120S arranged next to each other in the width direction.

Specifically, the two strips of the magnetic sheet piece 120S arranged next to each other are cut into predetermined lengths in the longitudinal direction, and the first group GA and the second group GB are formed. Specifically, two first groups GA with a relatively short dimension in the longitudinal direction and one second group GB with a relatively long dimension in the longitudinal direction are formed.

Figure 18:
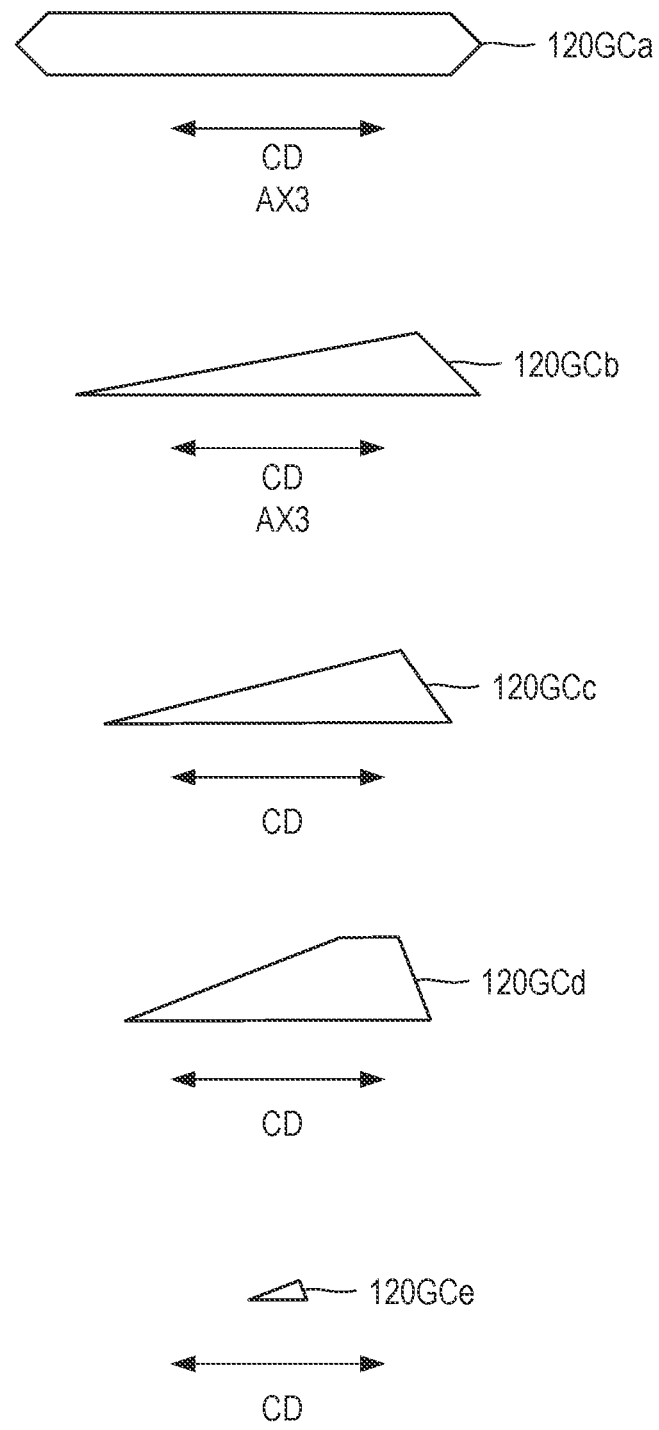
FIG. 18 illustrates a method of forming a third group shown in FIG. 16.

FIG. 18 illustrates a method of forming the third group GC shown in FIG. 16.

As shown in FIGS. 16 and 18, the third group GC is formed of one magnetic sheet piece 120GCa, two magnetic sheet pieces 120GCb, two magnetic sheet pieces 120GCc, two magnetic sheet pieces 120GCd, and two magnetic sheet pieces 120GCe.

One magnetic sheet piece 120GCa has an elongated hexagonal shape cut our from the magnetic sheet piece 120S having a rectangular strip shape. The longitudinal direction of the magnetic sheet piece 120GCa is the same as the casting direction CD.

The two magnetic sheet pieces 120GCb each have an elongated triangle shape that is shorter than the magnetic sheet piece 120GCa and that is cut out from the magnetic sheet piece 120S having a rectangular strip shape. The longitudinal direction of the magnetic sheet piece 120GCb is the same as the casting direction CD.

The two magnetic sheet pieces 120GCc each have an elongated triangle shape that is shorter than the magnetic sheet piece 120GCb and that is cut out from the magnetic sheet piece 120S having a rectangular strip shape. The longitudinal direction of the magnetic sheet piece 120GCc is the same as the casting direction CD.

The two magnetic sheet pieces 120GCd each have an elongated trapezoidal shape that is shorter than the magnetic sheet piece 120GCc and that is cut out from the magnetic sheet piece 120S having a rectangular strip shape. The longitudinal direction of the magnetic sheet piece 120GCd is the same as the casting direction CD.

The two magnetic sheet pieces 120GCe each have an elongated triangle shape that is shorter than the magnetic sheet piece 120GCd and that is cut out from the magnetic sheet piece 120S having a rectangular strip shape. The longitudinal direction of the magnetic sheet piece 120GCe is the same as the casting direction CD.

Figure 19:
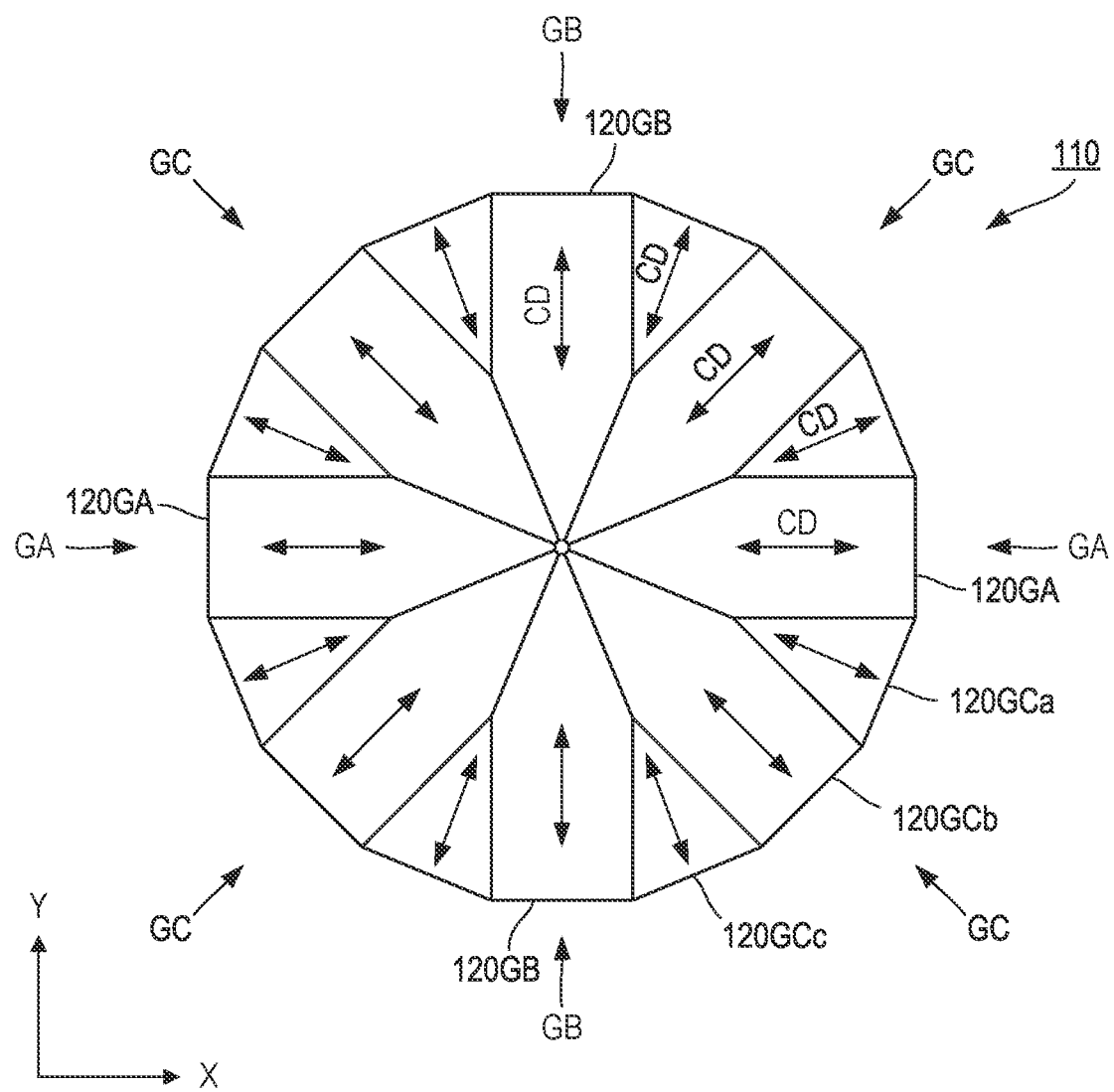
FIG. 19 illustrates another configuration of the magnetic sheet.

FIG. 19 illustrates another configuration of the magnetic sheet 110.

As shown in FIG. 19, the magnetic sheet 110 may comprise two first groups GA, two second groups GB, and four third groups GC.

The first group GA shown in FIG. 19 comprises elongated magnetic sheet pieces 120GA having a triangular pointed portion on one end and a straight portion on the other end, and the magnetic sheet pieces are arranged next to each other with the triangular pointed portions facing each other. In this magnetic sheet pieces 120GA, the direction of anisotropy is the same as the X axis direction.

In the magnetic sheet piece 120GA shown in FIG. 19, the angle of the triangular pointed portion is 45°. In this magnetic sheet piece 120GA, nanocrystalline alloy ribbons are laminated in five layers through the adhesive layers. The cracks 21 are formed in a state where the nanocrystalline alloy ribbon is adhered to the adhesive layer, and the nanocrystalline alloy ribbon is divided into the small pieces 22. Note that magnetic sheet piece 120GA may be formed of two or more magnetic sheet pieces. The number of layers of the nanocrystalline alloy ribbon may be more than five.

The two first groups GA are arranged so that the longitudinal direction of the magnetic sheet pieces 120GA is along the X axis direction, and the two first groups GA are arranged next to each other in the longitudinal direction. The two first groups GA, which are arranged next to each other in the X axis direction, are placed in the middle position of the magnetic sheet 110 in the Y axis direction.

The second group GB shown in FIG. 19 comprises elongated magnetic sheet pieces 120GB having a triangular pointed portion on one end and a straight portion on the other end, and the magnetic sheet pieces are arranged next to each other with the triangular pointed portions facing each other. This magnetic sheet piece 120GB has the same structure as the magnetic sheet piece 120GA, but is arranged in a different direction.

The second groups GB are arranged so that the direction of anisotropy of the magnetic sheet pieces 120GB is along the Y axis direction. The second groups GB are arranged in the middle position of the magnetic sheet 110 in the X axis direction.

The third groups GC shown in FIG. 19 each comprise three magnetic sheet pieces 120GCa, 120GCb, and 120GCc (shown in the lower right of FIG. 19).

The magnetic sheet piece 120GCb has the same structure as the magnetic sheet piece 120GA, but is arranged in a different direction.

The magnetic sheet piece 120GCa is formed into a shape to fill a space between the magnetic sheet piece 120GA and the magnetic sheet piece 120GCb and is arranged so that its direction of anisotropy extends in an intermediate direction between the direction of anisotropy of the adjacent magnetic sheet piece 120GA and the direction of anisotropy of the adjacent magnetic sheet piece 120GCb. Note that the magnetic sheet piece 120GCa has a triangular pointed portion, and the angle thereof is 45°, and the magnetic sheet piece 120GCa has a triangular shape as a whole.

The magnetic sheet piece 120GCc is formed into a shape to fill a space between the magnetic sheet piece 120GB and the magnetic sheet piece 120GCb so that its direction of anisotropy extends in an intermediate direction between the direction of anisotropy of the adjacent magnetic sheet piece 120GB and the direction of anisotropy of the adjacent magnetic sheet piece 120GCb. This magnetic sheet piece 120GCc has the same structure as the magnetic sheet piece 120GCa, but is arranged in a different direction.

In the magnetic sheet piece 120GCa and the magnetic sheet piece 120Gc, nanocrystalline alloy ribbons are laminated in five layers through the adhesive layers. The cracks 21 are formed in a state where the nanocrystalline alloy ribbon is adhered to the adhesive layer, and the nanocrystalline alloy ribbon is divided into the small pieces 22. The number of layers of the nanocrystalline alloy ribbon may be more than five.

The four third groups GC are arranged in the four corners of the magnetic sheet 110. In other words, the four third groups GC are arranged at four positions each adjacent to the first group GA and the second group GB. The magnetic sheet pieces 120GCa, 120GCb, and 120GCc in the four third groups GC are arranged so that each direction of anisotropy is oriented to the center of the magnetic sheet 110.

Each of the four third groups GC has three different directions of anisotropy. In other words, the direction of anisotropy of each of the magnetic sheet pieces 120GCa, 120GCb and 120GCc included in the third group GC is different from each other, resulting in three different directions of anisotropy. These three different directions of anisotropy are different from the first axial direction AX1 and the second axial direction AX2.

In the magnetic sheet 110 shown in FIG. 19, the magnetic sheet pieces 120GA, 120GB, and 120GCb have the same structure. The magnetic sheet 110 has a structure in which these eight magnetic sheet pieces 120GA, 120GB, and 120GCb are radially arranged with the eight magnetic sheet pieces 120GCa, 120GCc interposed therebetween.

In FIG. 19, a center portion of the magnetic sheet 110 may be configured as a hole. In this case, the size of the hole should be smaller than the inner diameter of the coil.

Figure 20:
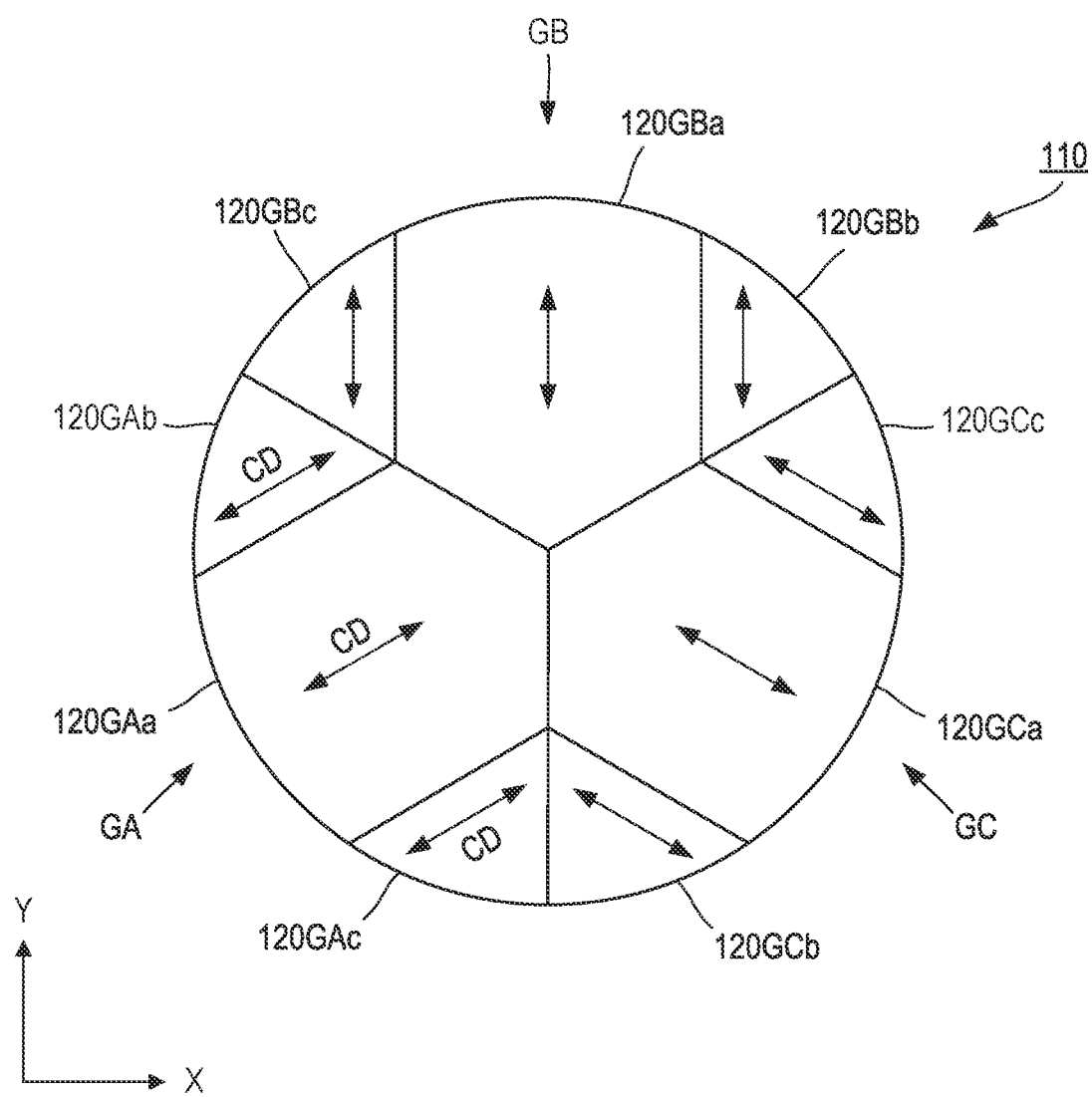
FIG. 20 illustrates another configuration of the magnetic sheet.

FIG. 20 illustrates another configuration of the magnetic sheet 110.

As shown in FIG. 20, the magnetic sheet 110 may comprise one first group GA, one second groups GB, and one third group GC.

The first group GA shown in FIG. 20 is configured to form, as a whole, one-third of a circle and comprises magnetic sheet pieces 120GAa, 120GAb, and 120GAc. The magnetic sheet piece 120GAa is arranged between the magnetic sheet pieces 120GAb and 120GAc. The magnetic sheet piece 120GAa has a pentagonal shape with a circular arc on one side. The magnetic sheet pieces 120GAb, 120GAc each have a triangular shape with a circular arc on one side.

These magnetic sheet pieces 120GAa, 120GAb, and 120GAc have direction of anisotropy (direction same as the casting direction CD) shown in FIG. 20. The magnetic sheet pieces 120GAa, 120GAb, and 120GAc are arranged so that each direction of anisotropy is oriented in the same direction. The direction of anisotropy of each of the magnetic sheet pieces 120GAa, 120GAb, and 120GAc in FIG. 20 are inclined at 30° to the X axis direction.

In the magnetic sheet pieces 120GAa, 120GAb, and 120GAc, the nanocrystalline alloy ribbons are laminated in five layers through the adhesive layers. The cracks 21 are formed in a state where the nanocrystalline alloy ribbon is adhered to the adhesive layer, and the nanocrystalline alloy ribbon is divided into the small pieces 22. The number of layers of the nanocrystalline alloy ribbon may be more than five.

The second group GB shown in FIG. 20 comprises magnetic sheet pieces 120GBa, 120GBb, and 120GBc. The magnetic sheet pieces 120GBa, 120GBb, and 120GBc constituting the second group GB have the same structure as the magnetic sheet pieces 120GAa, 120GAb, and 120GAc constituting the first group GA.

The magnetic sheet pieces 120GBa, 120GBb, and 120GBc constituting the second group GB are different from the magnetic sheet pieces 120GAa, 120GAb, and 120GAc constituting the first group GA only in that the magnetic sheet pieces 120GBa, 120GBb, and 120GBc are arranged so that the direction of anisotropy (direction same as the casting direction CD) is along the Y axis direction.

The third group GC shown in FIG. 20 comprises magnetic sheet pieces 120GCa, 120GCb, and 120GCc. The magnetic sheet pieces 120GCa, 120GCb, and 120GCc constituting the third group GC have the same structure as the magnetic sheet pieces 120GAa, 120GAb, and 120GAc constituting the first group GA.

The magnetic sheet pieces 120GCa, 120GCb, and 120GCc constituting the third group GC are different from the magnetic sheet pieces 120GAa, 120GAb, and 120GAc constituting the first group GA only in that the magnetic sheet pieces 120GCa, 120GCb, and 120GCc are arranged so that the direction of anisotropy (direction same as the casting direction CD) is inclined at −30° to the X axis direction.

In the magnetic sheet 110 shown in FIG. 20, when the direction of anisotropy of the first group GA is defined as first axial direction AX1 and the direction of anisotropy of the second group GB is defined as a second axial direction AX2, there is a relation that the second axial direction AX2 intersects the first axial direction AX1. In addition, the direction of anisotropy of the third group GC is different from both the first axial direction AX1 and the second axial direction AX2.

In the structure of this magnetic sheet 110, the direction of anisotropy is also configured to be along the radial direction of the magnetic flux. The difference between the direction of the magnetic flux and the direction of anisotropy is 60° or less.

In FIG. 20, a center portion of the magnetic sheet 110 may be configured as a hole. In this case, the size of the hole should be smaller than the inner diameter of the coil.

In the present disclosure, when the magnetic sheet pieces are arranged next to and adjacent to each other, the magnetic sheet pieces may be arranged so as to overlap, abut, and/or be separated from each other.

When the magnetic ribbons 20 are arranged next to and adjacent to each other, the magnetic ribbons 20 may be arranged so as to overlap, abut, and/or be separated from each other.

The first group GA, the second group GB, and the third group GC are arranged next to each other and configured as one layer. This layer may be laminated on top of another layer to form multiple layers. In that case, the direction of anisotropy may be the same or different between the upper and the lower layers, as long as the direction of anisotropy in one layer is configured to follow the direction of the radial magnetic path.

The magnetic sheets 110 of the present disclosure are formed of multiple layers of the magnetic ribbon 20. The number of layers of the magnetic ribbon 20 can be set as necessary. For example, the number of layers of the magnetic ribbon in the magnetic sheet 110 is 30 to 200. The number of layers may be less than 30 and more than 200.

When laminating the magnetic ribbons 20, it is preferable to firstly produce a magnetic sheet piece comprising layered magnetic ribbons, and then stack the magnetic sheet pieces on top of each other. Stacking the magnetic sheet pieces having the layered magnetic ribbons 20 is more effective than repeatedly laminating a single layer of the magnetic ribbon 20.

When stacking the magnetic sheet pieces, it is preferable to shift the stacking position so that the magnetic gap is not continuous in the lamination direction LD when seen from the lamination direction LD. Here, the magnetic gap is a gap between the magnetic ribbons.

Next, a manufacturing method of the magnetic sheets 110 of the embodiments will be described with reference to FIG. 21 to FIG. 27. First, a description will be given of manufacturing methods of magnetic sheet pieces 120S constituting the magnetic sheets 110, the magnetic sheet pieces 120GA, the magnetic sheet pieces 120GB and the magnetic sheet pieces 120GC.

Figure 21:
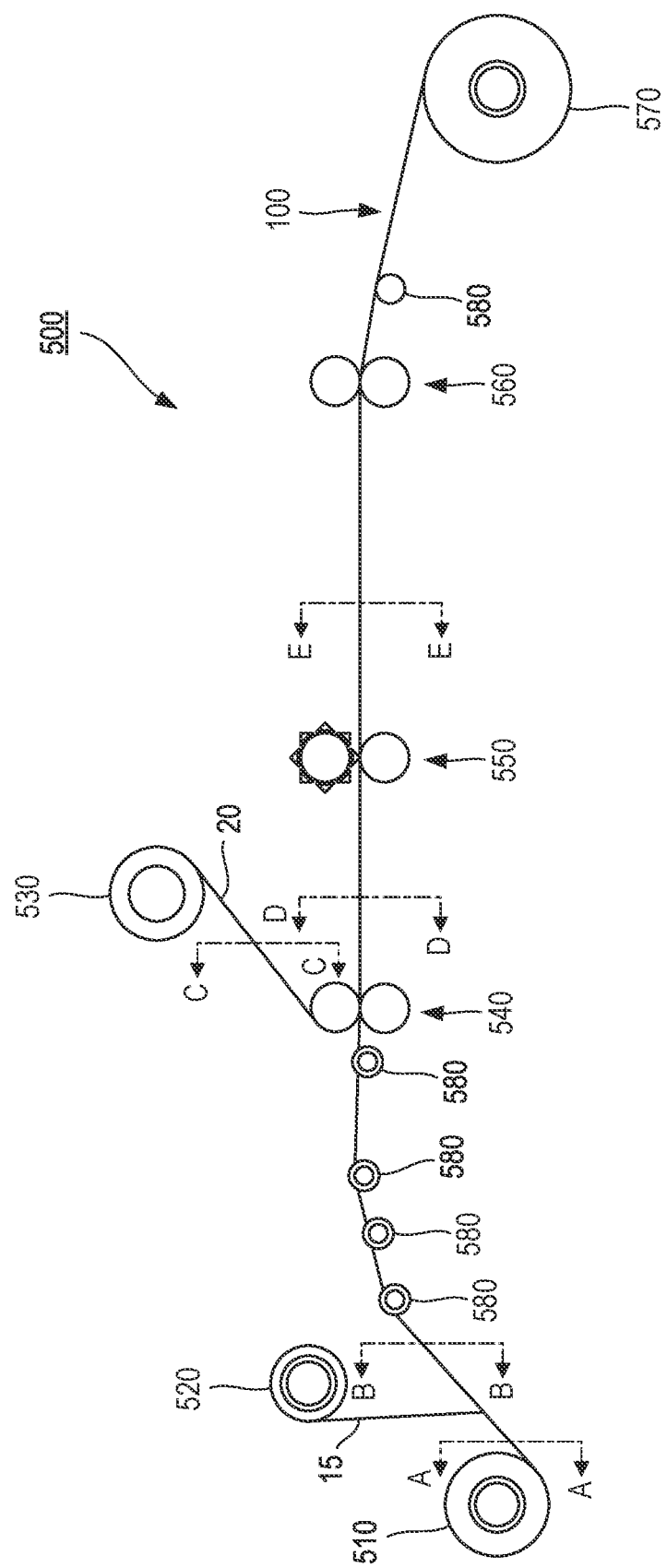
FIG. 21 is a schematic view illustrating a manufacturing method of the magnetic sheet piece.

FIG. 21 is a schematic view illustrating an example of a manufacturing method of a magnetic sheet piece 120S.

The magnetic sheet piece 120S is a magnetic sheet constituting the magnetic sheets 110, the magnetic sheet pieces 120GA, the magnetic sheet pieces 120GB and the magnetic sheet pieces 120GC. The magnetic sheet piece 120S is manufactured using a manufacturing apparatus 500 shown in FIG. 21. The manufacturing apparatus 500 comprises a first unwinding roll 510, a first winding roll 520, a second unwinding roll 530, an attaching roll 540, a crack roll 550, a flattening roll 560, and a third winding roll 570 as main components from an upstream side to a downstream side in the manufacturing process. The manufacturing apparatus 500 may further comprise multiple guide rolls 580. Note that the guide rolls 580 can be arranged as necessary even at a position not illustrated.

Figure 22:
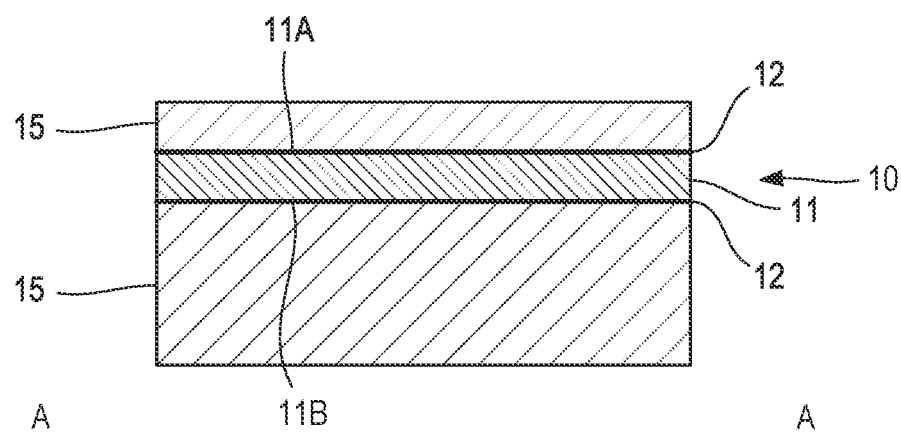
FIG. 22 is a cross-sectional view illustrating a configuration of a laminated body supplied from a first unwinding roll.

FIG. 22 is a cross-sectional view illustrating a configuration of a laminated body supplied from the first unwinding roll 510.

As shown in FIG. 22, the laminated body with a resin sheet 15 laminated on each of the first surface 11A and the second surface 11B of the adhesive layer 10 is wound around the first unwinding roll 510. The resin sheet 15 arranged on the first surface 11A is a protective sheet and the resin sheet 15 arranged on the second surface 11B is also referred to as a "liner". The resin sheet 15 arranged on the first surface 11A is a sheet thinner than the resin sheet 15 arranged on the second surface 11B.

Figure 23:
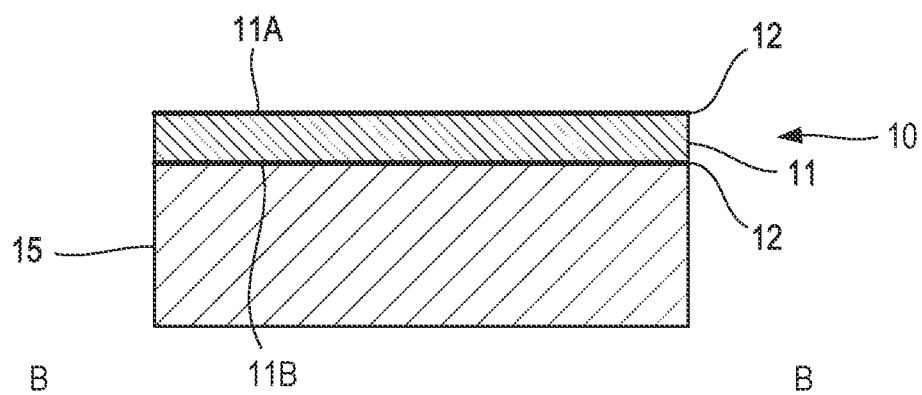
FIG. 23 is a cross-sectional view illustrating a configuration of the laminated body which is supplied from the first unwinding roll and from which the resin sheet has been peeled off.

FIG. 23 is a cross-sectional view illustrating a configuration of the laminated body which is supplied from the first unwinding roll 510 and from which the resin sheet 15 has been peeled off.

The resin sheet 15 arranged on the first surface 11A is peeled from the laminated body unwound from the first unwinding roll 510 as shown in FIG. 23. As shown in FIG. 21, the peeled resin sheet 15 is wound around the first winding roll 520.

Figure 24:
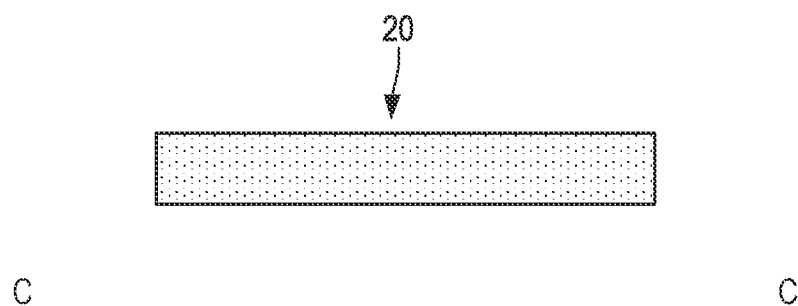
FIG. 24 is a cross-sectional view illustrating a configuration of the magnetic ribbon supplied from a second unwinding roll.

FIG. 24 is a cross-sectional view illustrating a configuration of a magnetic ribbon 20 supplied from the second unwinding roll 530.

The laminated body, from which the resin sheet 15 arranged on the first surface 11A has been peeled off, is guided to the attaching rolls 540 by the multiple guide rolls 580. The magnetic ribbon 20 unwound from the second unwinding roll 530 is further guided to the attaching rolls 540. As shown in FIG. 24, there is no crack 21 formed in the magnetic ribbon 20 guided to the attaching rolls 540.

Here, a manufacturing method of the magnetic ribbon 20 unwound from the second unwinding roll 530 will be described. For example, a case where the magnetic ribbon 20 is a nanocrystalline alloy will be described. The magnetic ribbon 20 is manufactured by a manufacturing method comprising: a step of rapidly cooling a molten alloy to obtain an amorphous alloy ribbon capable of nanocrystallization; and a heat treatment step of heat-treating the amorphous alloy ribbon at a temperature equal to or higher than a crystallization onset temperature to form fine crystal grains.

The rapid cooling described above is performed by a single roll method in which a molten metal is discharged onto a rotating cooling roll and rapidly cooled and solidified. The magnetic ribbon 20 has an elongated shape in which a direction along a rotation direction of the cooling roll is a longitudinal direction. The length of the magnetic ribbon 20 in the longitudinal direction may be, for example, 20,000 m.

The temperature of the heat treatment varies depending on the alloy composition, but it is generally 450° C. or higher. The fine crystal grains are, for example, Fe having a body-centered cubic lattice structure with solid solution of Si or the like. The analysis of this fine crystal grain can be performed using X-ray diffraction and a transmission electron microscope.

In the nanocrystalline alloy, at least 50 vol % of the nanocrystalline alloy is occupied by fine crystal grains having an average grain size of 100 nm or less, measured in the largest dimension. A portion except for the fine crystal grains in the nanocrystalline alloy is mainly amorphous. A proportion of the fine crystal grains may be substantially 100 vol %.

Figure 25:
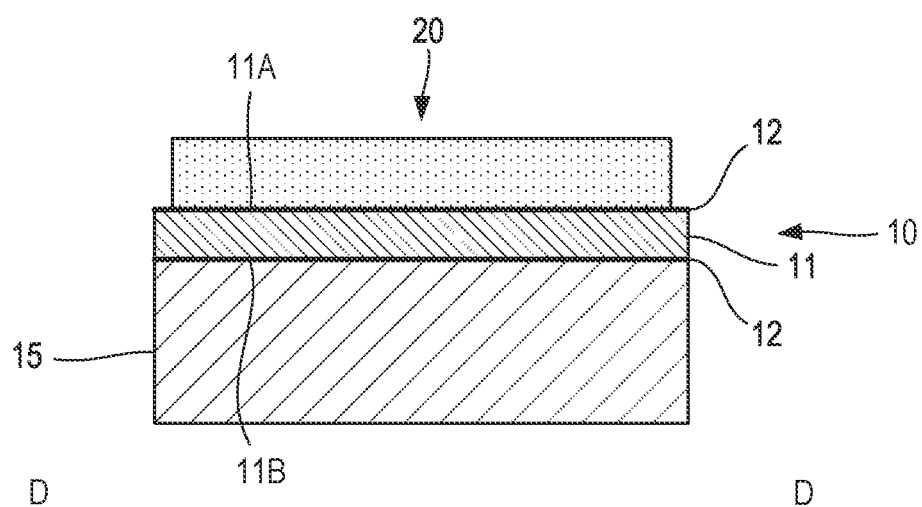
FIG. 25 is a cross-sectional view illustrating a state in which a magnetic ribbon is adhered to an adhesive layer by attaching rolls.

FIG. 25 is a cross-sectional view illustrating a state in which the magnetic ribbon 20 is adhered to the adhesive layer 10 by the attaching rolls 540.

As shown in FIG. 21, the attaching rolls 540 press and adhere the magnetic ribbon 20 to the laminated body from which the resin sheet 15 has been peeled off. Specifically, the laminated body and the magnetic ribbon 20 are guided between two rolls arranged to face each other, and the magnetic ribbon 20 is pressed and adhered on to the first surface 11A of the adhesive layer 10 using the two rolls as shown in FIG. 25.

As shown in FIG. 21, the laminated body to which the magnetic ribbon 20 is adhered is guided from the attaching rolls 540 to the crack rolls 550.

Figure 26:
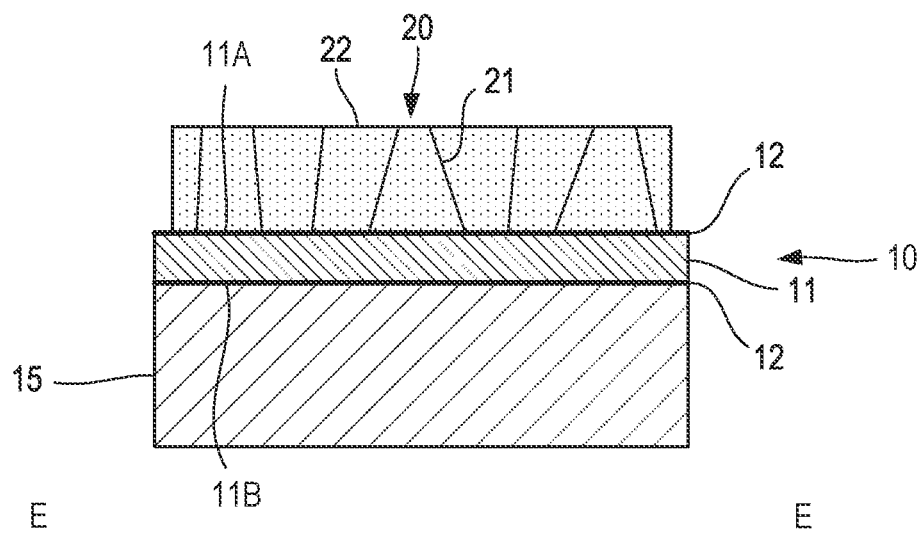
FIG. 26 is a cross-sectional view illustrating a state in which cracks are formed in the magnetic ribbon by crack rolls.

FIG. 26 is a cross-sectional view illustrating a state in which cracks 21 are formed in the magnetic ribbon 20 by the crack rolls 550.

The crack rolls 550 form the cracks 21 in the magnetic ribbon 20 adhered to the adhesive layer 10. Specifically, the laminated body to which the magnetic ribbon 20 is adhered is guided between two rolls arranged to face each other, and a roll provided with protrusions among the two rolls is pressed against the magnetic ribbon 20 to form the cracks 21 as shown in FIG. 26.

Among the two rolls, the roll without protrusion is arranged on a side of the laminated body from which the resin sheet 15 has been peeled off. The magnetic ribbon 20 in which the cracks 21 are formed comprises multiple small pieces 22. The multiple small pieces 22 are adhered to the adhesive layer 10.

Here, a configuration of the crack rolls 550 will be described. The crack rolls 550 comprise a roll in which multiple convex members are arranged on a peripheral surface. A tip end of each convex member of the crack rolls 550 may be flat, conical, inverted conical with a recessed center, or cylindrical. The multiple convex members may be arranged regularly or irregularly.

The elongated magnetic ribbon 20 is pressed against the crack rolls 550 or the elongated magnetic ribbon 20 is caused to pass between the two crack rolls 550 to continuously form the cracks 21 in the magnetic ribbon 20. Furthermore, the convex members of the crack rolls 550 are pressed against multiple places on the surface of the magnetic ribbon 20 to form multiple cracks 21 in the magnetic ribbon 20.

In the formation of the cracks 21 using the crack rolls 550, it is preferable to further form cracks connecting the multiple cracks 21 in a mesh shape. Specifically, it is preferable to include a step of pressing the crack rolls 550 against the magnetic ribbon 20 to form multiple cracks 21 and then forming cracks connecting the multiple cracks 21 in a mesh shape.

For example, after an external force is directly applied to the magnetic ribbon 20 by using the crack rolls 550 to form the cracks 21, a second external force may be applied by means such as bending or winding the magnetic ribbon 20 to form cracks connecting the multiple cracks 21 in a mesh shape. Cracks connecting the cracks 21 (magnetic gaps connecting the cracks) are formed using the cracks 21 as starting points of brittle fracture and/or crack fracture.

In the step of forming the cracks 21 connecting the multiple cracks 21 in a mesh shape, the second external force as described above does not necessarily have to be applied. When the second external force is not applied, the cracks 21 connecting the multiple cracks 21 in a mesh shape are formed in the process of forming the multiple cracks 21.

The laminated body 100 guided from the crack rolls 550 to the flattening rolls 560 is subjected to flattening treatment by the flattening rolls 560. Note that the flattening rolls 560 are also referred to as shaping rolls.

Specifically, the laminated body is guided between two rolls of the flattening rolls 560 arranged to face each other, and the laminated body is sandwiched and pressed by the two rolls. As a result, the surface of the magnetic ribbon 20 in which the cracks 21 are formed is flattened.

The laminated body 100 after the flattening treatment is guided to the third winding roll 570 via the guide roll 580. The laminated body 100 is wound around the third winding roll 570.

This laminated body 100 comprises one layer of the magnetic ribbon, the adhesive layer 10, and the resin sheet 15 and can be use as the magnetic sheet piece 120S. This laminated body may be used to form a magnetic sheet piece 120S of other configurations.

By peeling off the resin sheet 15, the magnetic ribbon 20 can be laminated or attached to other components. It is also possible to machine the shape of the magnetic ribbon 20 first, and then laminate or adhere it to other components.

Figure 27:
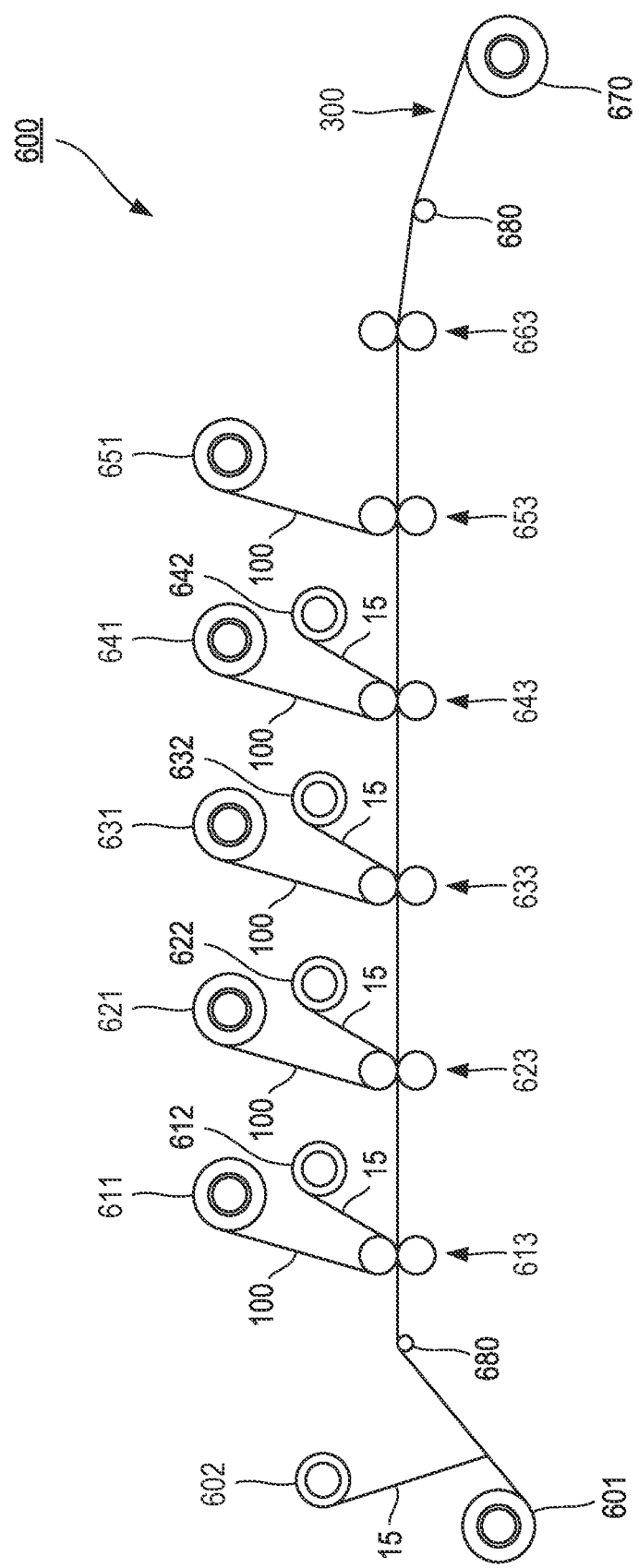
FIG. 27 is a schematic view illustrating a manufacturing method of the magnetic sheet piece.

FIG. 27 is a schematic view illustrating another example of a manufacturing method of a magnetic sheet piece 120S.

The magnetic sheet piece 120S is manufactured using a manufacturing apparatus 600 shown in FIG. 27. FIG. 27 shows the manufacturing apparatus 600 for manufacturing the magnetic sheet piece 120S including five layers of the magnetic ribbon 20.

The manufacturing apparatus 600 mainly comprises, from upstream to downstream in the manufacturing process, a supply roll 601, a resin sheet winding roll 602, a first magnetic sheet unwinding roll 611, a first winding roll 612, a first attaching roll 613, a second magnetic sheet unwinding roll 621, a second winding roll 622, a second attaching roll 623, a third magnetic sheet unwinding roll 631, a third winding roll 632, a third attaching roll 633, a fourth magnetic sheet unwinding roll 641, a fourth winding roll 642, a fourth attaching roll 643, a fifth magnetic sheet unwinding roll 651, a fifth attaching roll 653, a flattening rolls 663, a laminated base body winding roll 670. The manufacturing apparatus 600 may further comprise multiple guide rolls 680. Note that the guide roll 680 can be arranged as necessary even at a position not illustrated.

The manufacturing apparatus 600 may manufacture a magnetic sheet piece 120S having two or more and 20 or less layers of the magnetic ribbon 20. In this case, the number of the above-described first magnetic sheet unwinding roll 611, etc. is changed according to the number of magnetic ribbons 20. The magnetic ribbon unwound from the unwinding roll 611, etc. may be a multilayered magnetic ribbon. Note that the number of layers of the magnetic ribbon 20 included in the magnetic sheet piece 120S to be produced can be determined as appropriate.

However, at the time of winding the magnetic sheet piece 120S, if a large number of magnetic ribbons 20 are laminated in layers, the winding may become difficult, and/or shape defects may occur during the winding of the magnetic sheet piece 120S. Therefore, when the magnetic sheet piece 120S is wound, the number of layers is preferably 15 or less, and more preferably, ten or less. The number of layers of the magnetic ribbons 20 is preferably two or more, three or more, and four or more. Although it is also possible to manufacture a magnetic sheet piece 120S having more than 20 layers, the number of layers is preferably 20 or less because the equipment becomes too large.

As shown in FIG. 22, a laminated body with a resin sheet 15 laminated on each of the first surface 11A and the second surface 11B of the adhesive layer 10 is wound around the supply roll 601.

The resin sheet 15 arranged on the first surface 11A is peeled from the laminated body unwound from the unwinding roll 601 as shown in FIG. 23. The peeled resin sheet 15 is wound around the resin sheet winding roll 602 as shown in FIG. 27.

The laminated body, from which the resin sheet 15 arranged on the first surface 11A has been peeled off, is guided to the first attaching roll 613 by the guide rolls 680. To the first attaching roll 613, a laminated body 100 (the laminated body 100 manufactured in FIG. 21) additionally unwound from the first magnetic sheet unwinding roll 611 is guided.

The first attaching roll 613 presses and adheres the additional laminated body 100 on to the laminated body from which the resin sheet 15 is peeled off. Specifically, the laminated body and the additional laminated body 100 are guided between two rolls arranged to face each other, and the magnetic ribbon 20 of the additional laminated body 100 is pressed and adhered on to the first surface 11A of the adhesive layer 10 using the two rolls.

The resin sheet 15 of the laminated body 100 adhered by the first attaching roll 613 is peeled off from the laminated body and wound around the first winding roll 612. The laminated body after the resin sheet 15 has been wound around the first winding roll 612 is guided to the second attaching roll 623. To the second attaching roll 623, a laminated body 100 additionally unwound from the second magnetic sheet unwinding roll 621 is guided.

The second attaching roll 623 presses and adheres the additional laminated body 100 onto the laminated body guided from the first attaching roll 613. Here, a magnetic ribbon 20 of the additional laminated body 100 is pressed and adhered onto the laminated body guided from the first attaching roll 613.

The resin sheet 15 of the laminated body 100 adhered by the second attaching roll 623 is peeled off from the laminated body and wound around the second winding roll 622.

The laminated body after the resin sheet 15 has been wound around the second winding roll 622 is guided to the third attaching roll 633. To the third attaching roll 633, a laminated body 100 additionally unwound from the third magnetic sheet unwinding roll 631 is guided.

The third attaching roll 633 presses and adheres the additional laminated body 100 onto the laminated body guided from the second attaching roll 623. Here, a magnetic ribbon 20 of the additional laminated body 100 is pressed and adhered onto the laminated body guided from the second attaching roll 623.

The resin sheet 15 of the laminated body 100 adhered by the third attaching roll 633 is peeled off from the laminated body and wound around the third winding roll 632.

The laminated body after the resin sheet 15 has been wound around the third winding roll 632 is guided to the fourth attaching roll 643. To the fourth attaching roll 643, a laminated body 100 additionally unwound from the fourth magnetic sheet unwinding roll 641 is guided.

The fourth attaching roll 643 presses and adheres the additional laminated body 100 onto the laminated body guided from the third attaching roll 633. Here, a magnetic ribbon 20 of the additional laminated body 100 is pressed and adhered onto the laminated body guided from the third attaching roll 633.

The resin sheet 15 of the laminated body 100 adhered by the fourth attaching roll 643 is peeled off from the laminated body and wound around the fourth winding roll 642.

The laminated body after the resin sheet 15 has been wound around the fourth winding roll 642 is guided to the fifth attaching roll 653. To the fifth attaching roll 653, a laminated body 100 additionally unwound from the fifth magnetic sheet unwinding roll 651 is guided.

The fifth attaching roll 653 presses and adheres the additional laminated body 100 onto the laminated body guided from the fourth attaching roll 643. Here, a magnetic ribbon 20 of the additional laminated body 100 is pressed and adhered onto the laminated body guided from the fourth attaching roll 643.

The laminated body guided from the fifth attaching roll 653 to the flattening rolls 663 is subjected to flattening treatment by the flattening rolls 663.

The laminated body after the flattening treatment is guided to the laminated base body winding roll 670 via the guide roll 680. The laminated body 300 is wound around the laminated base body winding roll 670.

In addition to the method in which the laminated body 300 is wound around the laminated base body winding roll 670, the laminated body 300 may be cut to a predetermined length.

The laminated body 300 produced by the manufacturing apparatus 600 is cut as shown in FIG. 2A and formed into the first group GA and the second group GB as shown in FIG. 2B. The laminated body 300 is also cut as shown in FIG. 3A, and formed into the third group GC as shown in FIG. 3B.

The laminated bodies 300 may be arranged and integrally formed first, and then processed into the shapes of FIG. 2B and FIG. 3B. An additional laminated body 300 may be laminated on top of the laminated body 300 and then processed into the shapes of FIG. 2B and FIG. 3B.

Next, the characteristics of the magnetic sheets 110 of the above configurations will be described with reference to FIG. 1.

When a current flows in the coil 200, the magnetic flux is generated around the coil 200. At the center of the rectangular coil 200, the magnetic flux flows in a direction perpendicular to the page of FIG. 1. For example, the current flows from the coil 200 toward the magnetic sheet 110.

The magnetic flux passing through the center of the coil 200 flows inside the magnetic sheet 110 toward the outside of the coil 200. In other words, the magnetic flux flows radially inside the magnetic sheet 110 from the central portion (corresponding to the center of the coil 200) toward the outside.

In the magnetic sheet 110 that serves as a magnetic path, two first groups GA, two second groups GB and four third groups GC are arranged. The two first groups GA are arranged so that the casting direction CD (direction of anisotropy) is along the X axis direction to follow the direction of the magnetic flux flowing radially from the central portion toward the outside. The two second group GB are arranged so that the casting direction CD (direction of anisotropy) is along the Y axis direction to follow the direction of the magnetic flux flowing radially from the central portion toward the outside.

The four third groups GC are arranged so that the casting direction CD (direction of anisotropy) is oriented toward the center, thereby being arranged so as to follow the direction of the magnetic flux flowing radially from the center toward the outside.

The first groups GA, the second groups GB, and the third groups GC are arranged so that the casting direction CD (direction of anisotropy) extends radially from the center to the outside, allowing the direction of anisotropy of the magnetic sheet pieces to be consistent with the direction of the magnetic flux radially flowing from the center to the outside, whereby the Q2 value of the magnetic sheet 110 increases. That is, it becomes easier to exhibit the effect of electromagnetic shielding by the nanocrystalline alloy ribbons constituting the magnetic sheet 110. Even for use with the rectangular coil 200, it becomes easier to suppress the reduction of the electromagnetic shielding properties of the magnetic sheet 110, and improve the characteristics (Q1 value) of the coil.

Next, an evaluation of the characteristics in magnetic sheets 110 in accordance with the above configurations will be described with reference to FIG. 28 to FIG. 35. The evaluation is performed using Example 1, Example 2, Comparative Example 1, and Comparative Example 2.

Figure 28:
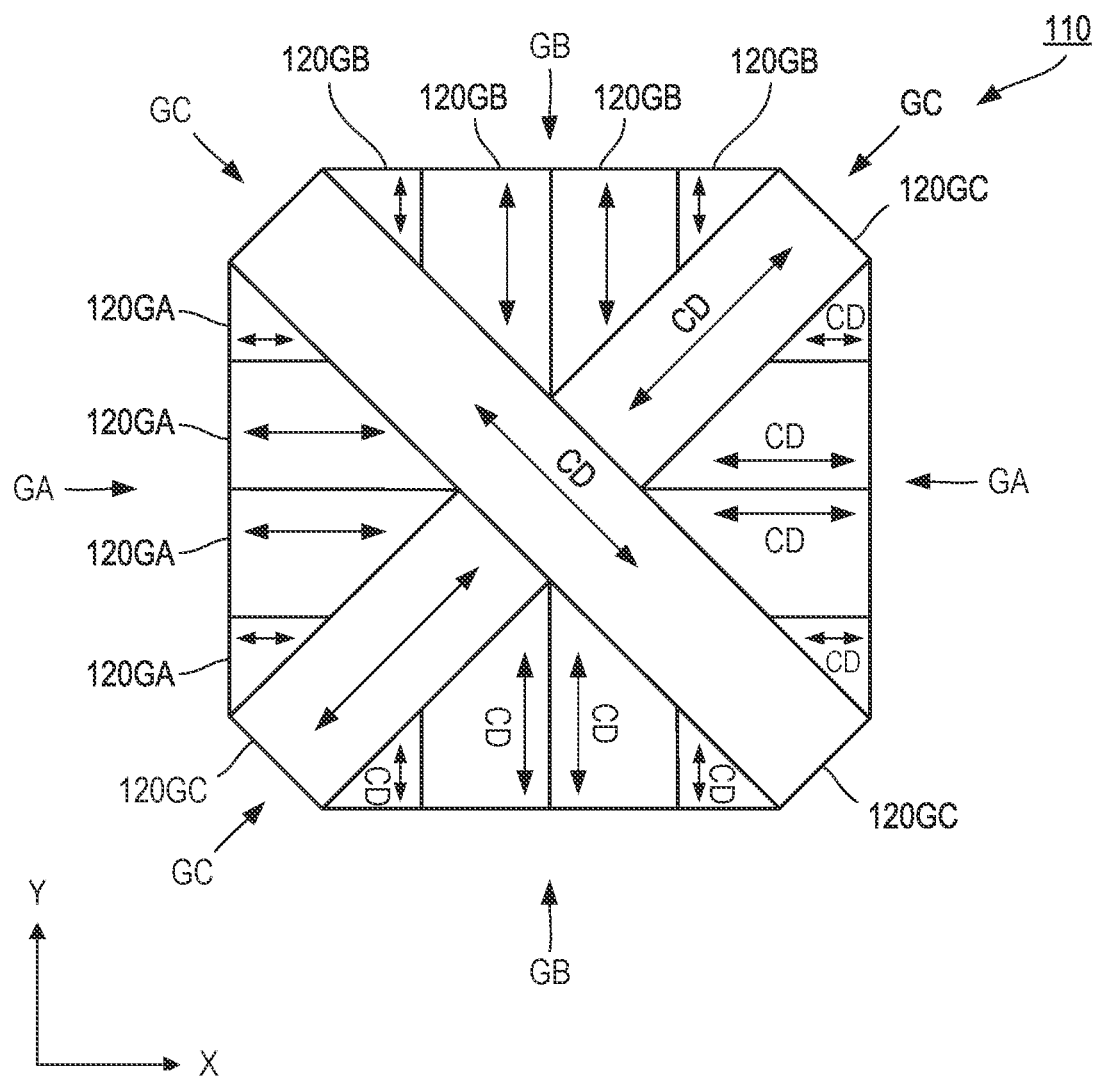
FIG. 28 illustrates a configuration of a magnetic sheet of Example 1.
Figure 29:
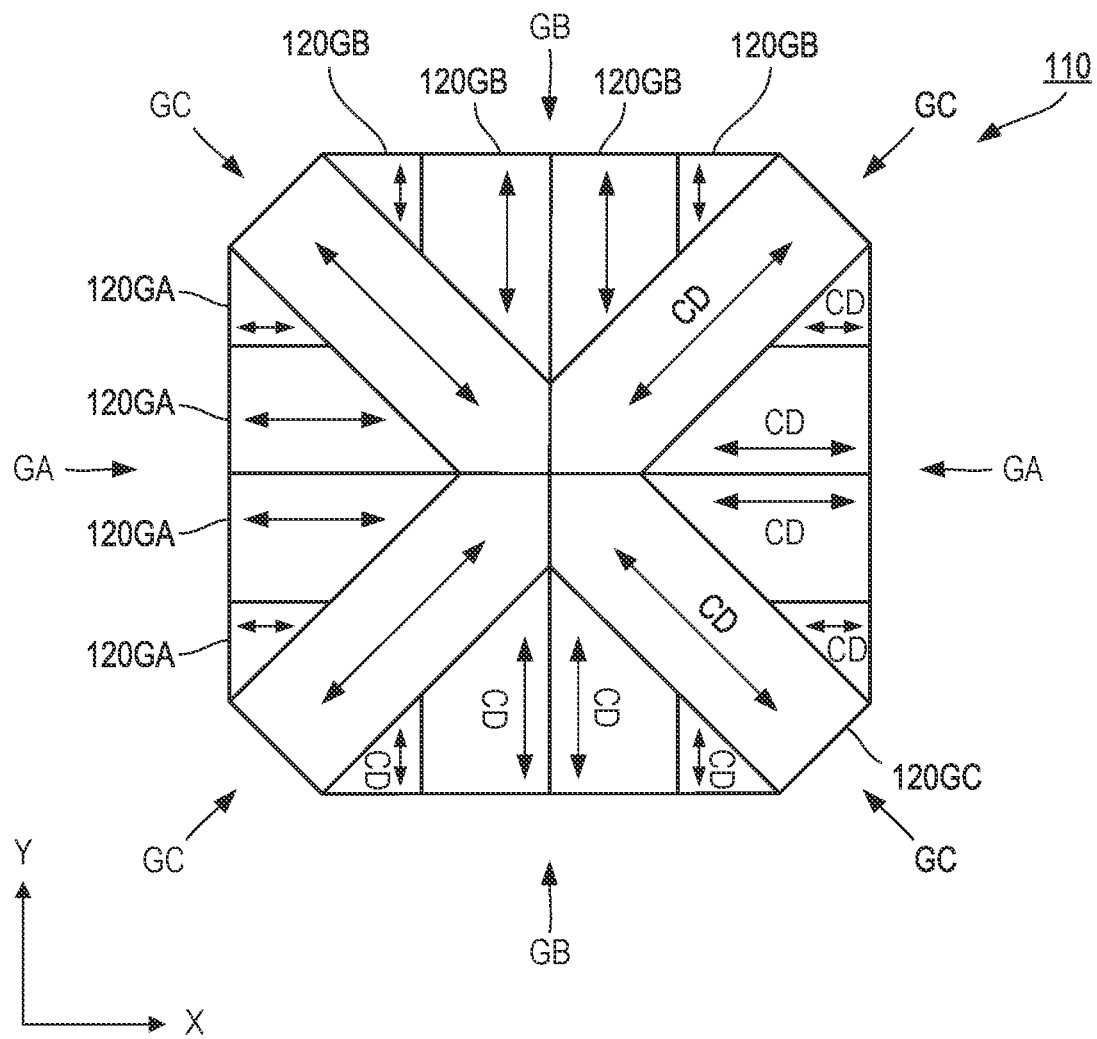
FIG. 29 illustrates a configuration of a magnetic sheet of Example 2.
Figure 30:
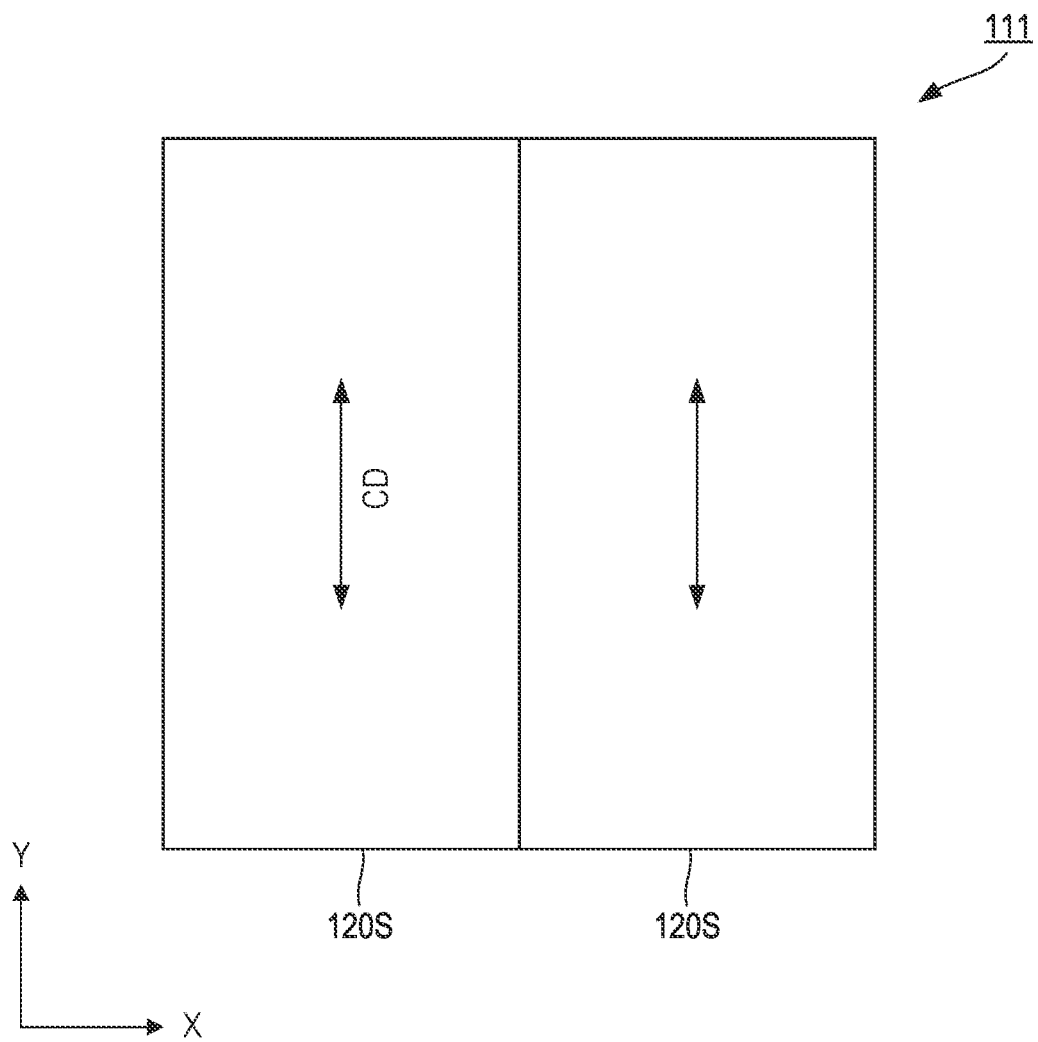
FIG. 30 illustrates a configuration of a magnetic sheet of Comparative Example 1.
Figure 31:
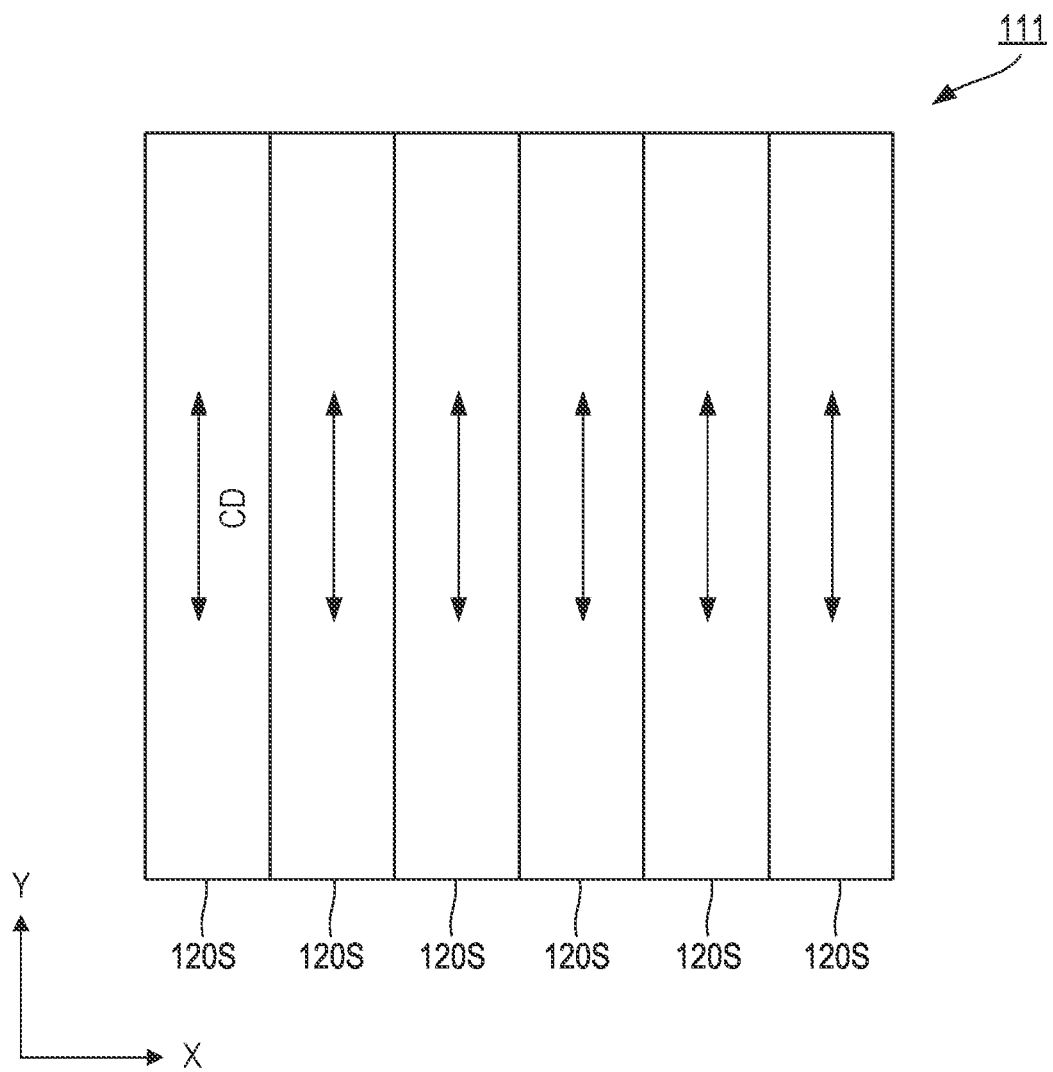
FIG. 31 illustrates a configuration of a magnetic sheet of Comparative Example 2.

FIG. 28 illustrates a configuration of a magnetic sheet 110 of Example 1. FIG. 29 illustrates a configuration of a magnetic sheet 110 of Example 2. FIG. 30 illustrates a configuration of a magnetic sheet 111 of Comparative Example 1. FIG. 31 illustrates a configuration of a magnetic sheet 111 of Comparative Example 2.

As shown in FIG. 28, the magnetic sheet 110 of Example 1 is a rectangular sheet comprising two first groups GA, two second groups GB, and three third groups GC. The dimensions of the magnetic sheet 110 of the Example 1 are 60 mm in the X axis direction and 60 mm in the Y axis direction.

The first group GA has a triangular outer shape in which four magnetic sheet pieces 120GA are arranged next to each other in the width direction. The two first groups GA are arranged next to each other in the middle of the magnetic sheet 110 in the Y axis direction, spaced apart in the X axis direction. The longitudinal direction (direction of anisotropy) of the magnetic sheet pieces 120GA in the first groups GA, i.e., the casting direction CD is along the X axis direction.

The second group GB has a triangular outer shape in which four magnetic sheet pieces 120GB are arranged next to each other in the width direction. The two second groups GB are arranged next to each other in the middle of the magnetic sheet 110 in the X axis direction, spaced apart in the Y axis direction. The longitudinal direction (direction of anisotropy) of the magnetic sheet pieces 120GB in the second groups GB, i.e., the casting direction CD is along the Y axis direction.

The third group GC has a rectangular outer shape formed of one magnetic sheet piece 120GC. Among the three third groups GC, one is arranged on one diagonal line of the magnetic sheet 110. The other two are arranged on the other diagonal line with a space therebetween. The longitudinal direction (direction of anisotropy) of the magnetic sheet pieces 120GC in the third group GC, i.e., the casting direction CD is along the diagonal direction of the magnetic sheet 110.

As shown in FIG. 29, the magnetic sheet 110 of Example 2 is a rectangular sheet comprising two first groups GA, two second groups GB, and four third groups GC. The dimensions of the magnetic sheet 110 of the Example 2 are 60 mm in the X axis direction and 60 mm in the Y axis direction.

The first group GA has a triangular outer shape in which four magnetic sheet pieces 120GA are arranged next to each other in the width direction. The two first groups GA are arranged next to each other in the middle of the magnetic sheet 110 in the Y axis direction, spaced apart in the X axis direction. The longitudinal direction (direction of anisotropy) of the magnetic sheet pieces 120GA in first groups GA, i.e., the casting direction CD is along the X axis direction.

The second group GB has a triangular outer shape in which four magnetic sheet pieces 120GB are arranged next to each other in the width direction. The two second groups GB are arranged next to each other in the middle of the magnetic sheet 110 in the X axis direction, spaced apart in the Y axis direction. The longitudinal direction (direction of anisotropy) of the magnetic sheet pieces 120GB in the second group GB, i.e., the casting direction CD is along the Y axis direction.

The third group GC has an elongated outer shape formed by one magnetic sheet piece 120GC. Among the four third groups GC, two are arranged adjacent to each other on one diagonal line of the magnetic sheet 110. The remaining two are arranged adjacent to each other on the other diagonal line. The longitudinal direction (direction of anisotropy) of the magnetic sheet pieces 120GC in the third group GC, i.e., the casting direction CD is along the diagonal direction of the magnetic sheet 110.

A magnetic sheet 111 of Comparative Example 1 is a sheet comprising two rectangular magnetic sheet pieces 120S arranged in parallel, as shown in FIG. 30. The magnetic sheet piece 120S constituting the magnetic sheet 111 of Comparative Example 2 has a length of 60 mm in the longitudinal direction and a length of 30 mm in the width direction.

A magnetic sheet 111 of Comparative Example 2 is a sheet comprising six rectangular magnetic sheet pieces 120S arranged in parallel, as shown in FIG. 31. The magnetic sheet piece 120S constituting the magnetic sheet 111 of Comparative Example 2 has a length of 60 mm in the longitudinal direction and a length of 10 mm in the width direction.

Note that the direction of anisotropy in Comparative Example 1 and Comparative Example 2 is along the Y axis direction.

Examples 1, 2 and Comparative Examples 1, 2 of FIG. 28 to FIG. 31 each comprise a configuration in which the magnetic ribbons 20 are laminated in 25 layers. Note that the adhesive layer 10 is arranged between the magnetic ribbons 20.

Figure 32:
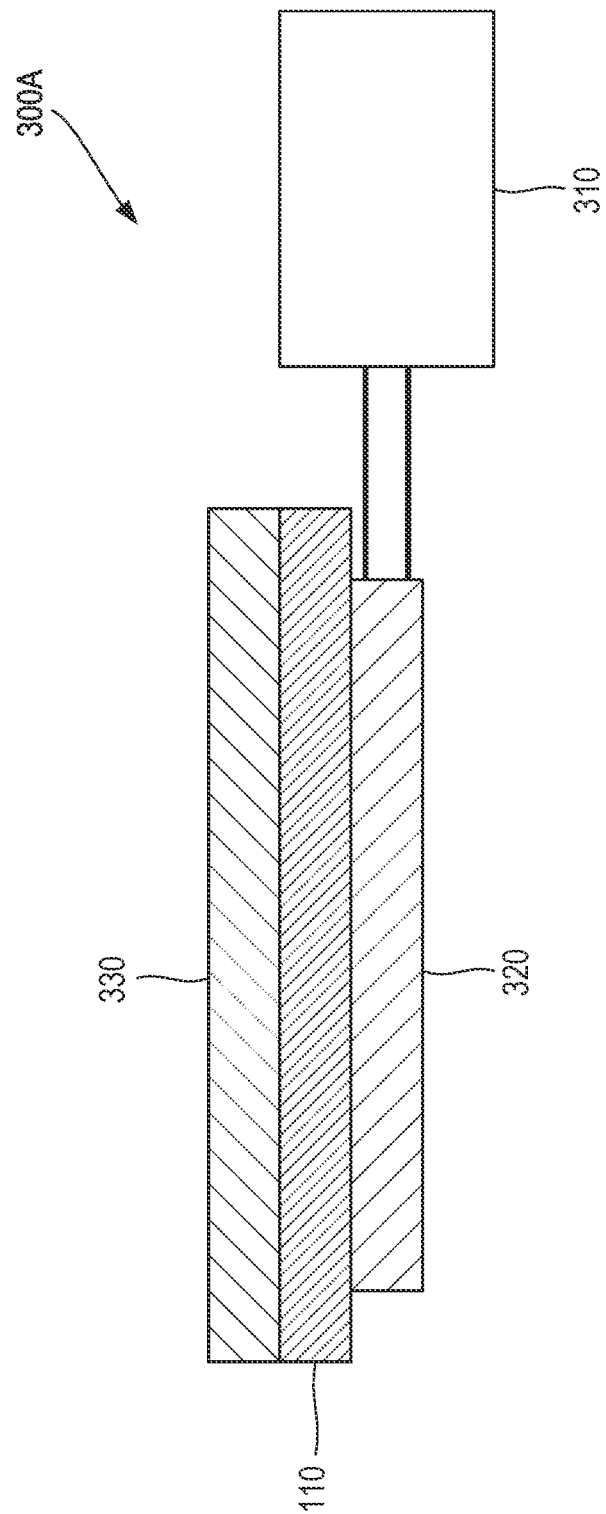
FIG. 32 illustrates a measuring device used to evaluate the magnetic sheets.

Next, a measuring device 300A used for the evaluation will be described with reference to FIG. 32. FIG. 32 illustrates the measuring device 300A used to evaluate the magnetic sheets.

The measuring device 300A comprises an LCR meter 310, a measurement coil 320, and an aluminum board 330. The LCR meter 310 is connected to the measurement coil 320 and is configured to measure Ls (residual inductance (H)) and Rs (residual resistance ($\Omega$)) in the magnetic sheet 110 using the measurement coil 320. As the LCR meter 310, Keysight E4980A was used.

The measurement coil 320 is a coil that holds and arranges the magnetic sheet 110 between the measurement coil 320 and the aluminum board 330. The measurement coil 320 has a diameter of 50 mm. Ls and Rs of the measurement coil 320 at a frequency of 85 kHz are 3.5 μH and 28 m$\Omega$, respectively.

The aluminum board 330 is a plate member formed into a rectangular shape. Specifically, the aluminum board 330 is a plate member having a 60 mm×60 mm square shape with a thickness of 2 mm.

Q1 is calculated based on Ls and Rs measured by the measuring device 300A. The formula "Q1=Ls/Rs×2πf" is used for this calculation. Here, "f" is a frequency (Hz).

Figure 33:
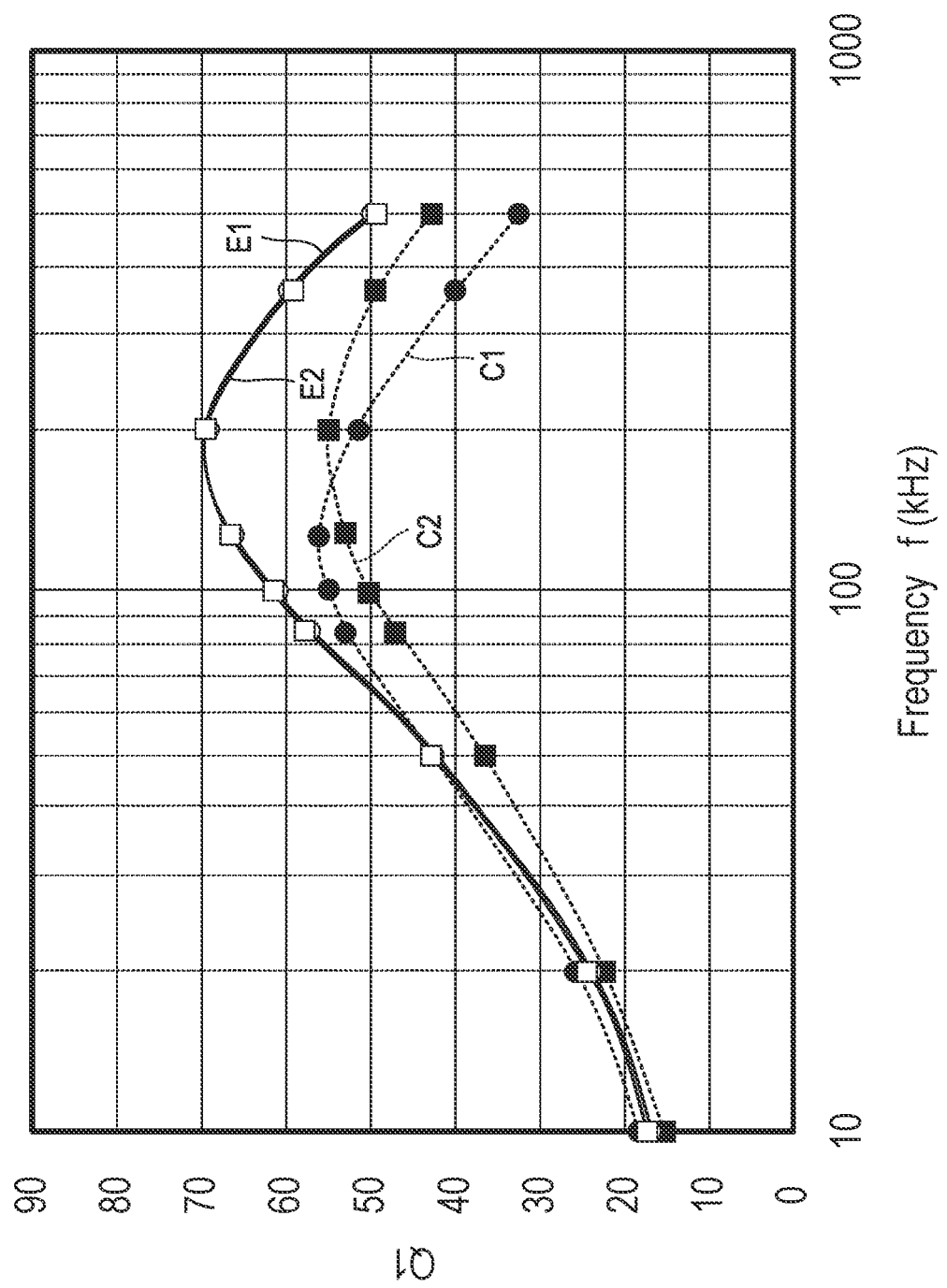
FIG. 33 is a graph showing Q1 values calculated based on the measurement results.
Figure 34:
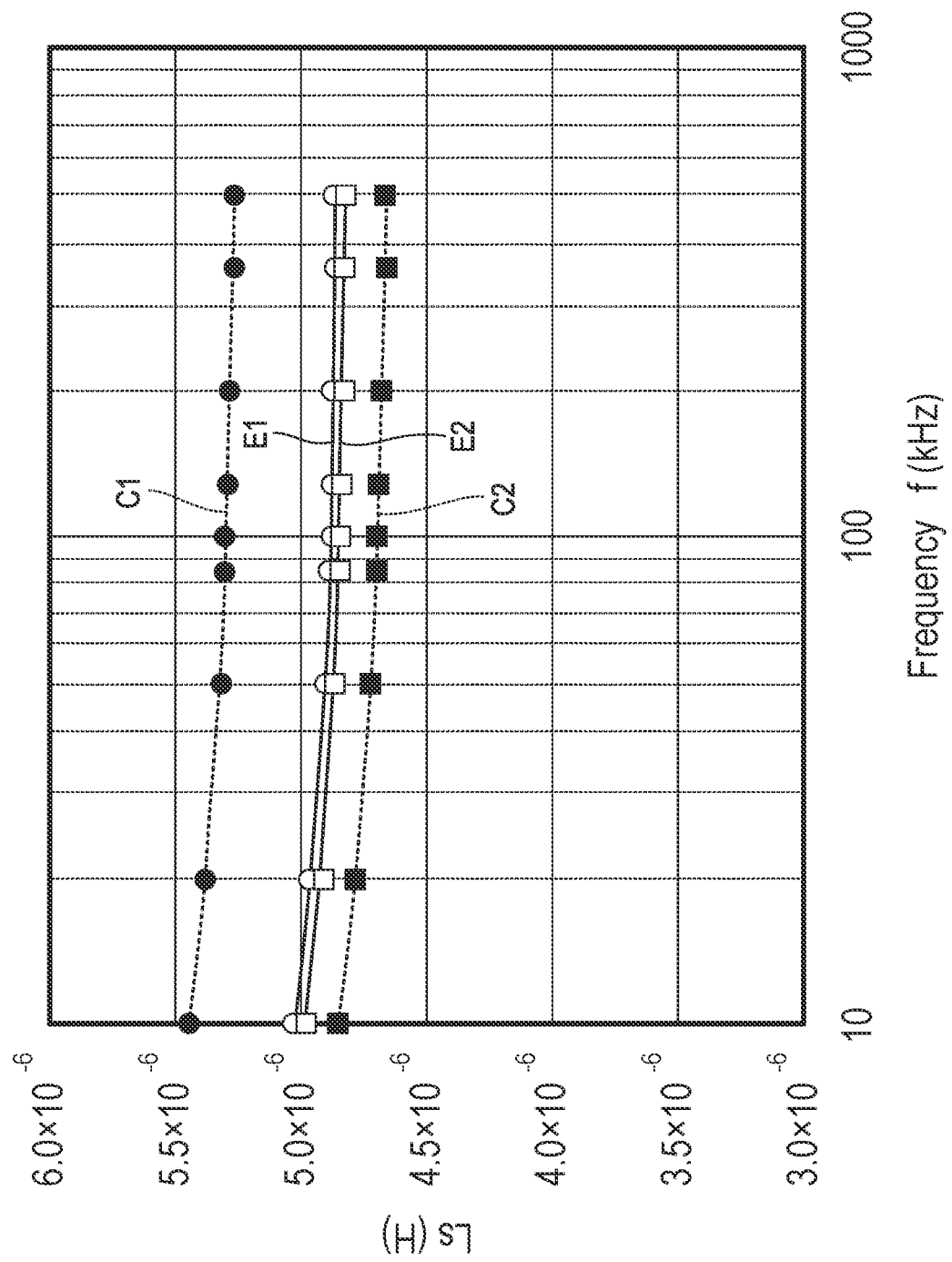
FIG. 34 is a graph showing measured Ls values.
Figure 35:
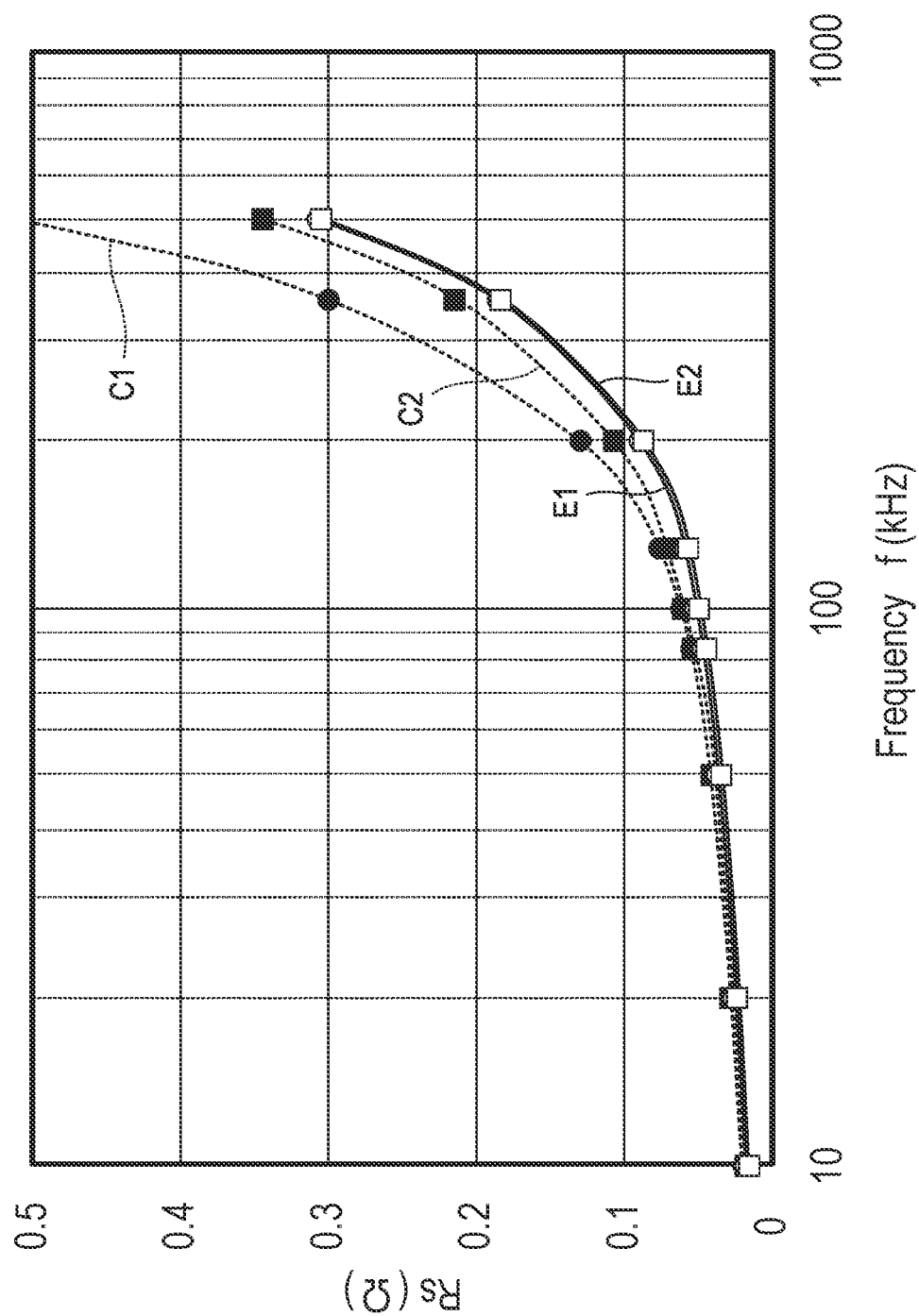
FIG. 35 is a graph showing measured Rs values.
Figure 36:
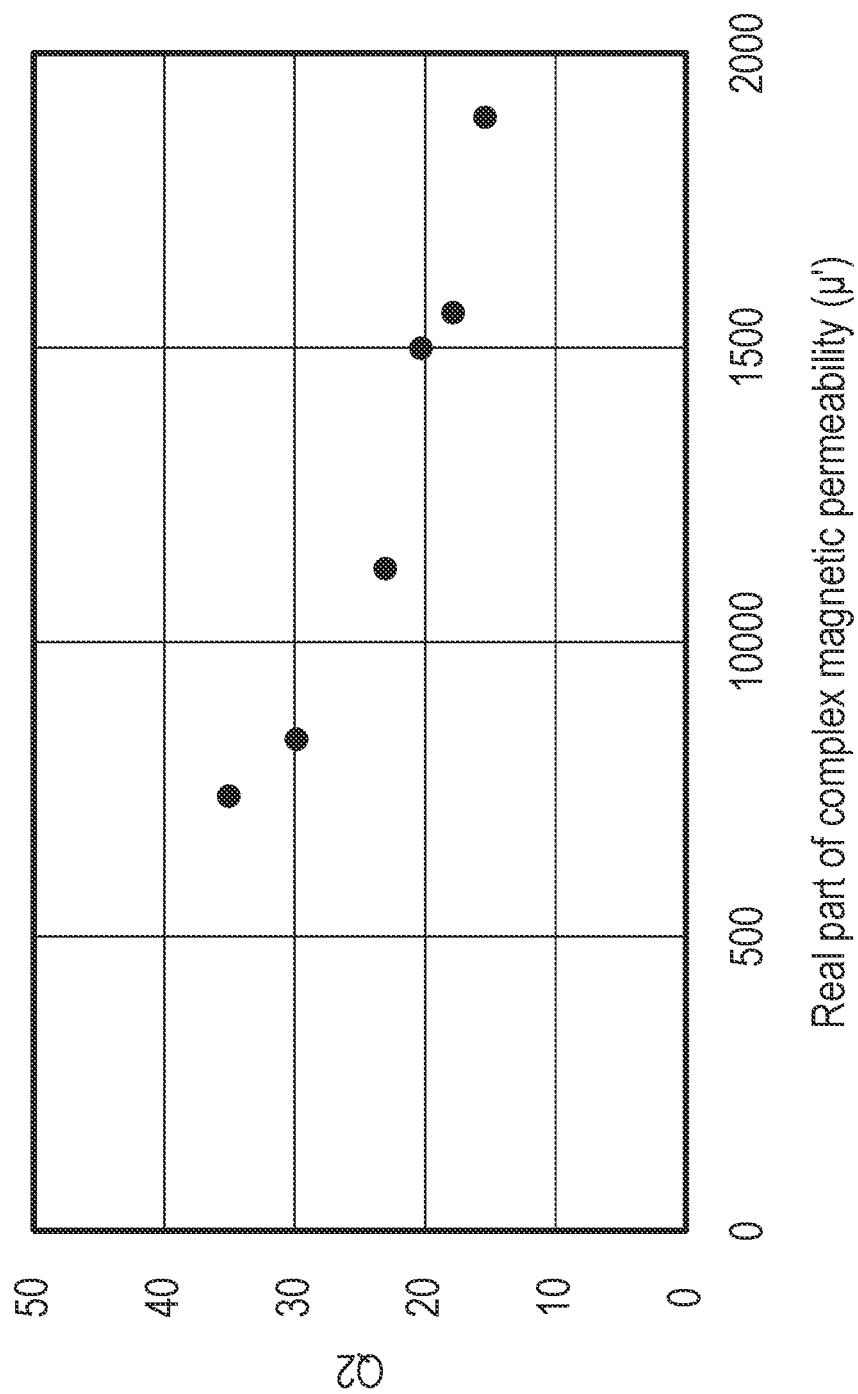
FIG. 36 is a graph showing a correlation between a real part of a complex permeability ($\mu'$) and a Q2 value.
Figure 37:
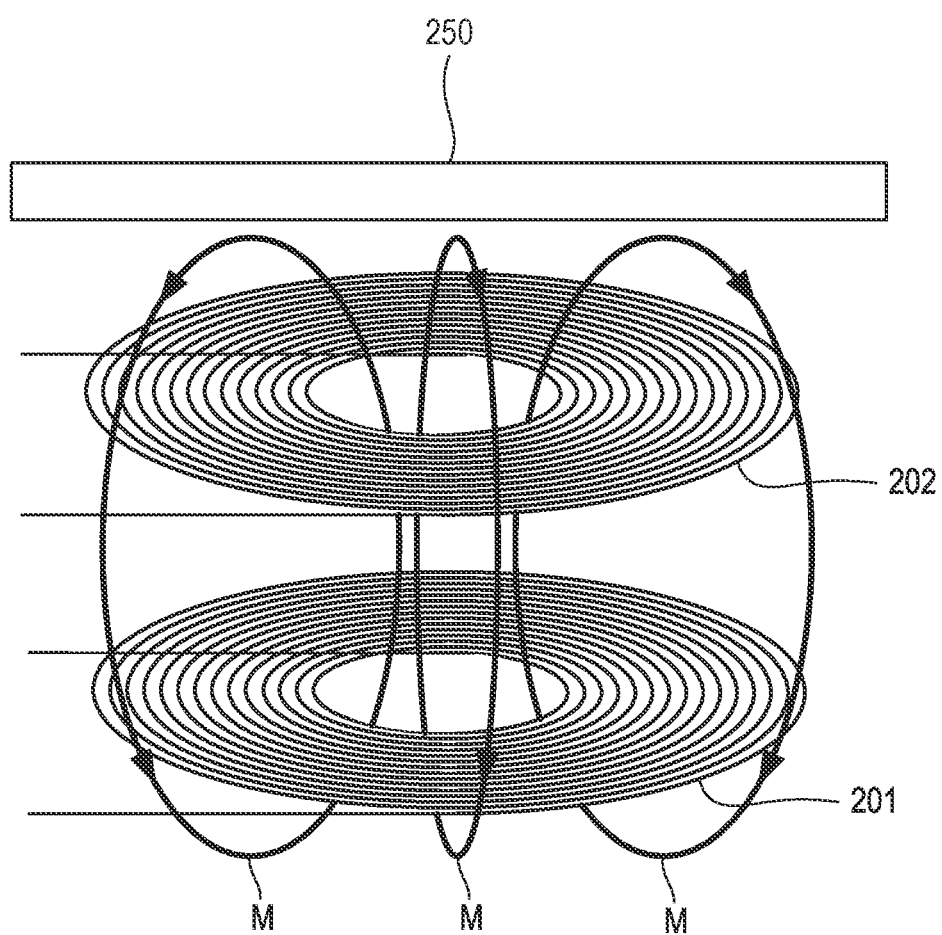
FIG. 37 illustrates a state in which a sheet-shaped magnetic member is arranged adjacent to a coil.

Next, the measurement results obtained using the measuring device 300A will be described with reference to FIG. 33 to FIG. 35. FIG. 33 is a graph showing the Q1 values calculated based on the measurement results. FIG. 34 is a graph showing the measured Ls values. FIG. 35 is a graph showing the measured Rs values.

In FIGS. 33 to 35, the line E1 with white circle markers in the figures shows the calculation results of the magnetic sheet 110 of Example 1. A line E2 with white square markers shows the calculation results of the magnetic sheet 110 of Example 2. A line C1 with black circle markers shows the calculation results of the magnetic sheet 111 of Comparative Example 1. A line C2 with black rectangular markers shows the calculation results of the magnetic sheet 111 of Comparative Example 2.

In FIG. 33, the horizontal axis shows the frequency (kHz) used for the measurement, and the vertical axis shows the Q1 value. In FIG. 34, the horizontal axis shows the frequency (kHz) used for the measurement, and the vertical axis shows the Ls (H) value. In FIG. 35, the horizontal axis shows the frequency (kHz) used for the measurement, and a vertical axis shows the Rs ($\Omega$) value.

The Q1 values reach the peaks between the frequencies of 100 kHz and 110 kHz as a whole as shown in FIG. 33. The Q1 values decrease as the frequency decreases from 100 kHz and the frequency increases from 110 kHz.

The line E1 of the magnetic sheet 110 of Example 1, the line E2 of the magnetic sheet 110 of Example 2 and the line C2 of the magnetic sheet 111 of Comparative Example 2 reach the peaks at a frequency of approximately 110 kHz. The line C1 of the magnetic sheet 111 of Comparative Example 1 reaches its peak at a frequency of approximately 100 kHz.

The line E1 of the magnetic sheet 110 of Example 1 and the line E2 of the magnetic sheet 110 of Example 2 are located above the line C1 of the magnetic sheet 111 of Comparative Example 1 and the line C2 of the magnetic sheet 111 of Comparative Example 2 in the frequencies around the peaks.

In other words, the magnetic sheet 110 of Example 1 and the magnetic sheet 110 of Example 2 have Q1 values higher than those of the magnetic sheet 111 of Comparative Example 1 and the magnetic sheet 111 of Comparative Example 2 in the frequencies around the peaks. In almost all the frequencies, the magnetic sheet 110 of Example 1 and the magnetic sheet 110 of Example 2 have Q1 values higher than those of the magnetic sheet 111 of Comparative Example 1 and the magnetic sheet 111 of Comparative Example 2.

The magnetic sheet 110 of Example 1 and the magnetic sheet 110 of Example 2 have no significant difference in the Q1 values in all the frequencies. In a region where the frequencies are greater than approximately 110 kHz, the Q1 values of the magnetic sheet 110 of Example 1 is slightly higher than those of the magnetic sheet 110 of Example 2. In a region where the frequencies are lower than approximately 110 kHz, the Q1 values of the magnetic sheet 110 of Example 2 is slightly higher than the Q1 values of the magnetic sheet 110 of Example 1.

Note that an operating frequency used in contactless charging circuits for automobiles is approximately 85 kHz, and the operating frequency used in contactless charging circuits for smartphones is approximately 128 kHz or 360 kHz. That is, it is shown that the magnetic sheet 110 of Example 1 and the magnetic sheet 110 of Example 2 have higher Q1 values in the operating frequencies in the contactless charging circuits for automobiles and smartphones.

The values Ls decreases as the frequency increases as a whole, as shown in FIG. 34. In a low frequency region, a decrease in Ls due to an increase in frequency is greater than that in a high frequency region.

The line E1 of the magnetic sheet 110 of Example 1 and the line E2 of the magnetic sheet 110 of Example 2 are located below the line C1 of the magnetic sheet 111 of Comparative Example 1 in all the frequencies. In other words, the Ls values are lower.

The line E1 of the magnetic sheet 110 of Example 1 and the line E2 of the magnetic sheet 110 of Example 2 are located above the line C2 of the magnetic sheet 111 of Comparative Example 2 in all the frequencies. In other words, the Ls values are higher.

The line E1 of the magnetic sheet 110 of Example 1 is located above the line E2 of the magnetic sheet 110 of Example 2 in all the frequencies. In other words, the Ls values are slightly higher.

The values Rs increases as the frequency increases as a whole, as shown in FIG. 35. In the high frequency region, an increase in Rs due to the increase in frequency is greater than that in the low frequency region.

The line E1 of the magnetic sheet 110 of Example 1 and the line E2 of the magnetic sheet 110 of Example 2 are located below the line C1 of the magnetic sheet 111 of Comparative Example 1 and the line C2 of the magnetic sheet 111 of Comparative Example 2 in all the frequencies. In other words, the Rs values are lower.

The magnetic sheet 110 of Example 1 and the magnetic sheet 110 of Example 2 have no significant difference in Rs values in all the frequencies, and the Rs value of the magnetic sheet 110 of Example 1 is slightly higher than those of the magnetic sheet 110 of Example 2.

According to the magnetic sheet 110 of the above-described configuration, the direction of anisotropy is oriented in three or more different directions. Therefore, it is easy to make the direction of the magnetic flux, which is generated by the current flowing in the coil 200 used in combination with the magnetic sheet 110, consistent with the direction of anisotropy of the magnetic sheet 110. Specifically, it is easy to make the direction of anisotropy, i.e., the direction of good magnetic characteristics, i.e. direction with low permeability or direction with higher Q2 values, consistent with the direction of the magnetic flux generated in relation to the current flowing in the rectangular coil 200.

For example, in the magnetic sheet 110, it is easy to make the first axial direction AX1 and the second axial direction AX2 consistent with the portions of the rectangular coil 200 linearly extending in different direction. In addition, in the magnetic sheet 110, it is easy to make the direction different from both the first axial direction AX1 and the second axial direction AX2 aligned with arc-like extending portions connecting the linearly extending portions. Therefore, even when the magnetic sheet 110 is used with the rectangular coil 200, it is easy to suppress the reduction of the magnetic shielding properties of the magnetic sheet 110 and to improve the characteristics (Q1 value) of the coil.

The first groups GA, the second groups GB, and the third groups GC are arranged in one layer to form the magnetic sheet 110, whereby it is easy to suppress the decrease of the magnetic shielding characteristics of the magnetic sheet 110 and to improve the characteristics (Q1 value) of the coil, and the dimension of the magnetic sheet 110 in the lamination direction LD can be reduced.

Note that the magnetic sheet 110 may be formed by arranging one layer of the first groups GA, the second groups GB and the third groups GC as described above, or by laminating the multiple first groups GA, second groups GB and third groups GC in layers.

By laminating the multiple first groups GA, second groups GB and third groups GC in layers, it is easy to enhance the magnetic shielding properties in the magnetic sheet 110 and to improve the characteristics (Q1 value) of the coil.

The technical scope of the present invention is not limited to the above-described embodiments and various modifications can be made within a range not deviating from a gist of the present invention. For example, the present invention is not limited to the above-described embodiments, and may be applied to any combinations of these embodiments as appropriate, and is not particularly limited.

The invention claimed is:

1. A sheet-shaped magnetic member comprising magnetic ribbons with anisotropy,
wherein in the magnetic ribbons, a value of a DC relative magnetic permeability ($\mu r$) is different in a first direction in a plane direction of the magnetic ribbons and in a second direction perpendicular to the first direction,
wherein one of the first direction and the second direction with a lower value of the DC relative magnetic permeability ($\mu r$) is defined as a direction of anisotropy,
wherein the sheet-shaped magnetic member comprises a first group, a second group, and a third group,
wherein in the first group, at least one magnetic ribbon of the magnetic ribbons is arranged so that the direction of anisotropy is along a first axial direction,
wherein in the second group, at least one magnetic ribbon of the magnetic ribbons is arranged so that the direction of anisotropy is along a second axial direction intersecting the first axial direction,
wherein in the third group, at least one magnetic ribbon of the magnetic ribbons is arranged so that the direction of anisotropy is along a direction different from both the first axial direction and the second axial direction, and
wherein the first group, the second group, and the third group are arranged next to each other.

2. The sheet-shaped magnetic member according to claim 1,
wherein the first group, the second group and the third group are arranged next to each other and configured as a layer, and the layer thus configured is laminated in layers.

3. The sheet-shaped magnetic member according to claim 1,
wherein the magnetic ribbons are laminated in layers.

4. The sheet-shaped magnetic member according to claim 1,
wherein the magnetic ribbons are adhered to an adhesive layer.

5. The sheet-shaped magnetic member according to claim 1,
wherein the magnetic ribbons are nanocrystalline alloy ribbons, and the nanocrystalline alloy ribbons are adhered to an adhesive layer and divided into small pieces.

6. The sheet-shaped magnetic member according to claim 1,
wherein the first direction in the plane direction of the magnetic ribbons is a casting direction of the magnetic ribbons.

7. A sheet-shaped magnetic member comprising magnetic sheet pieces comprising at least one of magnetic ribbons with anisotropy, the magnetic ribbons being laminated in layers so that a direction of anisotropy thereof is oriented in a same direction,
wherein in the magnetic ribbons, a value of a relative magnetic permeability ($\mu r$) is different in a first direction in a plane direction of the magnetic ribbons and a second direction perpendicular to the first direction,
wherein one of the first direction and the second direction with a lower value of the relative magnetic permeability ($\mu r$) is defined as the direction of anisotropy,
wherein the sheet-shaped magnetic member comprises a first group, a second group, and a third group,
wherein in the first group, at least one magnetic sheet piece of the magnetic sheet pieces is arranged so that the direction of anisotropy is along a first axial direction, wherein in the second group, at least one magnetic sheet piece of the magnetic sheet pieces is arranged so that the direction of anisotropy is along a second axial direction intersecting the first axial direction, wherein in the third group, at least one magnetic sheet piece of the magnetic sheet pieces is arranged so that the direction of anisotropy is along a direction different from both the first axial direction and the second axial direction, and wherein the first group, the second group, and the third group are arranged next to each other.

8. The sheet-shaped magnetic member according to claim 7, wherein the first group, the second group and the third group are arranged next to each other and configured as a layer, and the layer thus configured is laminated in layers.

9. The sheet-shaped magnetic member according to claim 7, wherein in the magnetic sheet pieces, the magnetic ribbons with anisotropy are laminated in layers so that the direction of anisotropy is oriented in a same direction, and the magnetic ribbons are arranged next to each other.

10. The sheet-shaped magnetic member according to claim 7, wherein an adhesive layer is provided between the magnetic ribbons laminated, and the magnetic ribbons are adhered to the adhesive layer.

11. The sheet-shaped magnetic member according to claim 7, wherein the magnetic ribbons are a nanocrystalline alloy ribbons, and an adhesive layer is provided between the nanocrystalline alloy ribbons laminated, and the nanocrystalline alloy ribbons are adhered to the adhesive layer and divided into small pieces.

12. The sheet-shaped magnetic member according to claim 7, wherein the first direction in the plane direction of the magnetic ribbons is a casting direction of the ribbons.

* * * * *